(12) United States Patent
Watanabe

(10) Patent No.: US 6,574,579 B1
(45) Date of Patent: Jun. 3, 2003

(54) WAVEFORM GENERATING DEVICE

(75) Inventor: Naoyoshi Watanabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/623,811

(22) PCT Filed: Jan. 11, 2000

(86) PCT No.: PCT/JP00/00063

§ 371 (c)(1),
(2), (4) Date: Sep. 8, 2000

(87) PCT Pub. No.: WO00/40984

PCT Pub. Date: Jul. 13, 2000

(30) Foreign Application Priority Data

Jan. 8, 1999 (JP) ............................................. 11-002559

(51) Int. Cl.$^7$ ................................................. G06F 1/04
(52) U.S. Cl. ............................ 702/124; 702/70; 702/73; 702/82; 702/125
(58) Field of Search ................................ 702/54, 58, 46, 702/66, 67, 68, 69, 70–73, 82, 124, 125; 713/500; 327/233, 234; 716/1–6

(56) References Cited

U.S. PATENT DOCUMENTS

| | | | | |
|---|---|---|---|---|
| 5,553,276 A | * | 9/1996 | Dean | ........................... 395/550 |
| 5,592,659 A | | 1/1997 | Toyama et al. | ............. 395/558 |
| 5,901,322 A | * | 5/1999 | Herbst et al. | .......... 395/750.04 |
| 6,058,486 A | * | 5/2000 | Nakayama et al. | ......... 713/500 |
| 6,263,290 B1 | * | 7/2001 | Williams et al. | .............. 702/71 |
| 6,420,921 B1 | * | 7/2002 | Okayasu et al. | ............ 327/276 |

FOREIGN PATENT DOCUMENTS

| | | |
|---|---|---|
| EP | 10319097 | 12/1998 |
| JP | 8146103 | 11/1994 |
| JP | 1114711 | 1/1999 |
| JP | 11125660 | 5/1999 |

* cited by examiner

*Primary Examiner*—Marc S. Hoff
*Assistant Examiner*—Felix Suarez
(74) *Attorney, Agent, or Firm*—David N. Lathrop, Esq.; Gallagher & Lathrop

(57) ABSTRACT

A waveform generating apparatus capable of outputting a desired waveform is provided. Among delay data is selected a set pulse generating delay data depending on test logical data and waveform mode information. The delay data, a skew adjusting delay data, and a fraction data in each test cycle are computed to obtain an integer delay data and a fraction delay data, which are supplied to a counter delay circuit. From the counter delay circuit are outputted a set pulse generating effective flag for delaying a test period timing by a delay time corresponding to the integer delay data, and a fraction delay data related thereto. The effective flag is delayed based on the related fraction delay data to obtain a set pulse. Similarly with the set pulse, a reset pulse is obtained, thereby to set/reset an S-R flip-flop to output a desired waveform.

19 Claims, 37 Drawing Sheets

FIG.2
A(IN CASE OF NRZ)
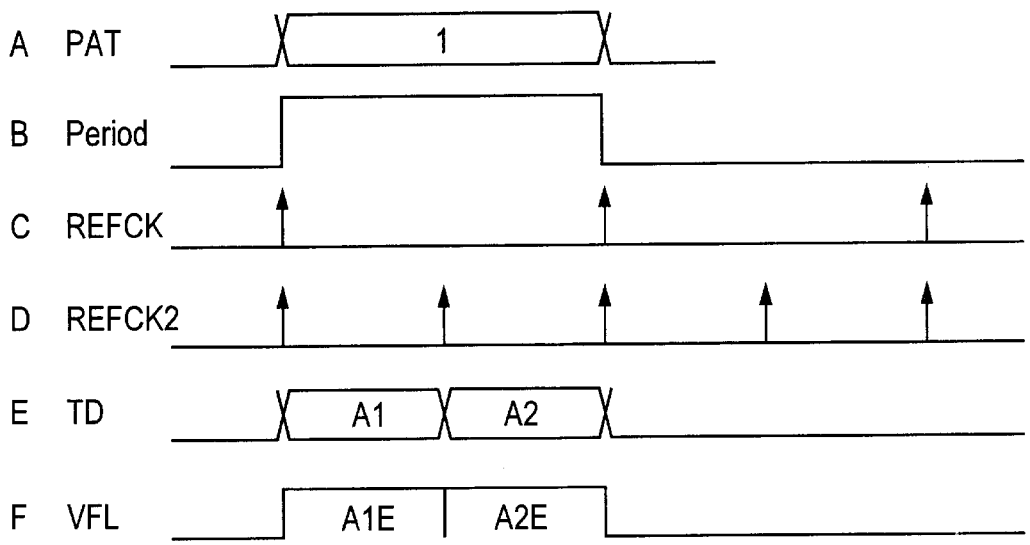
B(IN CASE OF SBC)
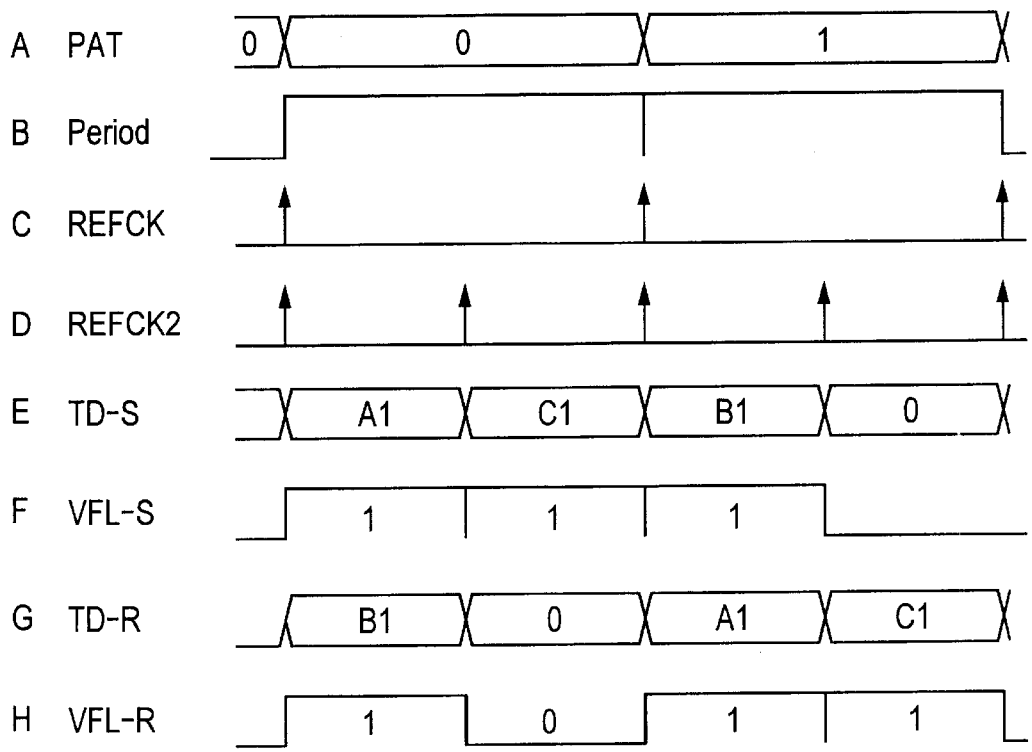

FIG.6

| SELECT DATA | | | | OUTPUT DATA |
|---|---|---|---|---|
| S1 | S2 | S3 | En | |
| 0 | 0 | 0 | 1 | TM A1 |
| 0 | 0 | 1 | 1 | TM A2 |
| 1 | 0 | 0 | 1 | TM B1 |
| 1 | 0 | 1 | 1 | TM B2 |
| 0 | 1 | 0 | 1 | TM C1 |
| 0 | 1 | 1 | 1 | TM C2 |

FIG.9

NORMAL MODE

| ADDRESS INPUT | | | SELECT DATA MEMORY — SELECT DATA | | | | | | | | | | | | | | | | | | MULTIPLEXER OUTPUT | | | | |
|---|---|---|---|---|---|---|---|---|---|---|---|---|---|---|---|---|---|---|---|---|---|---|---|---|---|
| WAVEFORM MODE WM | PAT (SELEC-TION) | PREVIOUS CYCLE | CURRENT CYCLE | MS1SL1 | MS1SL2 | MS1SL3 | MS1E | MS2SL1 | MS2SL2 | MS2SL3 | MS2E | MR1SL1 | MR1SL2 | MR1SL3 | MR1E | MR2SL1 | MR2SL2 | MR2SL3 | MR2E | Add Period | SA1 | SA2 | RA1 | RA2 |
| NRZ | 0,0 | X(don't care) | 0 | 0 | 0 | 0 | 0 | 0 | 0 | 0 | 0 | 0 | 0 | 0 | 1 | 0 | 0 | 0 | 0 | 0 | 0 | 0 | TMA1 | 0 |
|  |  |  | 1 | 0 | 0 | 0 | 1 | 0 | 0 | 0 | 0 | 0 | 0 | 0 | 0 | 0 | 0 | 0 | 0 | 0 | TMA1 | 0 | 0 | 0 |
| RZ"1" | 0,1 | X | 0 | 0 | 0 | 0 | 0 | 0 | 0 | 0 | 0 | 0 | 0 | 0 | 1 | 0 | 0 | 0 | 0 | 0 | 0 | 0 | 0 | TMC1 |
|  |  |  | 1 | 0 | 0 | 0 | 1 | 0 | 0 | 0 | 0 | 0 | 0 | 0 | 1 | 0 | 0 | 0 | 0 | 0 | TMB1 | 0 | TMC1 | 0 |
| SBC | 1,0 |  | 0 | 0 | 1 | 0 | 1 | 0 | 1 | 0 | 1 | 1 | 0 | 0 | 1 | 0 | 0 | 0 | 0 | 0 | TMC1 | 0 | TMB1 | 0 |
|  |  |  | 1 | 1 | 0 | 0 | 1 | 0 | 0 | 0 | 0 | 0 | 0 | 0 | 1 | 0 | 0 | 0 | 0 | 0 | TMB1 | 0 | TMA1 | TMC1 |
|  | NOT { |  | 0 | 0 | 1 | 0 | 1 | 0 | 1 | 0 | 1 | 1 | 0 | 0 | 1 | 0 | 0 | 0 | 0 | 0 | TMA1 | TMC1 | TMB1 | 0 |
|  |  |  | 1 | 1 | 0 | 0 | 1 | 0 | 0 | 0 | 0 | 0 | 1 | 0 | 1 | 0 | 1 | 0 | 1 | 0 | TMB1 | 0 | TMC1 | 0 |
|  |  |  | 0 | 0 | 1 | 0 | 1 | 0 | 1 | 0 | 1 | 1 | 0 | 0 | 1 | 0 | 0 | 0 | 0 | 0 | TMA1 | TMC1 | TMB1 | 0 |
|  |  |  | 1 | 1 | 0 | 0 | 1 | 0 | 0 | 0 | 0 | 0 | 1 | 0 | 1 | 0 | 1 | 0 | 1 | 0 | TMB1 | 0 | TMA1 | TMC1 |

FIG. 10

SPEED-DOUBLED MODE

| SELECT DATA MEMORY | | | | | | | | | |
|---|---|---|---|---|---|---|---|---|---|
| (SELECTION) ADDRESS INPUT | | | SELECT DATA | | | | MULTIPLEXER OUTPUT | | |
| WAVEFORM MODE WM | (SELEC-TION) PAT | PREVIOUS CYCLE / CURRENT CYCLE | MS1E MS1SL3 MS1SL2 MS1SL1 | MS2E MS2SL3 MS2SL2 MS2SL1 | MR1E MR1SL3 MR1SL2 MR1SL1 | MR2E MR2SL3 MR2SL2 MR2SL1 / Add Period | SA1 / SA2 | RA1 / RA2 | |
| NRZ | 0,0 | X(don't care) / X(don't care) | 0000 / 0001 | 0000 / 0011 | 0001 / 0011 | 0011 / 0011 | 0 / TMA1 | 0 / TMA2 | TMA1 / 0 | TMA2 / 0 |
| RZ"1" | 0,1 | X(don't care) / X(don't care) | 0000 / 1001 | 0000 / 1011 | 0000 / 0101 | 0000 / 0111 | 0 / TMB1 | 0 / TMB2 | 0 / TMC1 | 0 / TMC2 |
| SBC | 1,0 | 0 / 1 | 0101 / 1001 (0000)(0000) | 0111 / 1011 (0000)(0000) | 1001 / 0001 0111 (0000) | 1011 / 0101 0101 0000 | TMC1 / TMB1 | TMC2 / TMB2 | TMB1 / TMA1/TMC2 | TMB2 / TMC1 |
| | 1,1 | 0 / 1 | 0001 / 0111 (0000) 1001 | 0001 / 0101 (0000) 1011 | 1001 / 1000 1000 0101 | 1011 / 1000 (0000) 0111 | TMA1/TMC2 / TMB1 | TMC1 / TMB2 | TMB1 / TMC1 | TMB2 / TMC2 |

FIG. 11

| DATA \ WM | D1 (1) | D2 (2) | D3 (3) | D4 (4) | D5 (5) | D6 (6) |
|---|---|---|---|---|---|---|
| NRZ | OFF/ON | ON/OFF | OFF/OFF | OFF/OFF | OFF/OFF | OFF/OFF |
| RZ | OFF/OFF | OFF/OFF | OFF/ON | OFF/OFF | OFF/OFF | OFF/ON |
| SBC | ON/OFF | OFF/ON | OFF/ON | ON/OFF | ON/OFF | OFF/ON |

WAVEFORM GENERATING DEVICE

TECHNICAL FIELD

The present invention relates to a waveform generating apparatus for generating a test signal having a desired waveform and a semiconductor device testing apparatus using this waveform testing apparatus.

BACKGROUND ART

A waveform generating apparatus for generating a test signal having a desired waveform is used, for example, in a semiconductor device testing apparatus for testing a semiconductor device. FIG. 26 shows an example of a conventional semiconductor device testing apparatus (hereinafter referred to as IC tester) for testing a semiconductor integrated circuit (including a large-scale integrated circuit (LSI); hereinafter referred to as IC) which is a typical example of a semiconductor device. This IC tester comprises, roughly speaking, a pattern generator PG, a timing generator 20, a waveform shaping circuit FC, a driver DR, a level comparator LCP, and a logical comparator CP.

A main controller (not shown) mainly controls the pattern generator PG and the timing generator 20. This main controller is generally constituted by a computer system, and controls the pattern generator PG, the timing generator 20, and the like in accordance with a test program created by a user.

First, before a testing for an IC is started, various kinds of data are set by the main controller. After those various kinds of data have been set, the testing for an IC is started. By applying a test start instruction or command from the main controller to the pattern generator PG, the pattern generator PG starts to generate a pattern. The pattern generator PG supplies test pattern data (logical data) PAT to the waveform shaping circuit FC as well as supplies a test period signal PS (Period-Start) and a timing signal TS to the timing generator 20 in accordance with the control of the main controller.

In order for the timing generator 20 to add a predetermined amount of delay to the period signal PS supplied from the pattern generator PG, the timing generator 20 has a delay data memory 11 provided therein in which a plurality of timing (phase) delay data TD differing from one another have been previously stored. The timing generator 20 delays the period signal PS by an amount of delay corresponding to a timing delay data stored in an address of the delay data memory 11 specified by the supplied timing signal TS, and outputs the delayed period signal PS. This delayed period signal PS is supplied to the waveform shaping circuit FC as a timing pulse TPO, and also, is supplied to the logical comparator CP as a comparison clock pulse (strobe pulse) STRB.

The waveform shaping circuit FC generates a test pattern signal FCO having a desired real waveform on the basis of a test pattern data PAT supplied from the pattern generator PG and a timing pulse TPO supplied from the timing generator 20. This test pattern signal FCO is amplified by the driver DR, and then is applied, as an input signal Si, to an IC under test (hereinafter referred to as DUT) 19.

Here, in case that the DUT 19 is a memory IC (an IC the memory portion of which is the principal part), or in case of testing the memory portion of a system LSI (a large-scale integrated circuit in which the logic portion and the memory portion are present in mixture on one chip), or the like, the test pattern signal Si is stored in a predetermined memory cell of the DUT 19, and the stored content is read out in a read cycle carried out later. On the contrary, in case that the DUT 19 is a logic IC (an IC the logic portion of which is the principal part), or in case of testing the logic portion of a system LSI, or the like, the result of a logical operation of the test pattern signal Si is outputted from the DUT 19 as a response signal So.

A response signal So read out from the DUT 19 is compared by the level comparator LCP with a reference voltage supplied from a comparison reference voltage source (not shown) to determine whether or not the response signal has a predetermined logical level, that is, a voltage SH of logical H (logical high) or a voltage SL of logical L (logical low). The response signal determined to have the predetermined logical level is sent, as a logical signal SH or SL, to the logical comparator CP where the response signal is compared with an expected value pattern signal EP outputted from the pattern generator PG to determine whether or not the DUT 19 has outputted a normal response signal.

If the response signal (SH or SL) does not coincide with the expected value pattern signal EP, a memory cell having an address of the DUT 19 from which the response signal was read out is determined to be defective (failure) in case that the memory portion of the DUT 19 is being tested, or in case that the DUT 19 is a memory IC, or the like, and a failure signal FAIL indicating that fact is generated from the logical comparator CP. Usually, when this failure signal FAIL is generated, a write operation of a failure data (in general, a signal of logical "1") being applied to a data input terminal of a failure analysis memory (not shown) is enabled, and the failure data is stored in the failure analysis memory at an address thereof specified by an address signal being supplied to the failure analysis memory at that time. Generally, the same address signal as that has been applied to the DUT 19 is applied to the failure analysis memory, and hence the failure data is stored in an address of the failure analysis memory that is the same as that of the DUT 19.

On the contrary, if the response signal coincides with the expected value pattern signal EP, a memory cell having an address of the DUT 19 from which the response signal was read out is determined to be normal, and a pass signal PASS indicating that fact is generated. Usually, this pass signal PASS is not stored in the failure analysis memory.

At a time point that the testing has been completed, the failure data stored in the failure analysis memory are read out therefrom, and then, for example, whether or not a relief or repair of the failure memory cells of the tested DUT 19 is possible is determined.

On the other hand, in case that the DUT 19 is a logic IC, or in case of testing the logic portion of a system LSI, or the like, when the response signal (SH or SL) does not accord with the expected value pattern signal EP, the test pattern signal having brought about that disaccord between the response signal and the expected value pattern signal, an address at which the test pattern signal has been generated, logical data outputted from a pin of the DUT 19 having outputted the response signal which does not accord with the expected value pattern signal EP, the expected value pattern data compared with the logical data at that time, and the like are stored in the failure analysis memory. Those data are utilized, after the completion of the test, in analyzing a cause of the failure occurrence mechanism, evaluating the tested LSI, or the like.

The timing generator 20 generates timing signals such as timing pulses TPO for defining respectively a rise timing and a fall timing of the waveform of the test pattern signal to be applied to the DUT 19, a strobe pulse (clock pulse) STRB for defining a timing of a logical comparison between the response signal and the expected value pattern signal EP in the logical comparator CP, and the like.

Timings and periods for generating such timing signals are described in a test program created by the user, and the IC tester is constructed such that a test pattern signal is applied to the DUT 19 with an operating period and at a timing intended by the user to operate the DUT 19 so that whether the DUT 19 operates in normal condition or not can be tested.

Since the waveform generating apparatus mainly comprises the timing generator 20 and the waveform shaping circuit FC, several specific examples of the timing generator 20 will be first described.

FIG. 27 is a block diagram showing a first specific example of the timing generator 20, and FIG. 28 is a timing chart for explaining its operation. This first timing generator 20 comprises a delay data memory (register) 11 in which a plurality of timing delay data TD are previously stored as mentioned above, a delay counter 12 that is an n-bit parallel down-counter (decrement-counter), a NAND circuit 13, an AND circuit 14, a variable delay circuit 15, and a data conversion table 15*a*.

As to a case that the reference clock period T is set to 10 ns (T=10 ns), the test period Tt is set to 100 ns that is ten times of the reference clock period T (Tt=10×T=100 ns), and a timing delay data 3×T+(½)×T=35 ns that is one of the plurality of timing delay data TD previously stored in the delay data memory 11 is designated by a timing signal TS outputted from the pattern generator PG, the operation of the timing generator 20 for outputting a timing pulse TPO will be discussed.

To the clock terminal CK of the delay counter 12 is externally supplied the reference clock REFCK having the reference clock period T=10 ns shown in FIG. 28A, and a test period signal (period start signal) PS having the test period Tt=100 ns shown in FIG. 28B is supplied to the load terminal Ld of the delay counter 12. On the other hand, a delay coefficient "3" representing the integer in the timing delay data TD (3×T+(½)×T) is supplied to the data input terminal di of the delay counter 12 from the delay data memory 11, and also a delay coefficient "½" representing the fraction lower than the decimal point in the timing delay data TD is supplied to the data conversion table (memory) 15*a* from the delay data memory 11. The integer delay coefficient "3" supplied to the delay counter 12 is preset therein.

The delay counter 12 decrements by one, when the test period signal PS is applied to the load terminal Ld thereof, its internal data "3" each time the reference clock REFCK is supplied thereto, and outputs binary data representing decimal numbers of "2", "1", "0" to the n-bit output terminals in the sequence of "2"→"1"→"0". The output terminals of the delay counter 12 are connected to the input terminals of the NAND circuit 13. Accordingly, when the NAND circuit 13 detects that all of the outputs from the n-bit output terminals of the delay counter 12 have become zeros, the NAND circuit 13 outputs to its output terminal an analog delay start signal ADS (analog delay start) which becomes logical H level only during the time interval T after it has been delayed by the time duration of 3T, as shown in FIG. 28C.

This analog delay start signal ADS is supplied to one of the input terminals of the AND circuit 14, thereby to enable the AND circuit 14. Since the reference clock REFCK is supplied to the other of the input terminals of the AND circuit 14, it outputs therefrom an analog delay start signal ADS' shown in FIG. 28D and having a time width (time duration) of ½ of the period T of the reference clock REFCK, and the analog delay start signal ADS' is inputted to the variable delay circuit 15.

The fraction delay coefficient "½" supplied to the data conversion table 15*a* from the delay data memory 11 is converted into a control signal (a select signal) by the data conversion table 15*a*, and the control signal is inputted to the control terminal S of the variable delay circuit 15. The variable delay circuit 15 is controlled by the control signal to delay the inputted analog delay start signal ADS' by a time interval of (½)×T corresponding to the delay coefficient "½", thereby to generate a timing pulse TPO, as shown in FIG. 28E. Thus, from the first timing generator 20*a* is outputted the timing pulse TPO delayed by the time duration equivalent to the timing delay data TD=3×T+(½)×T stored in the delay data memory 11 and designated by the timing signal TS.

FIG. 29A shows a specific example of the variable delay circuit 15, and FIG. 29B shows an example of the data conversion table 15*a*. The variable delay circuit 15 is provided with three multiplexers MUX0, MUX1 and MUX2 connected in cascade between its input terminal IN and its output terminal OUT. An output signal ADS' from the AND circuit 14 is supplied to the input terminal IN of the variable delay circuit 15, and select signals S0, S1 and S2 from the data conversion table 15*a* are supplied to control terminals S of these multiplexers MUX0, MUX1 and MUX2, respectively. As can be easily understood from FIG. 29B, the data conversion table 15*a* applies, when the fraction delay coefficient is "½" (corresponds to the delay time of T/2), the select signals S0=0, S1=0 and S2=1 to the control terminals S of the multiplexers MUX0, MUX1 and MUX2, respectively. Each of the multiplexers MUX0, MUX1 and MUX2 is constructed such that it selects its input terminal A when a select signal is "0" (zero) and selects its input terminal B when a select signal is "1" (one). Accordingly, in this case, only the multiplexer MUX2 selects the input terminal B, and delays the output signal ADS' from the AND circuit 14 through its delay circuit (the delay time of which is set to T/2). As a result, the output signal ADS' from the AND circuit 14 is delayed by only the time interval of T/2 and is outputted from its output terminal OUT as a timing pulse TPO.

FIG. 30 is a block diagram showing a second specific example of the timing generator 20, and FIG. 31 is a timing chart for explaining its operation. Similarly to the above first specific example, this second timing generator 20 comprises a delay data memory (register) 11 in which a plurality of timing delay data TD are previously stored, a delay counter 12 that is an n-bit parallel down-counter (decrement-counter), a NAND circuit 13, an AND circuit 14, a variable delay circuit 15, and a data conversion table 15*a*, and in addition thereto, it further comprises an operation circuit 16 for adding an output signal of the delay data memory 11 and a fraction data FD shorter than the reference clock period T (not inclusive of T), and a delay circuit 17 for adjusting (delaying) the phase of the reference clock REFCK such that the output signal of the NAND circuit 13 can surely coincide with the reference clock REFCK in the AND circuit 14. The second timing generator 20 is configured such that the output signal of the delay data memory 11 and the fraction data FD shorter than the reference clock period T are summed in the operation circuit 16, and an integer delay coefficient Sa representing an integer delay time equal to or longer than the reference clock period T (inclusive of T) in the summed result is supplied to the data input terminal di of the delay counter 12 and a fraction delay coefficient Sb representing a fraction delay time shorter than the reference clock period T is supplied to the data conversion table 15a. In other words, the second timing generator 20 is different from the first timing generator shown in FIG. 28 in the point that the second timing generator 20 is constructed such that it can also cope with even a case in which the test period Tt includes a fraction lower than the decimal point, namely, a decimal place, in addition to an integer.

As to a case that the reference clock period T is set to 10 ns (T=10 ns), the test period Tt is set to 5×T+(¾)×T ns (Tt=57.5 ns), and a timing delay data 3×T+(½)×T=35 ns that is one of the plurality of timing delay data TD previously stored in the delay data memory 11 is designated by a timing signal TS outputted from the pattern generator PG, the operation of the timing generator 20 for outputting a timing pulse TPO will be discussed.

To the clock terminal CK of the delay counter 12 is externally supplied the reference clock REFCK having the reference clock period T=10 ns shown in FIG. 31A, and a test period signal (period start signal) PS having the test period Tt=57.5 ns shown in FIG. 31B is supplied to the load terminal Ld of the delay counter 12. On the other hand, the timing delay data TD (3×T+(½)×T) shown in FIG. 31C from the delay data memory 11 and the fraction data FD shown in FIG. 31D representing a fraction time duration shorter than the reference clock period T are summed in the operation circuit 16, and an integer delay coefficient Sa shown in FIG. 31E representing an integer delay time equal to or longer than the reference clock period T in the summed result is supplied to the data input terminal di of the delay counter 12 and also a fraction delay coefficient Sb shown in FIG. 31F representing a fraction delay time shorter than the reference clock period T is supplied to the data conversion table (memory) 15a. The integer delay coefficient Sa supplied to the delay counter 12 is preset therein.

Since the test period Tt includes the fraction lower than the decimal point, the start cycle T0 is set to have its period of 5T corresponding to the integer part of the test period Tt, thereby to make the fraction part shorter than the reference clock period T zero. Consequently, the fraction data (Period-fractional data) FD-0 in the start cycle T0 is set to zero, and the remaining fraction time duration (¾)T in the test period Tt is carried over to the next second cycle T1.

The operation circuit 16 sums the timing delay data TD=(3+½)T given from the delay data memory 11 and the fraction data FD-0=0 (T), and supplies an integer delay coefficient "3" (Sa=3) representing the delay time 3T of the integer part in the summed result (3+½)T to the data input terminal di of the delay counter 12, and also a fraction delay coefficient ½ (Sb=½) representing the delay time (½)T of the fraction part in the summed result (3+½)T to the data conversion table 15a.

The delay counter 12 decrements by one, when a rise edge of the start test period signal PS-0 is applied to the load terminal Ld thereof, its internal data "3" each time the reference clock REFCK is supplied thereto, and outputs binary data representing decimal numbers of "2", "1", "0" to the n-bit output terminals in the sequence of "2"→"1"→"0". The output terminals of the delay counter 12 are connected to the input terminals of the NAND circuit 13. Accordingly, when the NAND circuit 13 detects that all of the outputs from the n-bit output terminals of the delay counter 12 have become zeros, the NAND circuit 13 outputs to its output terminal an analog delay start signal ADS which becomes logical H level only during the time interval T after it has been delayed by the time duration of 3T from the rise edge of the start test period signal PS-0, as shown in FIG. 31G.

This analog delay start signal ADS is supplied to one of the input terminals of the AND circuit 14, thereby to enable the AND circuit 14. Since the reference clock REFCK whose phase has been adjusted by the delay circuit 17 is supplied to the other of the input terminals of the AND circuit 14, it outputs therefrom an analog delay start signal ADS' shown in FIG. 31H and having a time width (time duration) of ½ of the period T of the reference clock REFCK, and the analog delay start signal ADS' is inputted to the variable delay circuit 15.

The fraction delay coefficient "½" supplied to the data conversion table 15a from the operation circuit 16 is converted into a select signal by the data conversion table 15a, and the select signal is inputted to the control terminal S of the variable delay circuit 15. Since the variable delay circuit 15 and the data conversion table 15a shown in FIG. 29 can also be used in this case as the variable delay circuit 15 and the data conversion table 15a, the detailed explanation thereof will be omitted. The variable delay circuit 15 delays the inputted analog delay start signal ADS' by a time interval of (½)T corresponding to the fraction delay coefficient "½", thereby to generate a timing pulse TPO-0 shown in FIG. 31I. In this manner, the timing pulse TPO-0 is generated at the time point that a time duration of (3+½)T has elapsed from the rise edge of the start test period signal PS-0. As a result, in the start cycle T0, the timing pulse TPO-0 is generated, which is delayed by a time duration equivalent to the timing delay data TD=(3+½)T stored in the delay data memory 11 and designated by the timing signal TS.

Though the next second cycle T1 would have a time duration of (5+¾)T+(¾)T=(6+½)T which is the sum of the fraction time duration (¾)T carried over from the start cycle T0 and the second test period Tt, the fraction time duration (½)T is carried over to the next third cycle T2 so that the second cycle T1 can be set to have its period of 6T which is the integer time duration. As a result, in the second cycle T1, the fraction data FD becomes (¾)T.

Like the case of the start cycle T0, the operation circuit 16 sums the timing delay data TD=(3+½)T given from the delay data memory 11 and the fraction data FD-1=(¾)T, and supplies an integer delay coefficient "4" (Sa=4) representing the delay time 4T of the integer part in the summed result (4+¼)T to the data input terminal di of the delay counter 12 and a fraction delay coefficient ¼(Sb=¼) representing the delay time (¼)T of the fraction part in the summed result (4+¼)T to the data conversion table 15a, respectively.

The delay counter 12 decrements by one, when a rise edge of the second test period signal PS-1 is applied to the load terminal Ld thereof, its internal data "4" each time the reference clock REFCK is supplied thereto, and outputs binary data representing decimal numbers of "3", "2", "1", "0" to the n-bit output terminals in the sequence of "3"→"2"→"1"→"0". Consequently, the delay counter 12 outputs to its output terminal an analog delay start signal ADS which becomes logical H level only during the time interval T after it has been delayed by the time duration of 4T from the rise edge of the second test period signal PS-1, as shown in FIG. 31G.

This analog delay start signal ADS is supplied to one of the input terminals of the AND circuit 14, thereby to enable the AND circuit 14. Since the reference clock REFCK whose phase has been adjusted by the delay circuit 17 is supplied to the other of the input terminals of the AND circuit 14, it outputs therefrom an analog delay start signal ADS' shown in FIG. 31H and having a time width (time duration) of ½ of the period T of the reference clock REFCK, and the analog delay start signal ADS' is inputted to the variable delay circuit 15.

As is apparent from the data conversion table 15a shown in FIG. 29B, select signals corresponding to the fraction coefficient ¼ are S0=0, S1=1 and S2=0. Accordingly, only the multiplexer MUX1 selects its input terminal B. As a result, the variable delay circuit 15 delays the inputted analog delay start signal ADS' by a time duration of (¼)×T corresponding to the fraction delay coefficient "¼", thereby to generate a timing pulse TPO-1 shown in FIG. 31I. This timing pulse TPO-1 is generated at the time point that the time duration of (4+¼)T has elapsed from the rise edge of the second test period signal PS-1. However, since the rise edge of the second test period signal PS-1 has entered into the start test period side by the time duration of (¾)T, the timing pulse TPO-1 is generated at the time point that the time duration of (4+¼)T−(¾)T=(3+½)T has elapsed from the starting point of the second test period. Thus, in the second cycle T1, the timing pulse TPO-1 is generated, which is also delayed by the time duration equivalent to the timing delay data TD=(3+½)T stored in the delay data memory 11 and designated by the timing signal TS.

Though the next third cycle T2 would have a time duration of (5+3/4)T+(½)T=(6+¼)T which is the sum of the fraction time duration (½)T carried over from the second cycle T1 and the test period Tt, the fraction time duration (¼)T is carried over to the next fourth cycle T3 so that the third cycle T2 can be set to have its period of 6T which is the integer time duration. As a result, in the third cycle T2, the fraction data FD becomes (½)T.

Like the case of the second cycle T1, the operation circuit 16 sums the timing delay data TD=(3+½)T given from the delay data memory 11 and the fraction data FD−2=(½)T. The result of the addition becomes (3+½+½)T=4T which has no fraction. Consequently, only an integer delay coefficient "4" (Sa=4) representing the delay time 4T of the integer part in the summed result 4T is given to the data input terminal di of the delay counter 12.

Since the operation of the delay counter 12 is the same as that of the delay counter in the second cycle, the explanation thereof will be omitted. The delay counter 12 outputs to its output terminal an analog delay start signal ADS which becomes logical H level only during the time interval T after it has been delayed by the time duration of 4T from the rise edge of the third test period signal PS-2, as shown in FIG. 31G. This analog delay start signal ADS is supplied to one of the input terminals of the AND circuit 14. Accordingly, the AND circuit 14 outputs an analog delay start signal ADS' shown in FIG. 31H, which is in turn inputted to the variable delay circuit 15.

Since the variable delay circuit 15 outputs the inputted analog delay start signal ADS' without giving any delay thereto, a timing pulse TPO-2 shown in FIG. 31I is generated. This timing pulse TPO-2 is generated at the time point that the time duration of 4T−(½)T=(3+½)T has elapsed from the starting point of the third test period because the rise edge of the third test period signal PS-2 has entered into the second test period side by the time duration of (½)T. Thus, in the third cycle T2, the timing pulse TPO-2 is generated, which is also delayed by the time duration equivalent to the timing delay data TD=(3+½)T stored in the delay data memory 11 and designated by the timing signal TS.

After that, similar operations to those described above will be repeated for each of the periods in the fourth cycle T3 and the subsequent cycles thereto.

FIG. 32 is a block diagram showing a third specific example of the timing generator 20, and FIG. 33 is a timing chart for explaining its operation. This third timing generator 20 comprises two timing generators 20 each of which is the same construction as that of the above-mentioned second specific example shown in FIG. 30, and is constructed such that the two timing generators 20A and 20B are operated in interleave mode (alternately operated in regular sequence), and timing pulses TPOA and TPOB alternately outputted from variable delay circuits 15A and 15B of the respective timing generators 20A and 20B are summed in an OR circuit 21. Each of the two timing generators 20A and 20B has the same construction as that of the timing generator of the above-mentioned second specific example, and hence portions and elements of the first timing generator 20A corresponding to those of the timing generator of the second specific example will be shown by the same reference characters with "A" affixed thereto, and also, portions and elements of the second timing generator 20B corresponding to those of the timing generator of the second specific example will be shown by the same reference characters with "B" affixed thereto. The explanations of those portions and elements will be omitted unless it is necessary.

Similarly to the above-mentioned second specific example, as to a case that the reference clock period T is set to 10 ns (T=10 ns), the test period Tt is set to 5×T+(¾)×T ns (Tt=57.5 ns), and a timing delay data 3×T+(½)×T=35 ns that is one of the plurality of timing delay data TD previously stored in each of the delay data memories 11A and 11B of the respective timing generators 20A and 20B is designated by a timing signal TS outputted from the pattern generator PG, the operations of both the timing generators 20A and 20B will be briefly discussed.

A reference clock REFCK having the reference clock period T=10 ns shown in FIG. 33A is externally supplied to each of the clock terminals CK of the delay counters 12A and 12B (12B is not shown) of the respective timing generators 20A and 20B, and the same address signal TS is supplied to the delay data memories 11A and 11B of the respective timing generators 20A and 20B. However, since these timing generators 20A and 20B are operated in interleave mode, the test period signals (period start signals) PSA and PSB to be supplied to the load terminals Ld of the respective delay counters respectively are given every two test periods (every a time duration of 2×Tt=(11+½)T), as shown in FIGS. 33B and 33G. In addition, the fraction data FDA and FDB each being shorter than the reference clock period T to be inputted to the operation circuits 16A and 16B respectively are also given every two test periods, as shown in FIGS. 33C and 33H.

In this specific example, since the interleave operation is performed, the first timing generator 20A is operated in odd periods such as the start cycle T0, the third cycle T2, the fifth cycle T4, ..., and the second timing generator 20B is operated in even periods such as the second cycle T1, the fourth cycle T3, the sixth cycle T5, ... Accordingly, the test period signals PSA are sequentially supplied to the load terminal Ld of the delay counter 12A at the starting point of each of the odd periods T0, T2, T4, ..., and the test period signals PSB are sequentially supplied to the load terminal Ld of the delay counter 12B (not shown) at the starting point of each of the even periods T1, T3, T5, ... Likewise, the fraction data FDA (0T, (½)T, ...) of the odd periods T0, T2, T4, ... are sequentially inputted to the operation circuit 16A at the starting point of each of the odd periods, and the fraction data FDB ((¾)T, (¼)T, ...) of the even periods T1, T3, T5, ... are sequentially supplied to the operation circuit 16B at the starting point of each of the even periods.

As a result, the first timing generator 20A generates, as shown in FIG. 33F, timing pulses TPOA in only odd periods at the time point that a time duration (3T+(½)T) corresponding to the timing delay data TD has elapsed from the starting point of each of the odd periods, and the second timing generator 20B generates, as shown in FIG. 33K, timing pulses TPOB in only even periods at the time point that a time duration (3T+(½)T) corresponding to the timing delay data TD has elapsed from the starting point of each of the even periods. Accordingly, the timing pulses TTPO of the entire timing generator 20 outputted from the OR circuit 21 become timing pulses each of which is delayed only by a time duration (3T+(½)T) corresponding to the timing delay data TD from the starting point of each of the test periods, as shown in FIG. 33L. Consequently, if both of the timing generators 20A and 20B are operated at the same speed as that of the timing generator in the second specific example shown in FIG. 30, timing pulses can be generated from the timing generators 20A and 20B at double the speed of generation of timing pulses from the timing generator in the second specific example. In addition, if the number of interleaves (the number of timing generators to be sequentially switched to operate) is increased, timing pulses can be generated at a speed multiplied by the number of interleaves.

Next, several specific examples of the waveform generating apparatus will be described, which includes a waveform shaping circuit FC for generating a test pattern signal FCO having a desired real waveform on the basis of test pattern data PAT supplied from the pattern generator PG and timing pulses TPO supplied from the timing generator 20.

In one test period Tt, a waveform in which data (waveforms) at both sides of a data (waveform) having logical value "1" in a logical signal are "0s" without fail or a waveform in which data (waveforms) at both sides of a data (waveform) having logical value "0" in a logical signal are "1s" without fail, is called an SBC waveform (surrounded by complement waveform). FIG. 34 is a block diagram showing a first specific example of the waveform generating apparatus which is capable of generating a test pattern signal having this SBC waveform, or a test pattern signal having an NRZ (nonreturn to zero) waveform or an RZ (return to zero) waveform, and FIG. 35 is a timing chart for explaining the operation of the first specific example. A generated test pattern signal FCO is applied to a DUT 19.

As shown in FIG. 34, the waveform generating apparatus of this first specific example comprises three of first, second and third timing generators TGA, TGB and TGC, a memory circuit 41 to which a waveform mode selecting signal WM for specifying either one of an SBC waveform, an NRZ waveform or an RZ waveform and a test pattern data PAT from the pattern generator PG are inputted, and a waveform shaping circuit FC for generating an SBC waveform, an NRZ waveform or an RZ waveform on the basis of timing pulses supplied from these timing generators TGA, TGB and TGC respectively and a pattern data supplied from the memory circuit 41.

Though the timing generators TGA, TGB and TGC are illustrated with only a variable delay circuit VD shown in their blocks, each of the timing generators may have the same circuit configuration as that of the timing generator 20 of the second specific example shown in FIG. 30. Accordingly, as mentioned above, the timing generators TGA, TGB and TGC generate timing pulses TPOA, TPOB and TPOC respectively on the basis of a test period signal PS and a timing signal TS supplied from the pattern generator PG as well as a fraction data FD shorter than the reference clock period T. Further, each of the variable delay circuits VD corresponds to the variable delay circuit 15 in the timing generator 20 of the second specific example.

The waveform shaping circuit FC comprises six of first to sixth AND gates AND1–AND6, six of first to sixth variable delay circuits 33–38 for delaying output signals from these AND gates AND1–AND6 respectively, a first OR gate 39 for executing a logical OR operation of the first, third and fifth delay circuits 33, 35 and 37, a second OR gate 40 for executing a logical OR operation of the second, fourth and sixth delay circuits 34, 36 and 38, and an S-R (set-reset) flip-flop 26 to the set terminal of which is applied an output signal of the first OR gate 39 and the reset terminal of which is applied an output signal of the second OR gate 40.

In order to make it possible to use a timing pulse outputted from each of the timing generators as either of a set pulse Ss and a reset pulse Sr to the S-R flip-flop 26, two AND gates have been provided at the output side of each of the timing generators. A timing pulse TPOA from the first timing generator TGA is supplied in common to one input terminals of the first and second AND gates AND1 and AND2, a timing pulse TPOB from the second timing generator TGB is supplied in common to one input terminals of the third and fourth AND gates AND3 and AND4, and a timing pulse TPOC from the third timing generator TGC is supplied in common to one input terminals of the fifth and sixth AND gates AND5 and AND6. Further, a timing pulse for setting (or a set timing pulse) outputted from each of the timing generators is supplied to the first OR gate 39, and a timing pulse for resetting (or a reset timing pulse) outputted from each of the timing generators is supplied to the second OR gate 40.

The memory circuit 41 is provided with a gate control table 41a which outputs control data for controlling the AND gates AND1–AND6 in their enable states or disable states. When a waveform mode selecting signal WM and a test pattern data PAT are inputted to the memory circuit 41, the memory circuit 41 supplies control data D1–D6 corresponding to a waveform specified by this waveform mode selecting signal WM to the other input terminals of the corresponding AND gates AND1–AND6, respectively. In the illustrated example, D1 is supplied to the AND gate AND1, D2 to the AND gate AND2, D3 to the AND gate AND3, D4 to the AND gate AND4, D5 to the AND gate AND5, and D6 to the AND gate AND6.

FIG. 36 shows an example of the gate control table 41a. In case that the logical value of the test pattern data PAT is "0", the control data shown in left sides of slash lines in FIG. 36 are outputted in accordance with a specified waveform, and in case that the logical value of the test pattern data PAT is "1", the control data shown in right sides of the slash lines are outputted in accordance with a specified waveform. The outputted control data are supplied to the other input terminals of the corresponding AND gates AND1–AND6, respectively. In the gate control table 41a shown in FIG. 36, the control data "ON" represents an enable state of each of the AND gates, and the control data "OFF" represents a disable state of each of the AND gates.

First of all, in case that a waveform mode selecting signal WM specifies an SBC waveform, and the logical value of a test pattern data PAT is in order of "0"→"1"→"0". . . as shown in FIG. 35C, in the start cycle T0, the logical value of the test pattern data PAT is "0". As a result, from the gate control table 41a shown in FIG. 36, D1 is ON, D2 is OFF, D3 is OFF, D4 is ON, D5 is ON and D6 is OFF. Accordingly, the first, fourth and fifth AND gates AND1, AND4 and AND5 become enable states respectively so that the timing pulses TPOA, TPOB and TPOC can pass through these AND gates, and the timing pulses TPOA and TPOC can be used as set pulses Ss as shown in FIG. 35H, and the timing pulse TPOB can be used as a reset pulse Sr as shown in FIG. 35H. In the second cycle T1, the logical value of the test pattern data PAT is "1", and hence D1 is OFF, D2 is ON, D3 is ON, D4 is OFF, D5 is OFF and D6 is ON. As a result, the second, third and sixth AND gates AND2, AND3 and AND6 become enable states respectively so that the timing pulses TPOA, TPOB and TPOC can pass through these AND gates, and only the timing pulse TPOB can be used as a set pulse Ss as shown in FIG. 35G, and the timing pulses TPOA and TPOC can be used as reset pulses Sr as shown in FIG. 35H. Since the operation in the third cycle is the same as that in the start cycle, the explanation thereof will be omitted. Further, in the timing chart shown in FIG. 35, in case that one period of the reference clock REFCK is set to T, the test period Tt is set to $\{6+(\frac{1}{2})\}$T. Accordingly, the time interval of the start cycle T0 is set to 6T, the time interval of the second cycle T1 is set to 7T, the time interval of the third cycle T2 is set to 6T, . . .

As a result, from the S-R flip-flop 26 is outputted a test pattern signal FCO having the SBC waveform shown in FIG. 35I. As can easily be understood from this SBC waveform, in each test period Tt, the data of logical value "0" in the test pattern data PAT is shaped into a waveform of logical value "0" having an effective time duration Tv, which has, at the both sides thereof, a waveform of logical "1" having a time duration T0 and a waveform of logical "1" having a time duration T3. On the other hand, the data of logical value "1" in the test pattern data PAT is shaped into a waveform of logical value "1" having an effective time duration Tv, which has, at the both side thereof, a waveform of logical "0" having a duration time T0 and a waveform of logical "0" having a duration time T3.

Next, in case that a waveform mode selecting signal WM specifies an RZ waveform, two of the timing generators are used. Since the second and third timing generators TGB and TGC are used in this example, the timing pulses TPOA outputted from the first timing generator TGA must be made unavailable. Therefore, as shown in the gate control table 41a in FIG. 36, the control data D1 and D2 are always made OFF so that the first and second AND gates AND1 and AND2 can always be made disable state.

Next, in case that a waveform mode selecting signal WM specifies an NRZ waveform, only one of the timing generators is used, and the first timing generator TGA is used in this example. Accordingly, the timing pulses TPOB and TPOC outputted respectively from the second and third timing generators TGB and TGC must be made unavailable. Thus, as shown in the gate control table 41a in FIG. 36, the control data D3–D6 are always made OFF so that the third to the sixth AND gates AND3–AND6 can always be made disable state.

FIG. 37 is a block diagram showing a second specific example of the waveform generating apparatus which is capable of generating a test pattern signal having an SBC waveform, an NRZ waveform or an RZ waveform. This second specific example comprises two waveform generating apparatuses each of which has the same construction as that of the above-mentioned first specific example shown in FIG. 34, and is constructed such that the two waveform generating apparatuses are operated in interleave mode (alternately operated in regular sequence) so that timing pulses can be alternately outputted from both the waveform generating apparatuses, thereby to generate timing pulses at double the speed of generation of timing pulses from one waveform generating apparatus. Since each of the two waveform generating apparatuses has the same construction as that of the waveform generating apparatus of the above-mentioned first specific example, portions and elements of the first waveform generating apparatus corresponding to those of the waveform generating apparatus of the first specific example will be shown by the same reference characters, and portions and elements of the second waveform generating apparatus corresponding to those of the waveform generating apparatus of the first specific example will be shown by the same reference characters with a prime (') affixed thereto. In addition, with respect to a test pattern data PAT, a test period signal PS and a timing signal TS supplied from the pattern generator PG, and a fraction data FD shorter than the reference clock period T, signals and data supplied to the first waveform generating apparatus will be shown by the same reference characters with a sign "-A" affixed thereto, and signals and data supplied to the second waveform generating apparatus will be shown by the same reference characters with a sign "-B" affixed thereto. Since the operation of the waveform generating apparatus of the second specific example can easily be understood from the operation of the aforementioned waveform generating apparatus of the first specific example and the description of the interleave operation with reference to FIG. 33, the explanation thereof will be omitted.

Here, referring to the waveform generating apparatus of the first specific example shown in FIG. 34 again, the timing pulses TPOA, TPOB and TPOC respectively outputted from the timing generators TGA, TGB and TGC must be supplied to the set terminal and the reset terminal of the S-R flip-flop 26 in phase with one another. For this reason, the variable delay circuits 33–38 are inserted into the output sides of the AND gates AND1–AND6, respectively, to adjust delay times (propagation delay times) of these timing pulses TPOA, TPOB and TPOC in their respective propagation paths (that is, to make skew adjustments) so that the timing pulses can reach the set terminal and the reset terminal of the S-R flip-flop 26 in phase with one another.

Now, the sum of propagation delay times (T–Tpd) of a timing pulse propagating through the propagation path La including the analogously configured variable delay circuit 33 for skew adjustment and the variable delay circuit VD of the timing generator TGA fluctuates depending upon changes in temperature and voltage, and amounts of the fluctuations can be expressed by following equations.

$$\Delta T1 = (T-Tpd) \times \text{(temperature fluctuation coefficient of } Tpd) \times (\pm \text{temperature changing width}) \quad (1)$$

$$\Delta T2 = (T-Tpd) \times \text{(temperature fluctuation coefficient of } Tpd) \times (\pm \text{voltage changing width}) \quad (2)$$

For example, if it is assumed that T–Tpd is equal to 10 ns, the temperature fluctuation coefficient is 0.3%/° C., and the environmental temperature of the IC tester is 25±5° C., the following result is obtained.

$$\Delta T1 = 10 \times 0.3 \times 10^{-2} \times (\pm 5) \text{ (ns)}$$

$$= \pm 0.15 \text{ (ns)} = \pm 150 \text{ ps}$$

A similar result is obtained for a timing pulse propagating through another propagation path.

In the waveform generating apparatus of the first specific example shown in FIG. 34 and the waveform generating apparatus of the second specific example shown in FIG. 37, the variable delay circuit of each timing generator is connected in cascade with the corresponding variable delay circuit for skew adjustment. Therefore, there is a drawback that the total propagation delay time (T−Tpd) becomes large, and hence the amount of temperature fluctuation ΔT1 and the amount of voltage fluctuation ΔT2 in the propagation delay time have large values, which results in degradation of the timing accuracy.

In addition, due to the limitations in performance of input/output buffers of an LSI constructed as the waveform generating apparatus, a high frequency reference clock cannot be inputted to the waveform generating apparatus from the outside. For this reason, as a procedure for improving the operation speed, there has been used a procedure called interleave operation (multiplexed operation) in which a plurality of timing generators are prepared, and these timing generators are sequentially switched to alternately operate them, as shown in FIGS. 32 and 37. However, if the interleave operation is adopted, almost all of the modules (elements) including the timing generators must be prepared as many as the number of interleaves, and hence the scale of the hardware is increased to about one multiplied by the number of interleaves. Particularly, in the waveform generating apparatus adopting the interleave operation shown in FIG. 37, six timing generators are required although the number of interleaves is two (2).

Moreover, the variable delay circuit 15 or VD of each of the timing generators utilizes gate delays of a plurality of gate elements connected in cascade, as shown in FIG. 29A, and hence a considerable process steps are needed to create a data conversion table for converting logical delay times into control (select) signals as shown in FIG. 29B. For the waveform generating apparatus shown in FIG. 34, since three variable delay circuits VD are used, three data conversion tables must be created. For the waveform generating apparatus adopting the interleave operation shown in FIG. 37, since six variable delay circuits VD are used, six data conversion tables must be created. If the number of interleaves is further increased to make the operation speed higher, the number of variable delay circuits to be used is also increased. Accordingly, there is a drawback that process steps for creating data conversion tables are much increased.

Furthermore, as shown in FIG. 37, the set pulse Ss supplied to the set terminal and the reset pulse Sr supplied to the reset terminal of the SR flip-flop 26 are obtained as the results of logical OR operations of the timing pulses propagating through six propagation paths, respectively. As a result, there is a problem that a slight unevenness is liable to occur in corrections of the delay times (slew adjustments) of the respective propagation paths, and hence the timing accuracy is further deteriorated.

DISCLOSURE OF THE INVENTION

It is an object of the present invention to provide a waveform generating apparatus which can solve the aforementioned problems occurring in the prior art and a semiconductor device testing apparatus having this waveform generating apparatus therein.

It is another object of the present invention to provide a waveform generating apparatus which can improve the timing accuracy and in which the scale of the hardware can be simplified while its superficial interchangeability with the prior art hardware is maintained, and a semiconductor device testing apparatus having this waveform generating apparatus therein.

In order to accomplish the aforesaid objects, in a first aspect of the present invention, there is provided a waveform generating apparatus comprising: delay data selecting means selecting, out of a plurality of delay data, at least one delay data for generating at least one set pulse and at least one delay data for generating at least one reset pulse in accordance with test logical data and waveform mode information externally supplied thereto; skew data storage means for set pulse and for reset pulse, said skew data storage means storing therein skew adjusting delay data for a propagation path of a delay data for set pulse and for a propagation path of a delay data for reset pulse, respectively; operation means for set pulse and for reset pulse, said operation means performing an operation of the set pulse delay data, the skew adjusting delay data for set pulse and a fraction data in each test cycle externally supplied thereto and an operation of the reset pulse delay data, the skew adjusting delay data for reset pulse and a fraction data in each test cycle externally supplied thereto, respectively, and outputting an integer delay data and a fraction delay data for set pulse from the result of the operation and an integer delay data and a fraction delay data for reset pulse from the result of the operation, respectively; delay means for set pulse and for reset pulse, said delay means outputting at least one set pulse generating effective flag for causing a timing of a test period to delay by a delay time corresponding to the integer delay data and at least one reset pulse generating effective flag for causing a timing of a test period to delay by a delay time corresponding to the integer delay data, respectively, as well as outputting fraction delay data related to these set pulse generating effective flag and reset pulse generating effective flag, respectively; variable delay means for set pulse and for reset pulse, to which the set pulse generating effective flag and the reset pulse generating effective flag are inputted respectively, said variable delay means delaying the effective flags on the basis of the related fraction delay data, respectively; and waveform outputting means outputting a waveform which is set by a set pulse supplied from said set pulse variable delay means and reset by a reset pulse supplied from said reset pulse variable delay means, for each test period.

In a preferred embodiment, the waveform generating apparatus further includes a delay data memory for storing therein said plurality of delay data, and said delay data selecting means comprises: a select data memory for generating data selecting information in accordance with test logical data and waveform mode information externally supplied thereto; and a multiplexer for selecting, out of the plurality of delay data supplied from said delay data memory, said at least one delay data for generating at least one set pulse and said at least one delay data for generating at least one reset pulse, by the data selecting information supplied from said select data memory.

In addition, it is preferable that said select data memory has data selecting information stored therein corresponding to waveform mode information, test logical data of current test cycle and previous test cycle, and the set pulse effective flag and the reset pulse effective flags.

The aforesaid delay data selecting means may comprise: a select data memory in which data selecting information corresponding to the waveform mode information and test logical data of current test cycle and previous test cycle is stored; and a multiplexer which is capable of selecting, out of the data selecting information inputted thereto from said select data memory and the plurality of delay data inputted thereto from a delay data memory, said at least one set pulse generating delay data and said at least one reset pulse generating delay data, and the set pulse effective flag and the reset pulse effective flag in the first half or the second half of a period signal.

The aforesaid variable delay means comprise: set pulse and reset pulse data conversion means each outputting a delay control signal corresponding to the fraction delay data; and set pulse and reset pulse variable delay circuits for delaying, on the basis of the delay control signals outputted from said data conversion means, the set pulse generating effective flag and the reset pulse generating effective flag inputted thereto, respectively.

It is preferable that the data selecting information stored in said select data memory is set such that when the test logical data is a sequence of the same logical values such as "0", "0" or "1", "1" in adjacent test cycles, the set pulse or the reset pulse is inhibited from being consecutively inputted to said waveform outputting means.

The aforesaid set pulse delay means and the aforesaid reset pulse delay means may perform operations of the set pulse integer delay data and an output of a counter for counting a clock and of the reset pulse integer delay data and an output of a counter for counting a clock, thereby to generate set pulse and reset pulse counter data coincidence expected values, respectively, and detect coincidences between said coincidence expected values and the output of said counter and output the set pulse generating effective flag and the reset pulse generating effective flag as well as the set pulse fraction delay data and the reset pulse fraction delay data related to these effective flags, respectively.

It is preferable that control means is provided for inhibiting an input data from being loaded in said set pulse delay means and said reset pulse delay means in case that an open flag for inhibiting a pulse from being outputted is given to a delay data supplied to said multiplexer from said delay data memory, and also, in case that a set/reset pulse effective flag is not present in data selecting information supplied to said multiplexer from said select data memory.

In a second aspect of the present invention, there is provided a semiconductor device testing apparatus for testing a semiconductor device comprising: delay data selecting means selecting, out of a plurality of delay data, at least one delay data for generating at least one set pulse and at least one delay data for generating at least one reset pulse in accordance with test logical data and waveform mode information externally supplied thereto; skew data storage means for set pulse and for reset pulse, said skew data storage means storing therein skew adjusting delay data for a propagation path of a delay data for set pulse and for a propagation path of a delay data for reset pulse, respectively; operation means for set pulse and for reset pulse, said operation means performing an operation of the set pulse delay data, the skew adjusting delay data for set pulse and a fraction data in each test cycle externally supplied thereto and an operation of the reset pulse delay data, the skew adjusting delay data for reset pulse and a fraction data in each test cycle externally supplied thereto, respectively, and outputting an integer delay data and a fraction delay data for set pulse from the result of the operation and an integer delay data and a fraction delay data for reset pulse from the result of the operation, respectively; delay means for set pulse and for reset pulse, said delay means outputting at least one set pulse generating effective flag for causing a timing of a test period to delay by a delay time corresponding to the integer delay data and at least one reset pulse generating effective flag for causing a timing of a test period to delay by a delay time corresponding to the integer delay data, respectively, as well as outputting fraction delay data related to these set pulse generating effective flag and reset pulse generating effective flag, respectively; variable delay means for set pulse and for reset pulse, to which the set pulse generating effective flag and the reset pulse generating effective flag are inputted respectively, said variable delay means delaying the effective flags on the basis of the related fraction delay data, respectively; waveform outputting means outputting a waveform which is set by a set pulse supplied from said set pulse variable delay means and reset by a reset pulse supplied from said reset pulse variable delay means, for each test period; and means applying a test signal having the waveform outputted from said waveform outputting means to a semiconductor device under test.

In a preferred embodiment, the semiconductor testing apparatus further includes a delay data memory for storing therein said plurality of delay data, and said delay data selecting means comprises: a select data memory for generating data selecting information in accordance with test logical data and waveform mode information externally supplied thereto; and a multiplexer for selecting, out of the plurality of delay data supplied from said delay data memory, said at least one delay data for generating at least one set pulse and said at least one delay data for generating at least one reset pulse, by the data selecting information supplied from said select data memory.

In addition, it is preferable that said select data memory has data selecting information stored therein corresponding to waveform mode information, test logical data of current test cycle and previous test cycle, and the set pulse effective flag and the reset pulse effective flags.

The aforesaid delay data selecting means may comprise: a select data memory in which data selecting information corresponding to the waveform mode information and test logical data of current test cycle and previous test cycle is stored; and a multiplexer which is capable of selecting, out of the data selecting information inputted thereto from said select data memory and the plurality of delay data inputted thereto from a delay data memory, said at least one set pulse generating delay data and said at least one reset pulse generating delay data, and the set pulse effective flag and the reset pulse effective flag in the first half or the second half of a period signal.

The aforesaid variable delay means comprise: set pulse and reset pulse data conversion means each outputting a delay control signal corresponding to the fraction delay data; and set pulse and reset pulse variable delay circuits for delaying, on the basis of the delay control signals outputted from said data conversion means, the set pulse generating effective flag and the reset pulse generating effective flag inputted thereto, respectively.

It is preferable that the data selecting information stored in said select data memory is set such that when the test logical data is a sequence of the same logical value such as "0", "0" or "1", "1" in adjacent test cycles, the set pulse or the reset pulse is inhibited from being consecutively inputted to said waveform outputting means.

The aforesaid set pulse delay means and the aforesaid reset pulse delay means may perform operations of the set pulse integer delay data and an output of a counter for counting a clock and of the reset pulse integer delay data and an output of a counter for counting a clock, thereby to generate set pulse and reset pulse counter data coincidence expected values, respectively, and detect coincidences between said coincidence expected values and the output of said counter and output the set pulse generating effective flag and the reset pulse generating effective flag as well as the set pulse fraction delay data and the reset pulse fraction delay data related to these effective flags, respectively.

BRIEF DESCRIPTION OF THE DRAWINGS

FIG. 2 is a timing chart for explaining the operation of the waveform generating apparatus shown in FIG. 1;

FIG. 6 is a block diagram showing a specified circuit configuration of, mainly, the select data memory of the waveform generating apparatus shown in FIG. 1;

FIG. 9 is a diagram showing a corresponding relationship between select data and delay data selected by the multiplexer;

FIG. 10 is a diagram showing a corresponding relationship between address inputs and select data in the select data memory in normal operation speed mode, and a corresponding relationship between the select data and outputs of the multiplexers;

FIG. 11 is a diagram showing a corresponding relationship between address inputs and select data in the select data memory in operation speed-doubled mode, and a corresponding relationship between the select data and outputs of the multiplexers;

FIG. 36 is a diagram showing an example of the data stored in the gate control table shown in FIG. 34.

BEST MODES FOR CARRYING OUT THE INVENTION

Now, preferred embodiments of the waveform generating apparatus according to the present invention will be described in detail with reference to FIGS. 1 to 25.

Figure 1:
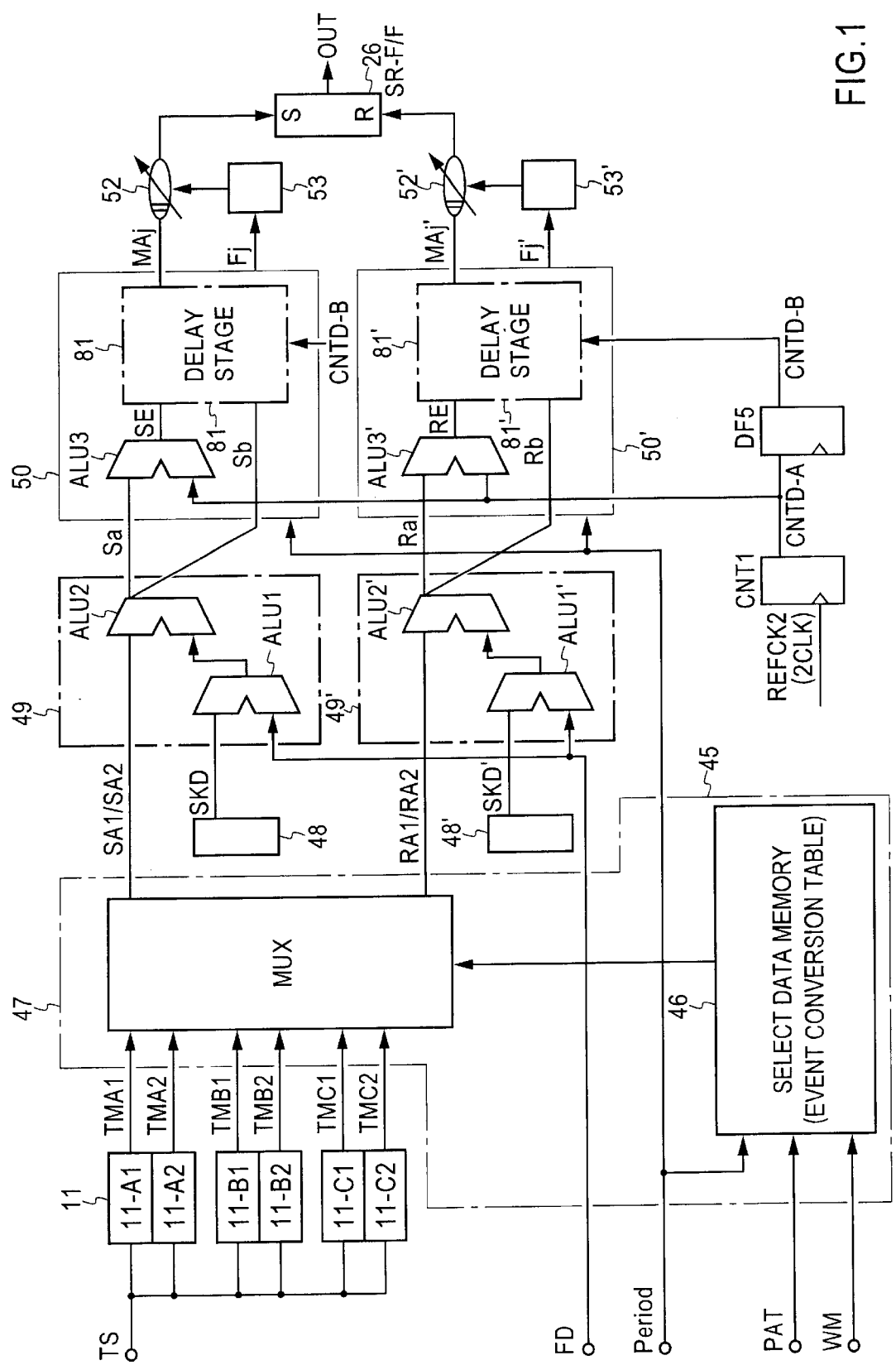
FIG. 1 is a block diagram showing an embodiment of the waveform generating apparatus according to the present invention.
Figure 3:
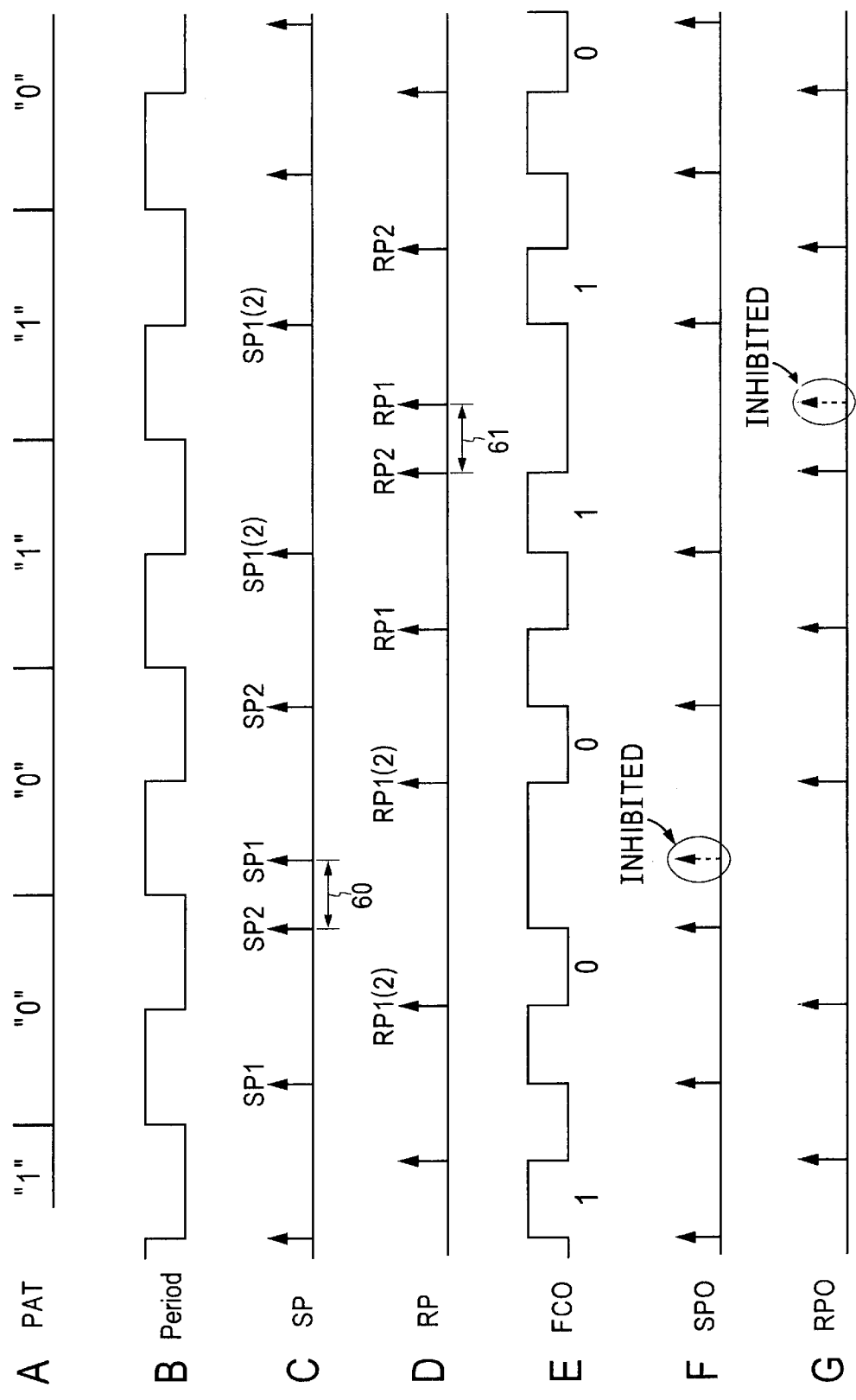
FIG. 3 is a timing chart for explaining the operation of the waveform generating apparatus shown in FIG. 1.

FIG. 1 is a block diagram showing an embodiment of the waveform generating apparatus according to the present invention. This waveform generating apparatus comprises six of a first to a sixth delay data memories 11-A1, 11-A2, 11-B1, 11-B2, 11-C1 and 11-C2 (the whole of the delay data memories is represented by a reference numeral 11) to each of which a timing signal TS is inputted from the pattern generator PG (refer to FIG. 26), a delay data selecting circuit 45 having a select data memory (event conversion table) 46 and a multiplexer 47, a first and a second skew registers 48 and 48' in which skew adjusting delay data SKD and SKD' are stored respectively, the skew adjusting delay data SKD and SKD' adjusting delay times in propagation paths of timing pulses respectively, a first operation circuit 49 to which are supplied output signals SA1/SA2 from the delay data selecting circuit 45, the skew adjusting delay data SKD from the first skew register 48, and a fraction data FD representing a fraction time duration shorter than the reference clock period T, a second operation circuit 49' to which are supplied output signals RA1/RA2 from the delay data selecting circuit 45, the skew adjusting delay data SKD' from the second skew register 48', and a fraction data FD representing a fraction time duration shorter than the reference clock period T, a first counter CNT1 for counting a clock REFCK2 the rate of which is twice that of the reference clock REFCK (a speed-doubled clock), a fifth D-type flip-flop DF5 supplied with an output signal CNTD-A from this counter CNT1, a first counter delay circuit 50 to which are supplied output signals Sa and Sb from the first operation circuit 49, a test period signal Period, the output signal CNTD-A from the counter CNT1, and an output signal CNTD-B from the D-type flip-flop DF5, a second counter delay circuit 50' to which are supplied output signals Ra and Rb from the second operation circuit 49', the test period signal Period, the output signal CNTD-A from the counter CNT1, and the output signal CNTD-B from the D-type flip-flop DF5, a first variable delay circuit 52 for delaying an output signal MAj from the first counter delay circuit 50, a second variable delay circuit 52' for delaying an output signal MAj' from the second counter delay circuit 50', a first and a second data conversion tables 53 and 53' for controlling delay amounts of the first and the second variable delay circuits 52 and 52' respectively, and an S-R flip-flop 26 to the set terminal S of which is supplied an output signal from the variable delay circuit 52 and to the reset terminal R of which is supplied an output signal from the variable delay circuit 52'.

Delay data TMA1, TMA2, TMB1, TMB2, TMC1 and TMC2 are stored in the first, the second, the third, the fourth, the fifth and the sixth delay data memories 11-A1, 11-A2, 11-B1, 11-B2, 11-C1 and 11-C2, respectively, and the delay data are outputted from the corresponding delay data memories by that a timing signal TS is supplied thereto from the pattern generator PG. In this embodiment, the magnitude of the delay data to be outputted is selected to be TMA1<TMA2, TMB1<TMB2, TMC1<TMC2. In addition, if the SBC waveform is specified to generate, the magnitude of the delay data is selected to be TMA1<TMB1<TMC1, TMA2<TMB2<TMC2, and if the RZ waveform is specified to generate, the magnitude of the delay data is selected to be TMB1<TMC1, TMB2<TMC2.

The first skew register 48, the first operation circuit 49, the first counter delay circuit 50, the first variable delay circuit 52 and the first data conversion table 53 are concerned in generation of a timing pulse (hereinafter referred to as pulse for setting or a set pulse) to be supplied to the set terminal S of the S-R flip-flop 26. The second skew register 48', the second operation circuit 49', the second counter delay circuit 50', the second variable delay circuit 52' and the second data conversion table 53' are concerned in generation of a timing pulse (hereinafter referred to as pulse for resetting or a reset pulse) to be supplied to the reset terminal R of the S-R flip-flop 26.

The select data memory 46 of the delay data selecting circuit 45 supplies, when the test period signal Period and a test pattern data PAT from the pattern generator PG and a waveform mode selecting signal WM for specifying a type of waveform to be generated are inputted to the select data memory 46, a select data to the control terminal of the multiplexer 47, the select data selecting a delay data corresponding to the waveform specified by the waveform mode selecting signal WM.

The multiplexer 47 selects the delay data specified by the select data among the delay data TMA1, TMA2, TMB1, TMB2, TMC1 and TMC2 supplied from the delay data memories 11, and supplies the delay data SA1/SA2 relating to the set pulse to the first operation circuit 49, and the delay data RA1/RA2 relating to the reset pulse to the second operation circuit 49'. The delay data SA1/SA2 and RA1/ RA2 to be outputted from the multiplexer 47 are increased or decreased depending upon the number of timing pulses to be generated. For example, in case that two set pulses are to be generated, two delay data SA1 and SA2 are selected by the select data. Similarly, in case that two reset pulses are to be generated, two delay data RA1 and RA2 are selected by the select data. In addition, in case that one set pulse is to be generated, one delay data SA1 or SA2 is selected. Similarly, in case that one reset pulse is to be generated, one delay data RA1 or RA2 is selected.

The first operation circuit 49 comprises a first operation unit ALU1 for summing a skew adjusting delay data SKD from the first skew register 48 and a fraction data FD for each test cycle, and a second operation unit ALU2 for summing the summed result of the first operation unit ALU1 and the delay data SA1/SA2 which are outputted from the multiplexer 47 and are concerned in generation of a set pulse. An integer delay coefficient Sa representing a delay time of an integer part in the summed result from the second operation unit ALU2 is supplied to one input terminal of an operation unit ALU3 of the first counter delay circuit 50, and a fraction delay coefficient Sb representing a delay time of a fraction part in the summed result from the second operation unit ALU2 is supplied to a delay stage 81 of the first counter delay circuit 50. An output signal CNTD-A from the first counter CNT1 is supplied to the other input terminal of the operation unit ALU3 which inturn supplies the summed result SE of the integer delay coefficient Sa and the output signal CNTD-A to the delay stage 81.

The second operation circuit 49' comprises a first operation unit ALU1' for summing a skew adjusting delay data SKD' from the second skew register 48' and a fraction data FD for each test cycle, and a second operation unit ALU2' for summing the summed result of the first operation unit ALU1' and the delay data RA1/RA2 which are outputted from the multiplexer 47 and are concerned in generation of a reset pulse. An integer delay coefficient Ra representing a delay time of an integer part in the summed result from the second operation unit ALU2' is supplied to one input terminal of an operation unit ALU3' of the second counter delay circuit 50', and a fraction delay coefficient Rb representing a delay time of a fraction part in the summed result from the second operation unit ALU2' is supplied to a delay stage 81' of the second counter delay circuit 50'. An output signal CNTD-A from the first counter CNT1 is supplied to the other input terminal of the operation unit ALU3' which in turn supplies the summed result RE of the integer delay coefficient Ra and the output signal CNTD-A to the delay stage 81'.

The first and the second counter delay circuit 50 and 50' output at least one set pulse effective flag Maj and at least one reset pulse effective flag MAj' for delaying the timing of a test period by delay times corresponding to the integer delay coefficients Sa and Ra supplied from the first and the second operation circuits 49 and 49', respectively, and also output a set pulse and a reset pulse fraction delay data Fj and Fj' (represent delay times corresponding to the inputted fraction delay coefficients Sb and Rb respectively) relating to the set pulse effective flag and the reset pulse effective flag, respectively. The set and the reset pulse effective flags Maj and MAj' are supplied to the first and the second variable delay circuits 53 and 53', respectively, and the set pulse and the reset pulse fraction delay data Fj and Fj' are supplied to the first and the second data conversion tables 53 and 53'.

The first and the second data conversion tables 53 and 53' are constituted by memories, respectively, and when the set and the reset pulse fraction delay data Fj/Fj' are inputted thereto, they output delay control signals (select signals) corresponding to these data, respectively. The first and the second variable delay circuit 52 and 52' give amounts of delays corresponding to the delay control signals to the inputted set and reset pulse effective flags Maj and MAj', respectively, and supply the set and the reset pulse effective flags to the set and the reset terminals S and R of the S-R flip-flop 26 as a set pulse and a reset pulse, respectively.

Figure 26:
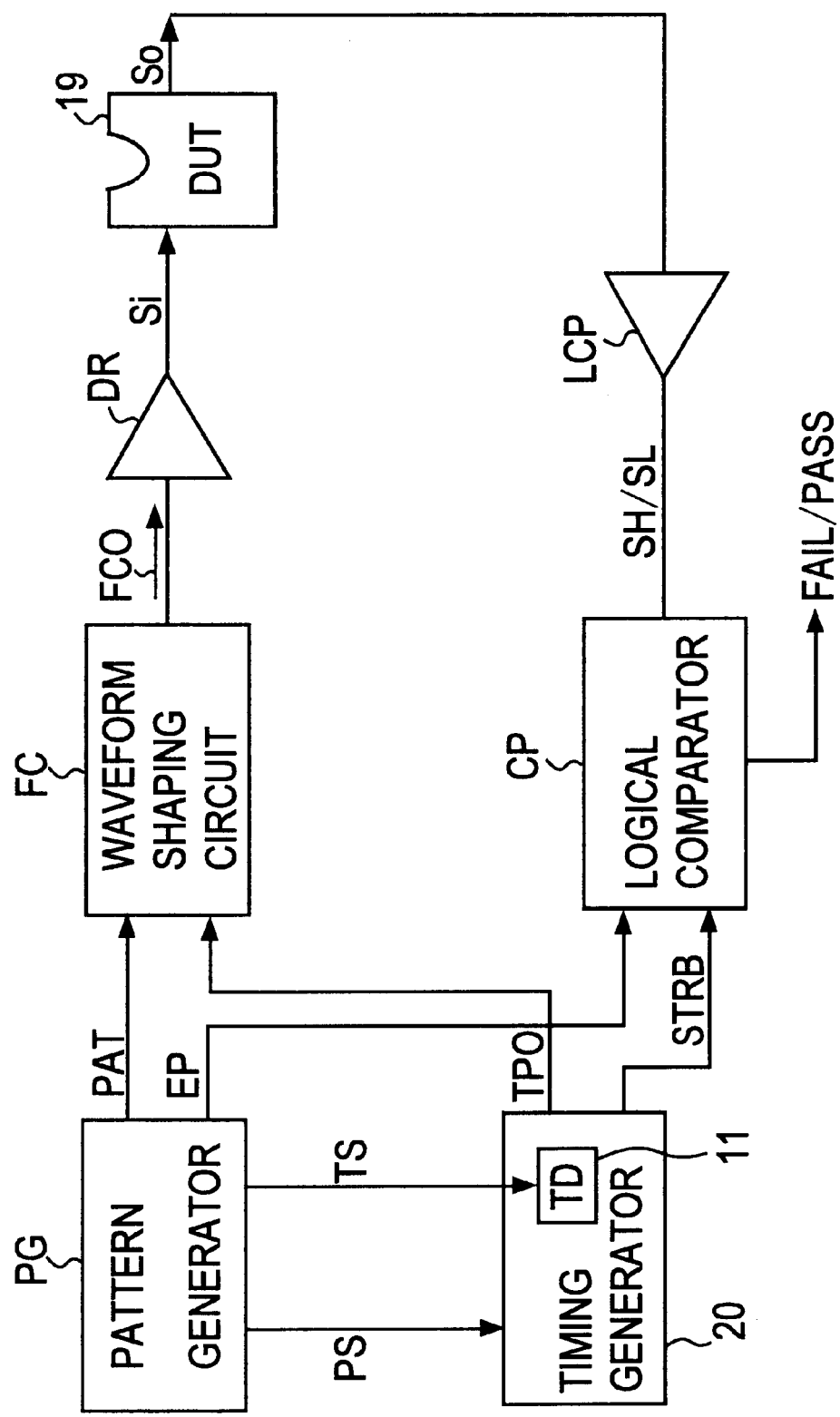
FIG. 26 is a block diagram showing the construction of an example of the prior art IC tester.
Figure 27:
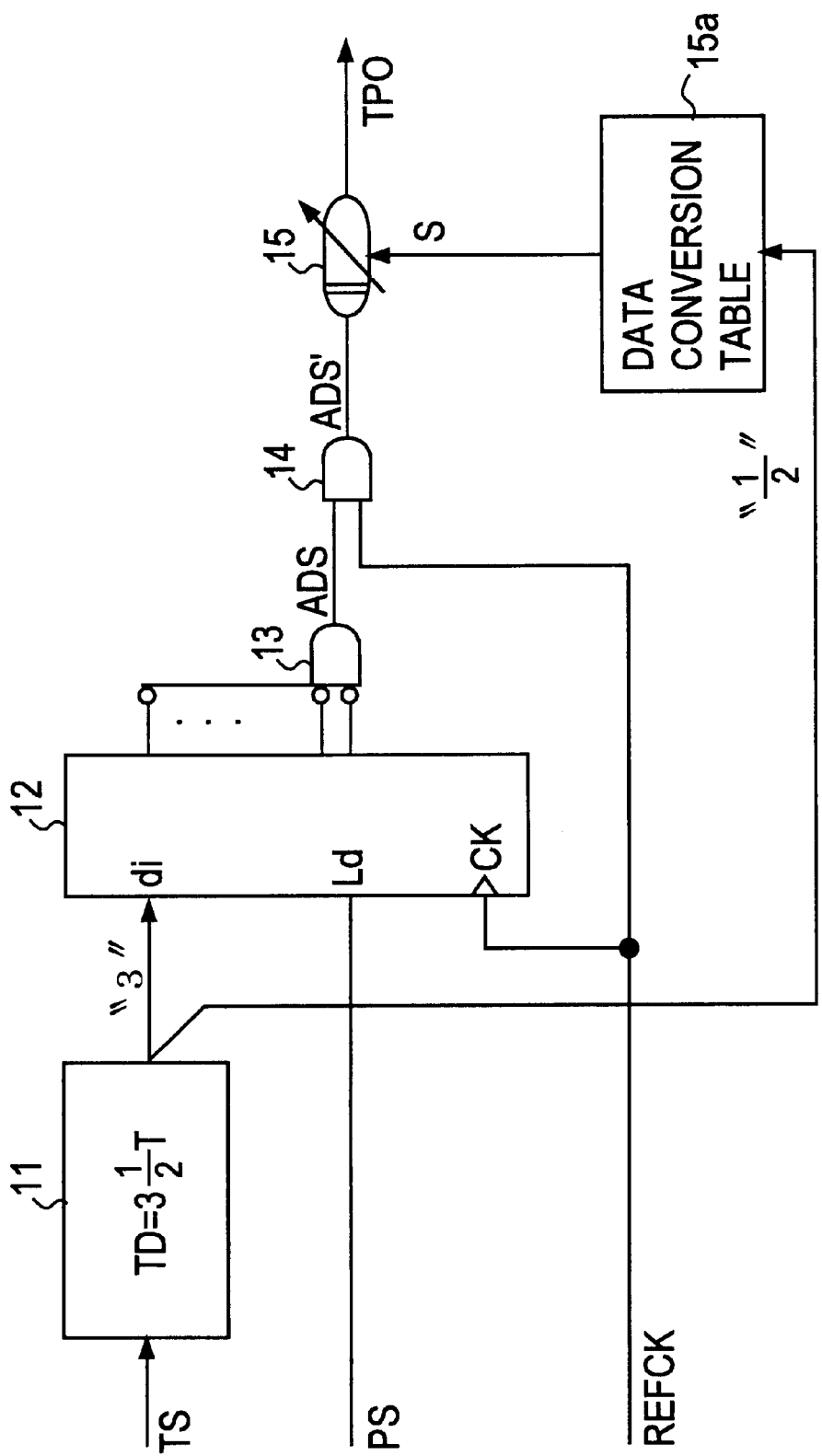
FIG. 27 is a block diagram showing an example of the timing generator shown in FIG. 26.
Figure 28:
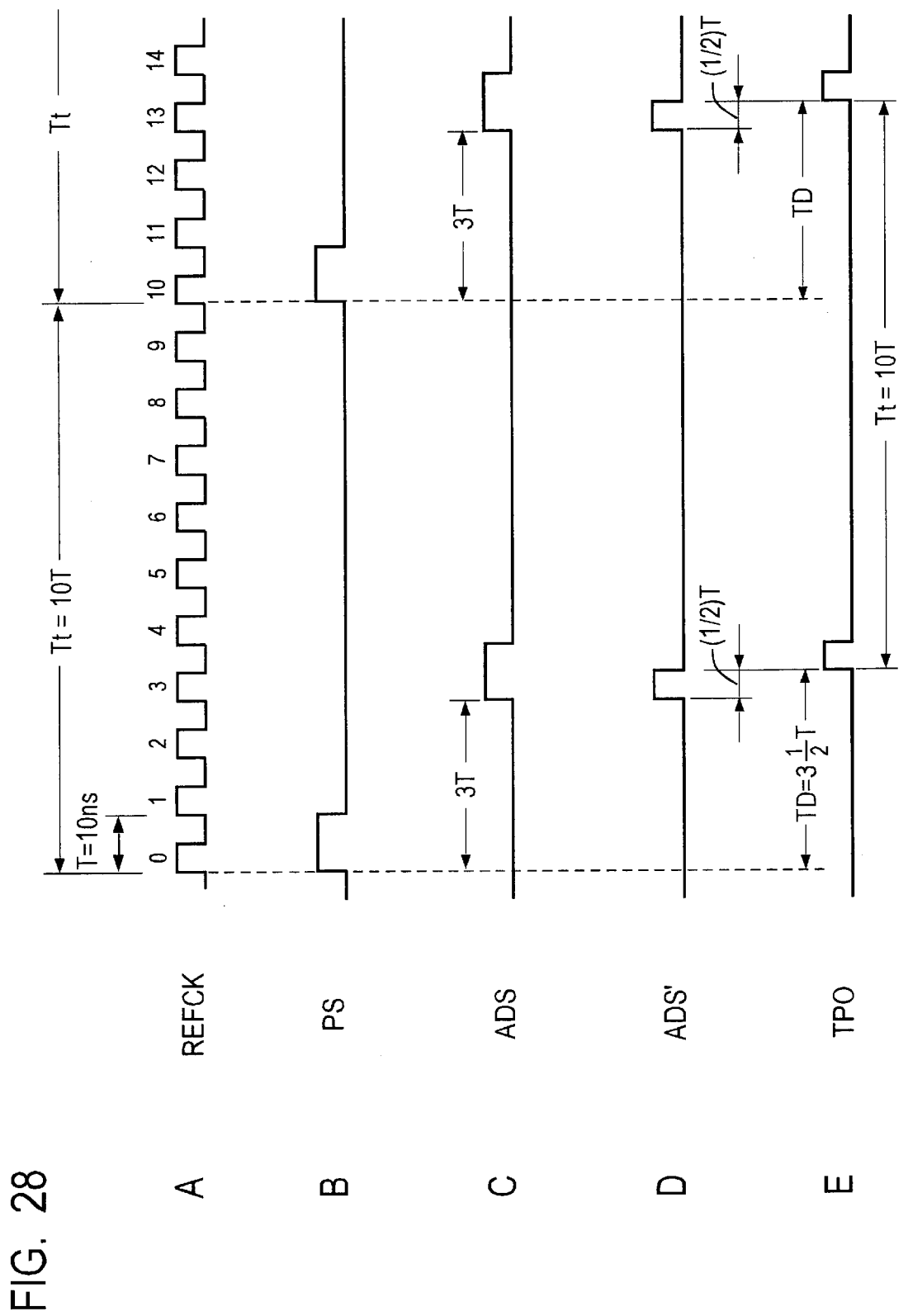
FIG. 28 is a timing chart for explaining the operation of the timing generator shown in FIG. 27.
Figure 29:
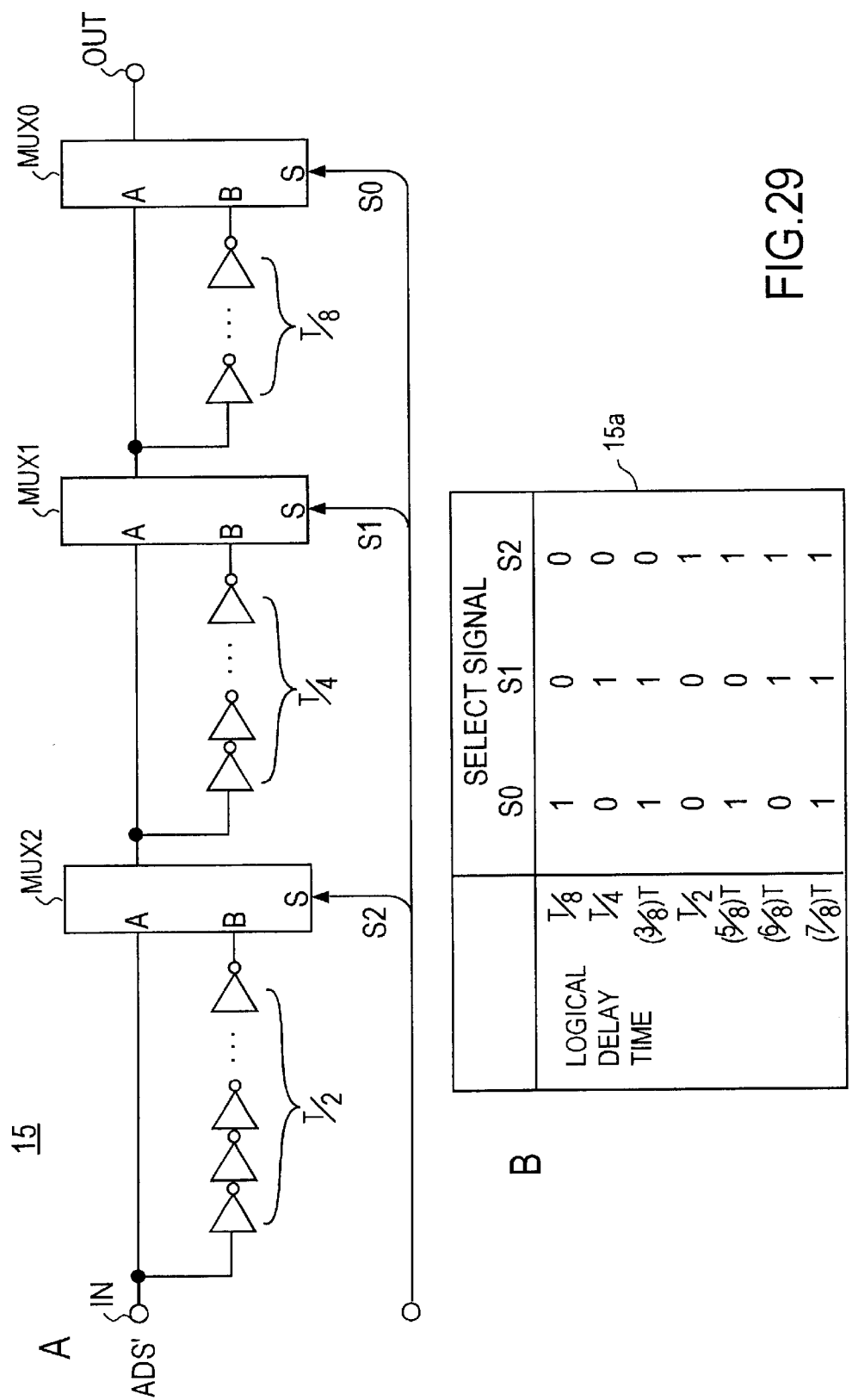
FIG. 29A is a circuit diagram showing a principle configuration of the variable delay circuit shown in FIG. 27.
FIG. 29B is a diagram showing an example of the data conversion table shown in FIG. 27.
Figure 30:
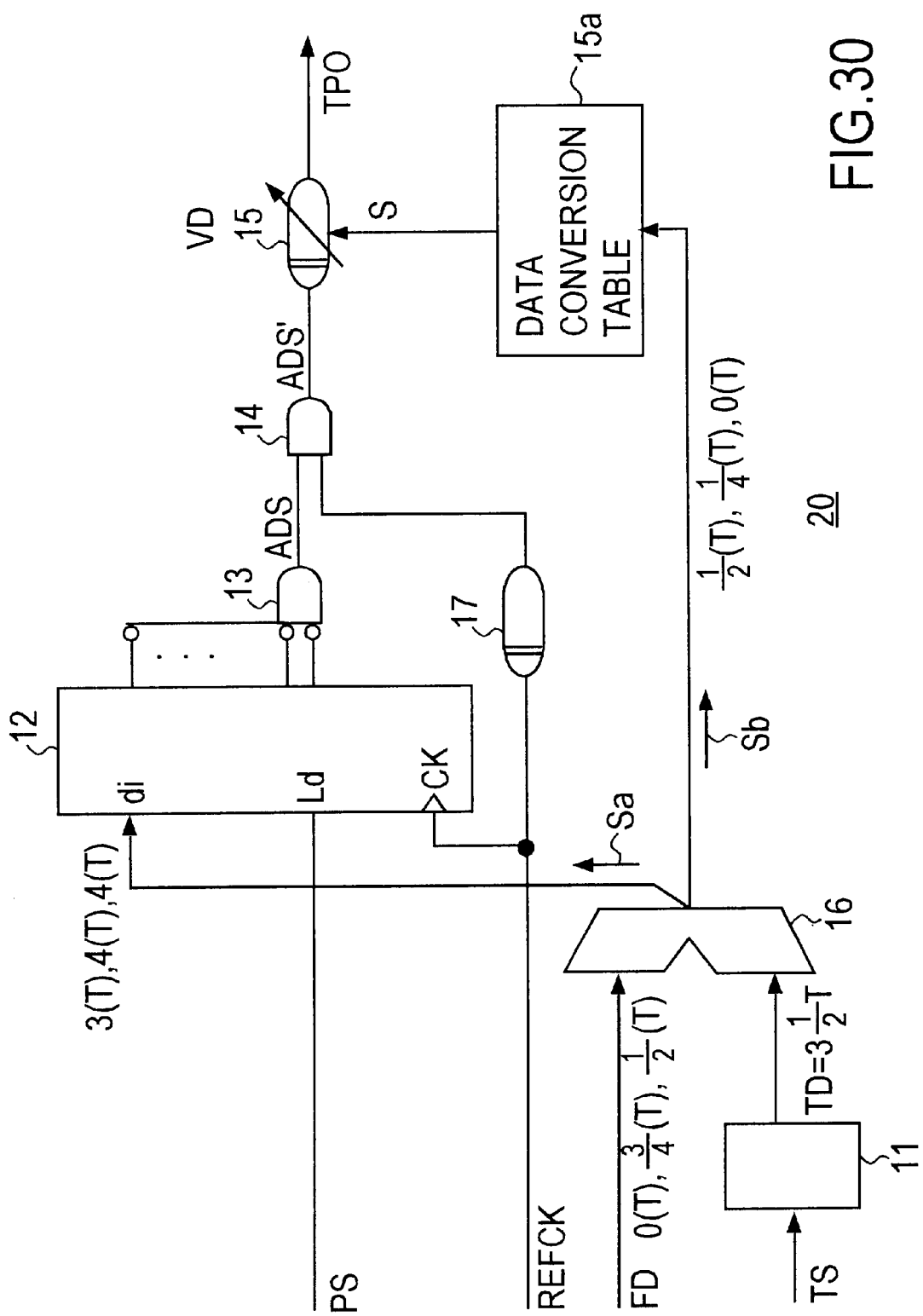
FIG. 30 is a block diagram showing another example of the timing generator shown in FIG. 26.
Figure 31:
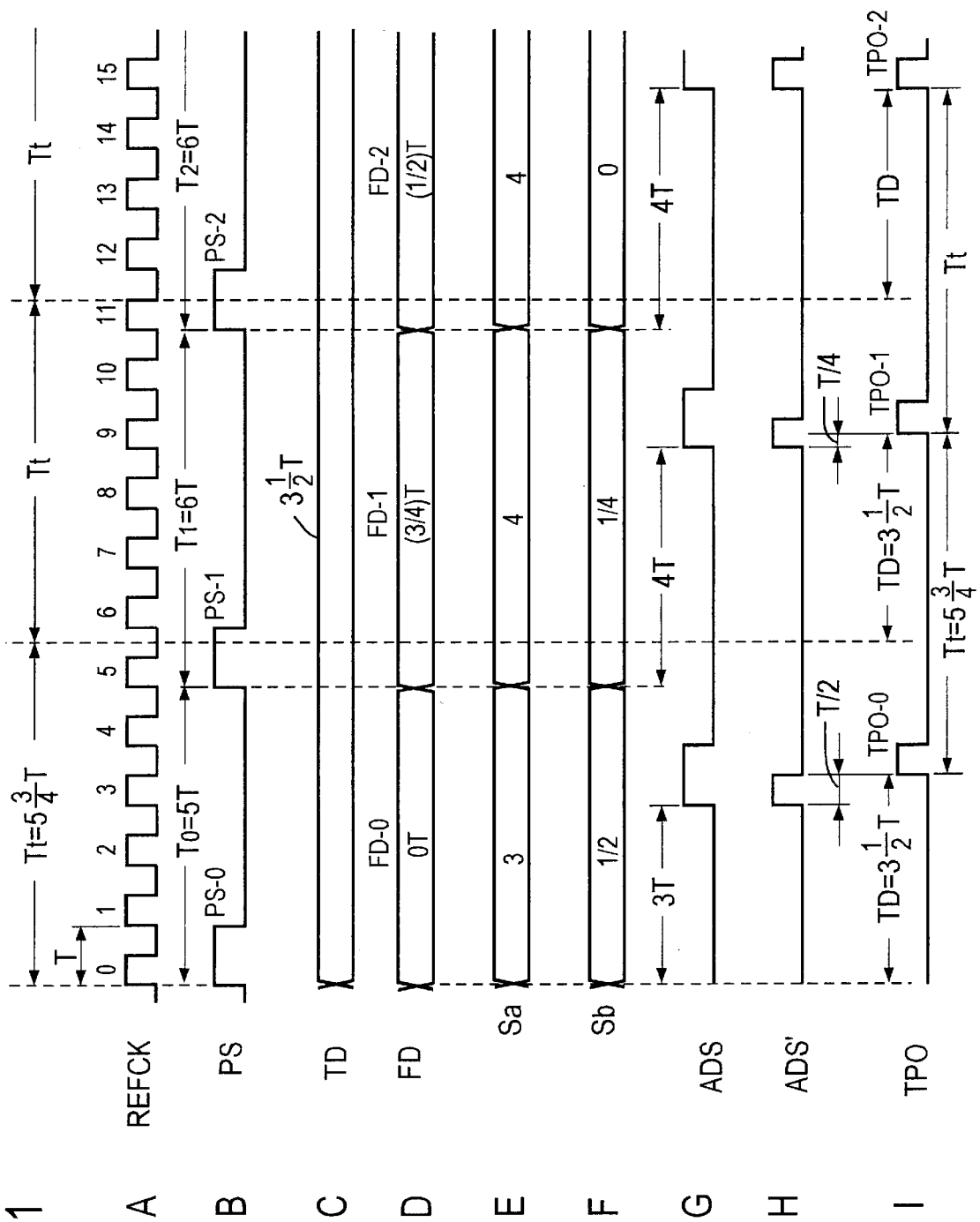
FIG. 31 is a timing chart for explaining the operation of the timing generator shown in FIG. 30.
Figure 32:
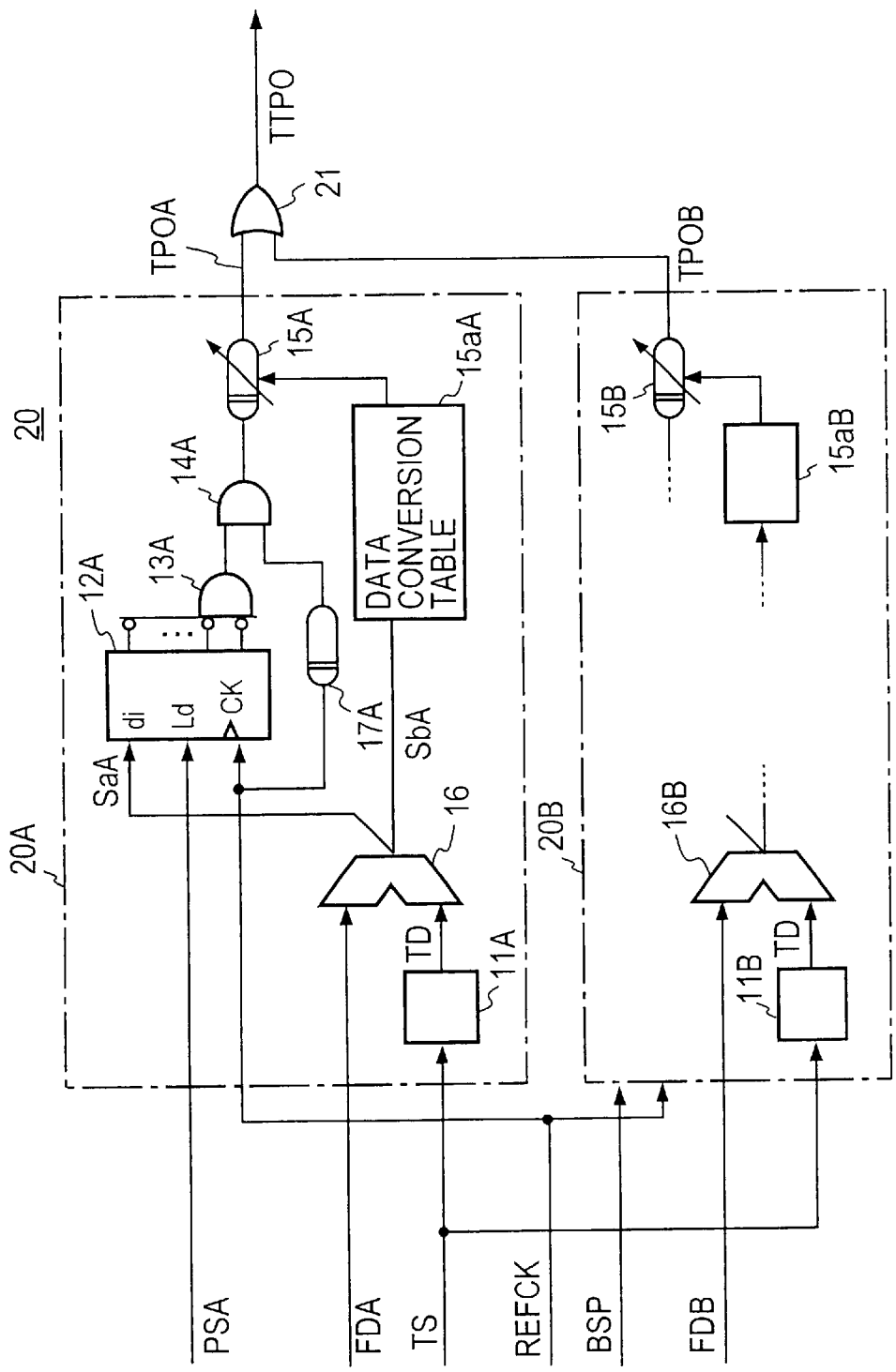
FIG. 32 is a block diagram showing a circuit configuration used in case that the timing generator shown in FIG. 26 adopts an interleave operation.
Figure 33:
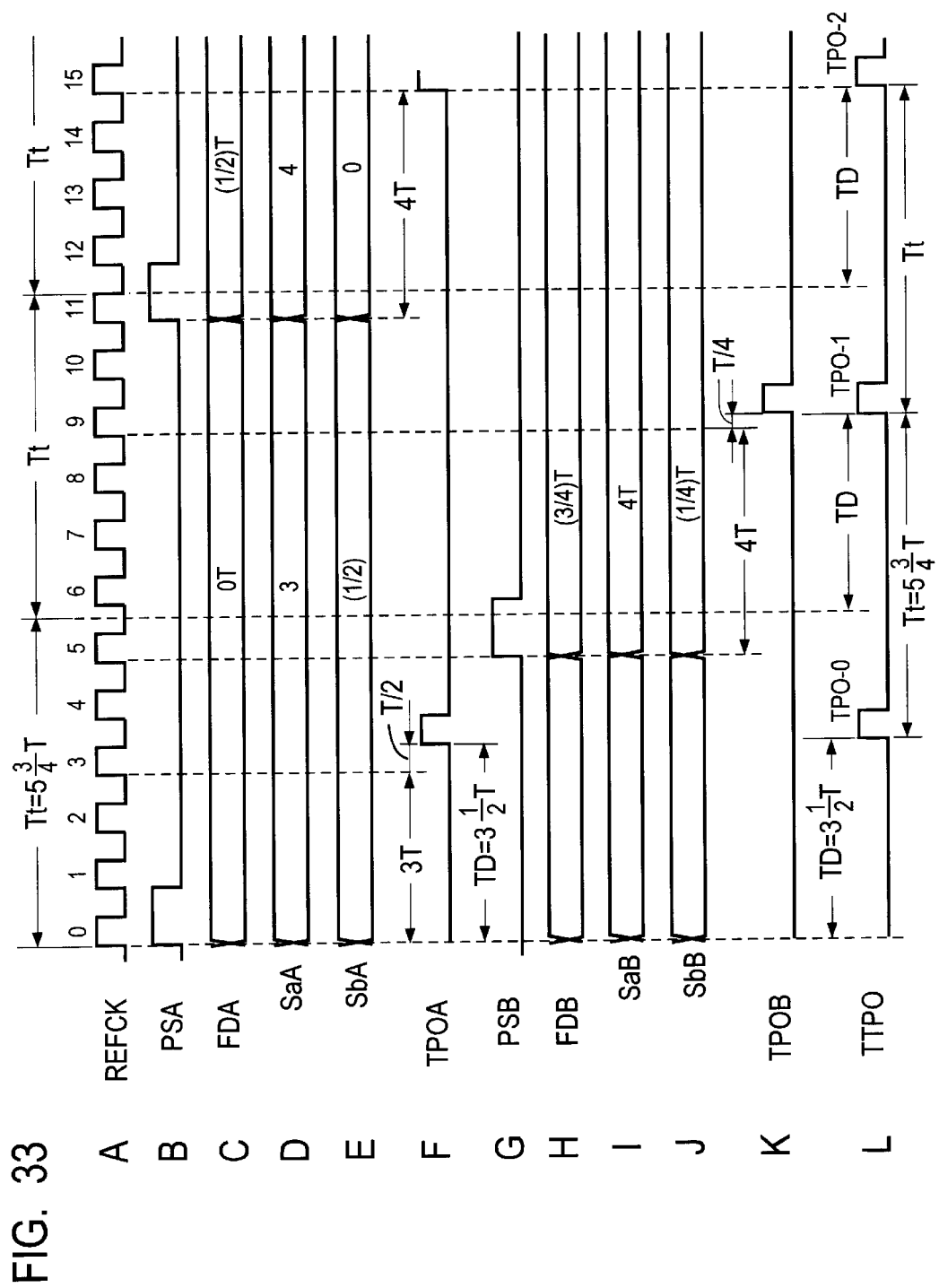
FIG. 33 is a timing chart for explaining the operation of the timing generator shown in FIG. 32.
Figure 34:
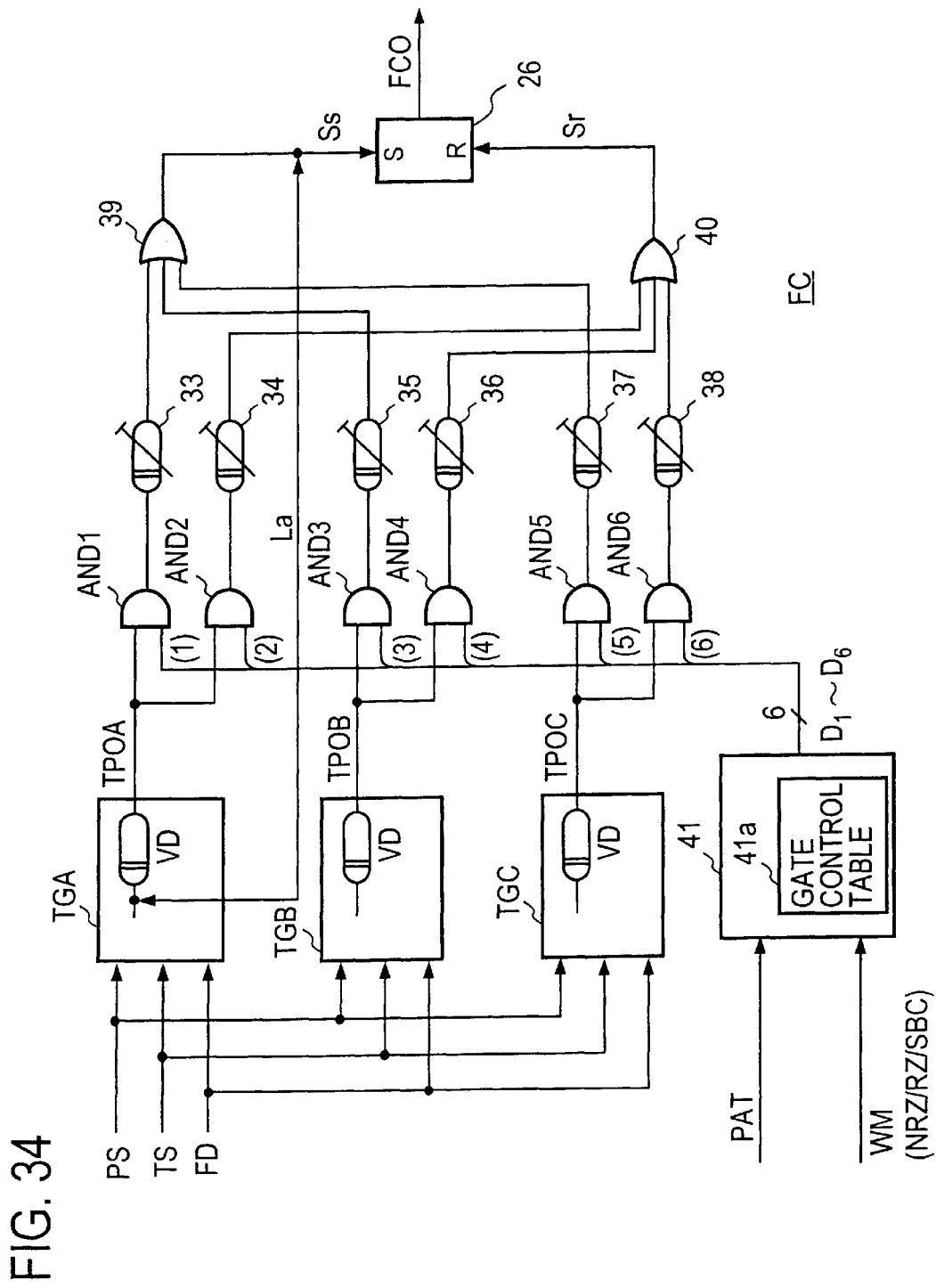
FIG. 34 is a block diagram showing an example of the prior art waveform generating apparatus capable of selecting one of NRZ, RZ, and SBC waveforms and generating it.
Figure 35:
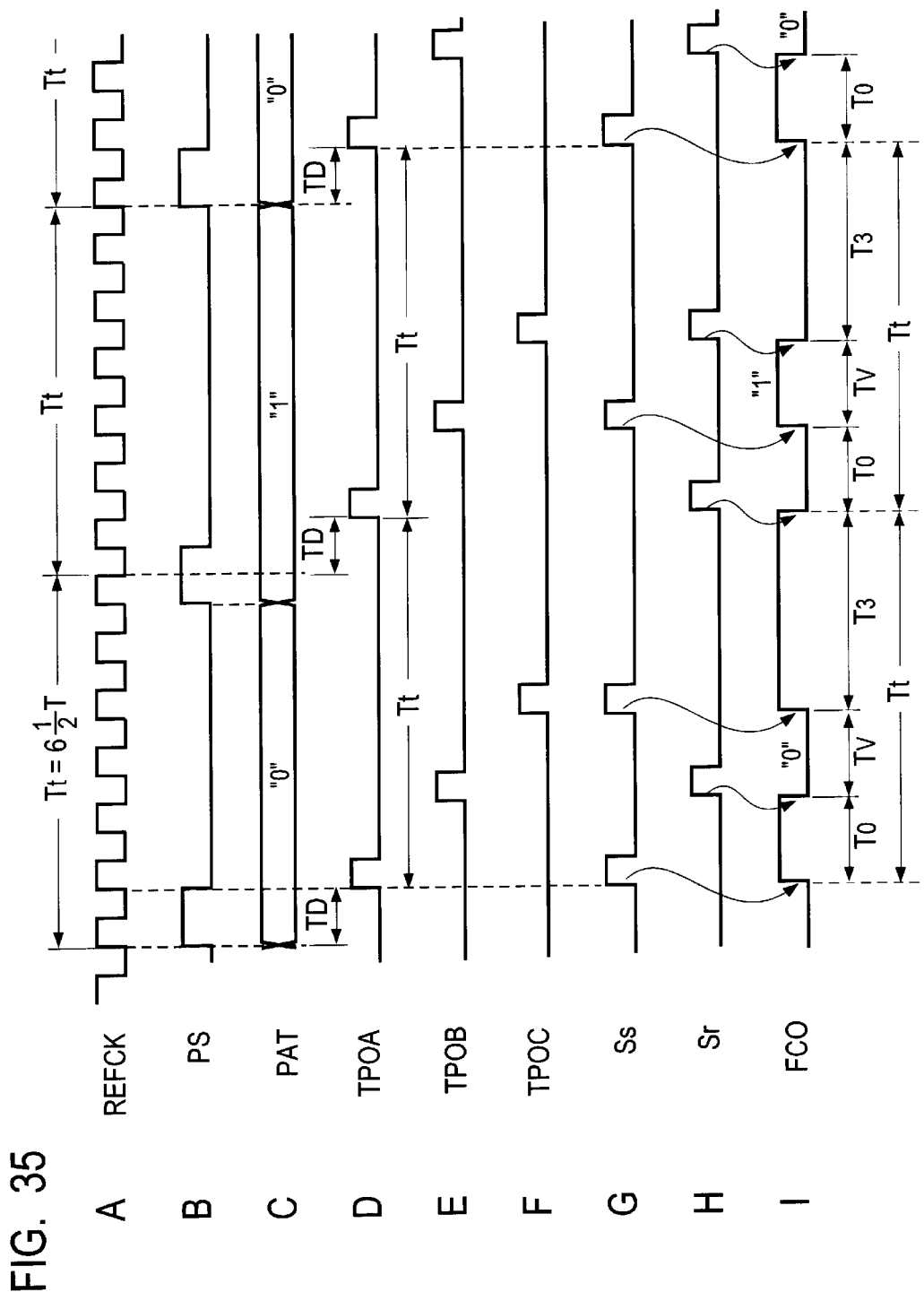
FIG. 35 is a timing chart for explaining the operation of the waveform generating apparatus shown in FIG. 34 in case that it generates an SBC waveform.

The S-R flip-flop 26 is set and reset by the set pulse and the reset pulse respectively supplied from the first and the second variable delay circuits 52 and 52' every test cycle, thereby to output a test pattern signal FCO having a desired waveform to be applied to the DUT 19 (refer to FIG. 26).

Waveform mode information, and select data corresponding to the test pattern data PAT for the current test cycle and for the previous test cycle are stored in the select data memory 46 of the delay data selecting circuit 45. When a waveform mode selecting signal WM is inputted to this select data memory 46, select data corresponding to the waveform mode information specified by the waveform mode selecting signal WM are supplied to the control terminal of the multiplexer 47.

The multiplexer 47 selects, out of the delay data TMA1/A2, TMB1/B2, TMC1/C2 supplied from the delay data memory 11, delay data for generating a set pulse and a reset pulse, which are selected by the select data from the select data memory 46, and a set pulse and a reset pulse effective flags included in the select data, i.e., enable signals. The operation of the multiplexer 47 in case that the NRZ waveform is specified is shown in the timing chart of FIG. 2A, and the operation of the multiplexer 47 in case that the SBC waveform is specified is shown in the timing chart of FIG. 2B. As is apparent from the timing chart of FIG. 2A, in case of the NRZ waveform, in the first half and the second or latter half of the test period signal Period, A1 and A2 are selected respectively as the delay data TD, and A1E and A2E are selected respectively as the set pulse and the reset pulse effective flags VFL, i.e., the enable signals. Similarly, as is apparent from the timing chart of FIG. 2B, in case of the SBC waveform, in the first half and the second or latter half of the test period signal Period, A1, C1 and B1, 0 are selected respectively as the set pulse delay data TD-S, and 1, 1 and 1, 0 are selected respectively as the set pulse effective flags VFL-S, i.e., the enable signals. Also, in the first half and the second or latter half of the test period signal Period, as the reset pulse delay data TD-R, B1, 0 and A1, C1 are selected respectively, and 1, 0 and 1, 1 are selected respectively as the reset pulse effective flags VFL-R, i.e., the enable signals.

In this manner, if the delay data are selected in the first half and the second half of the test period signal respectively, and also the set pulse and the reset pulse effective flags are selected in the first half and the second half of the test period signal respectively, it is possible that the waveform generating apparatus shown in FIG. 1 operates in speed-doubled mode or at double the speed in the normal mode.

Figure 4:
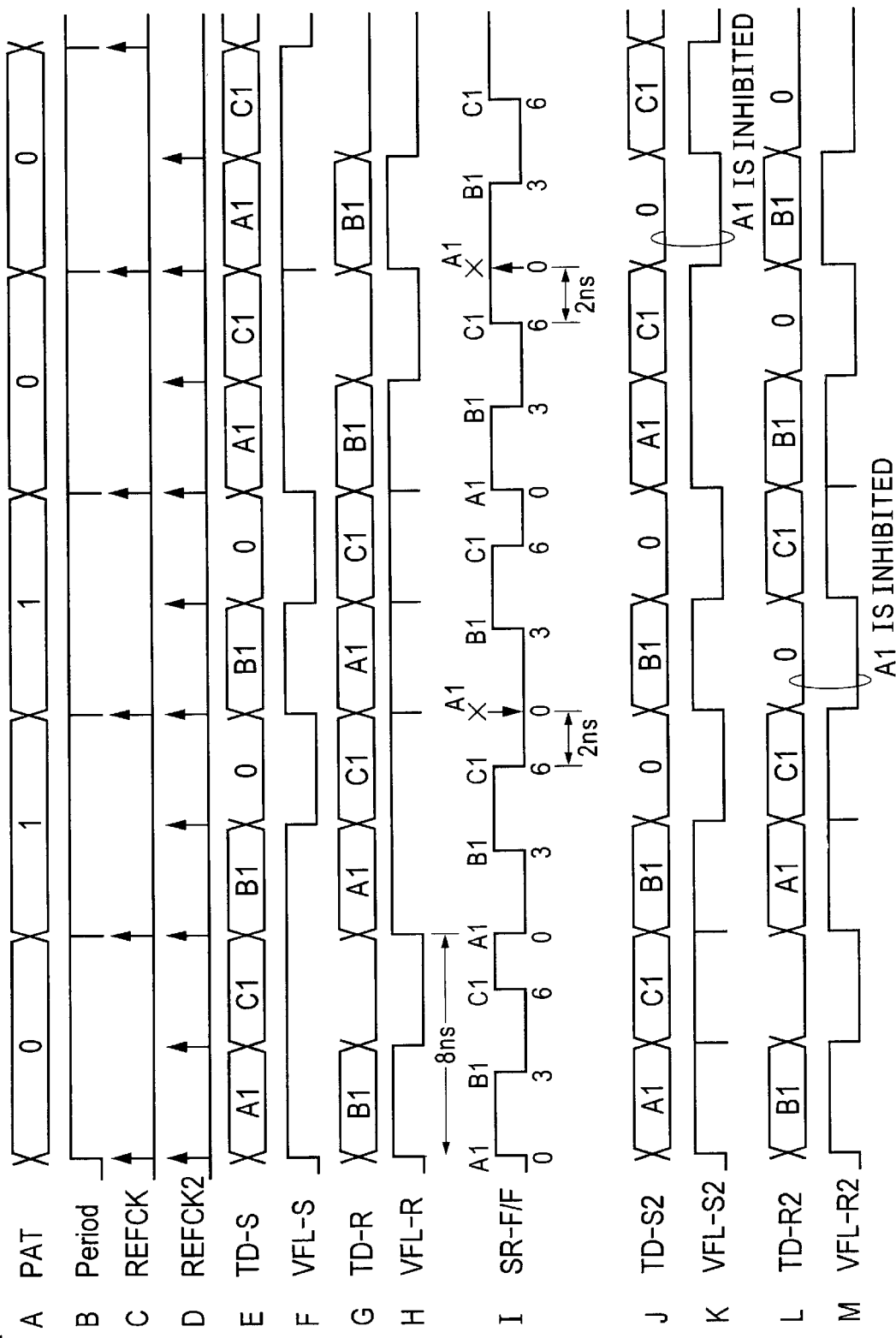
FIG. 4 is a timing chart for explaining the operation of the waveform generating apparatus shown in FIG. 1.

Select data are stored in the select data memory 46 such that in case that the logical value of the test pattern data PAT becomes a sequence of "0s" in adjacent test periods such as "0", "0" or a sequence of "1s" such as "1", "1" as shown in FIG. 3A, the select data inhibit a set pulse SPO and a reset pulse RPO shown in FIGS. 3F and 3G from being consecutively inputted to the S-R flip-flop 26 (shown by dotted arrows) respectively. The reason thereof is that if a delay time shorter than the period of the speed-doubled clock REFCK2 (=2CLK) as shown in FIG. 3C by a reference numeral 60 and in FIG. 3D by a reference numeral 61 is generated, the first and the second counter delay circuits 50 and 50' effect logically erroneous or abnormal operation (this is called a proximity error operation), respectively. For this reason, as in an example of the operation shown in FIG. 4, in case of the set pulse delay data TD-S and the reset pulse delay data TD-R respectively shown in FIGS. 4E and 4G as well as the set pulse effective flag (enable signal) VFL-S and the reset pulse effective flag (enable signal) VFL-R respectively shown in FIGS. 4F and 4H, a reset pulse and a set pulse respectively resulting from a reset pulse delay data A1 and a set pulse delay data A1 would be generated as shown in FIG. 4I. However, if the effective flags (enable signals) to be outputted from the select data memory 46 are outputted therefrom by making the portions thereof corresponding to the predetermined delay data A1 zero (0) such as VFL-S2 and VFL-R2 respectively shown in FIGS. 4K and 4M, the reset pulse and the set pulse due to the above delay data A1 can be inhibited from being outputted.

The first and the second counter delay circuits 50 and 50' add in their operation units ALU3 and ALU3', as mentioned above, the integer delay coefficient Sa supplied from the first operation circuit 49 and the output signal CNTD-A from the first counter CNT1 and the integer delay coefficient Ra supplied from the second operation circuit 49' and the output signal CNTD-A from the first counter CNT1, and generate a set pulse counter data coincidence expected value SE and a reset pulse counter data coincidence expected value RE to supply them to the delay stages 81 and 81', respectively. The delay stages 81 and 81' are constituted by a plurality of stages of delay circuits 81-1, 81-2, . . . 81-n and 81'-1, 81'-2, . . . , 81'-n connected in cascade (refer to FIG. 8), respectively. The delay stages 81 and 81' detect a coincidence between an inputted coincidence expected value SE and an output signal CNTD-B (a signal obtained by delaying the output signal CNTD-A of the counter CNT1) from the fifth D-type flip-flop DF5 and a coincidence between an inputted coincidence expected value RE and the output signal CNTD-B from the fifth D-type flip-flop DF5, and output two set pulse and two reset pulse effective flags Maj and MAj' (j=j'=1, . . . , n; n is the number of delay stages) at the most, respectively, and at the same time, output, on the basis of the inputted fraction delay coefficients Sb and Rb, a set pulse fraction delay data and a reset pulse fraction delay data Fj and Fj' (represent delay times corresponding to the fraction delay coefficients Sb and Rb) relating to the effective flags Maj and MAj', respectively.

There are provided control means for inhibiting the data (coincidence expected values) SE and RE as well as the fraction delay coefficients Sb and Rb from being loaded in the delay stages 81 and 81' of the first and the second counter delay circuits 50 and 50' respectively in case that an open flag "open" for inhibiting a pulse from being outputted has been given to the delay data supplied from the delay data memories 11 to the multiplexer 47, and in case that the set pulse or the reset pulse effective flag (enable signal) is not present in the select data SD supplied from the select data memory 46 to the multiplexer 47. Specifically, AND gates AND100 and AND200 shown in FIG. 7 correspond to the aforementioned control means.

With the construction described above, a set pulse and a reset pulse are inhibited from being generated from the first and the second counter delay circuits 50 and 50'. As a result, it is possible to change the time duration of H level and the time duration of L level of a waveform, and hence various waveforms can be obtained.

Figure 5:
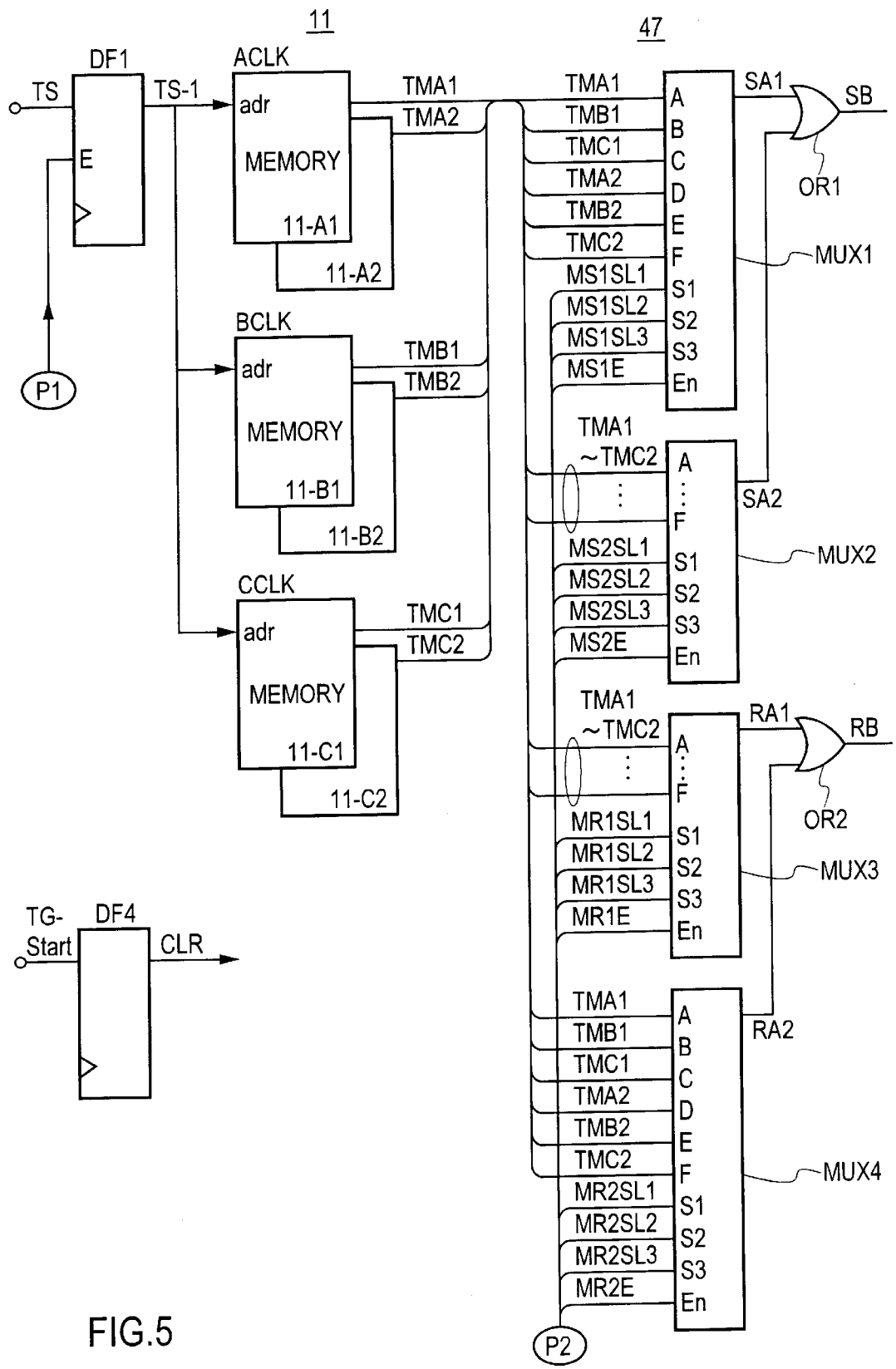
FIG. 5 is a block diagram showing specified circuit configurations of, mainly, the delay data memories and the multiplexers of the waveform generating apparatus shown in FIG. 1.
Figure 6:
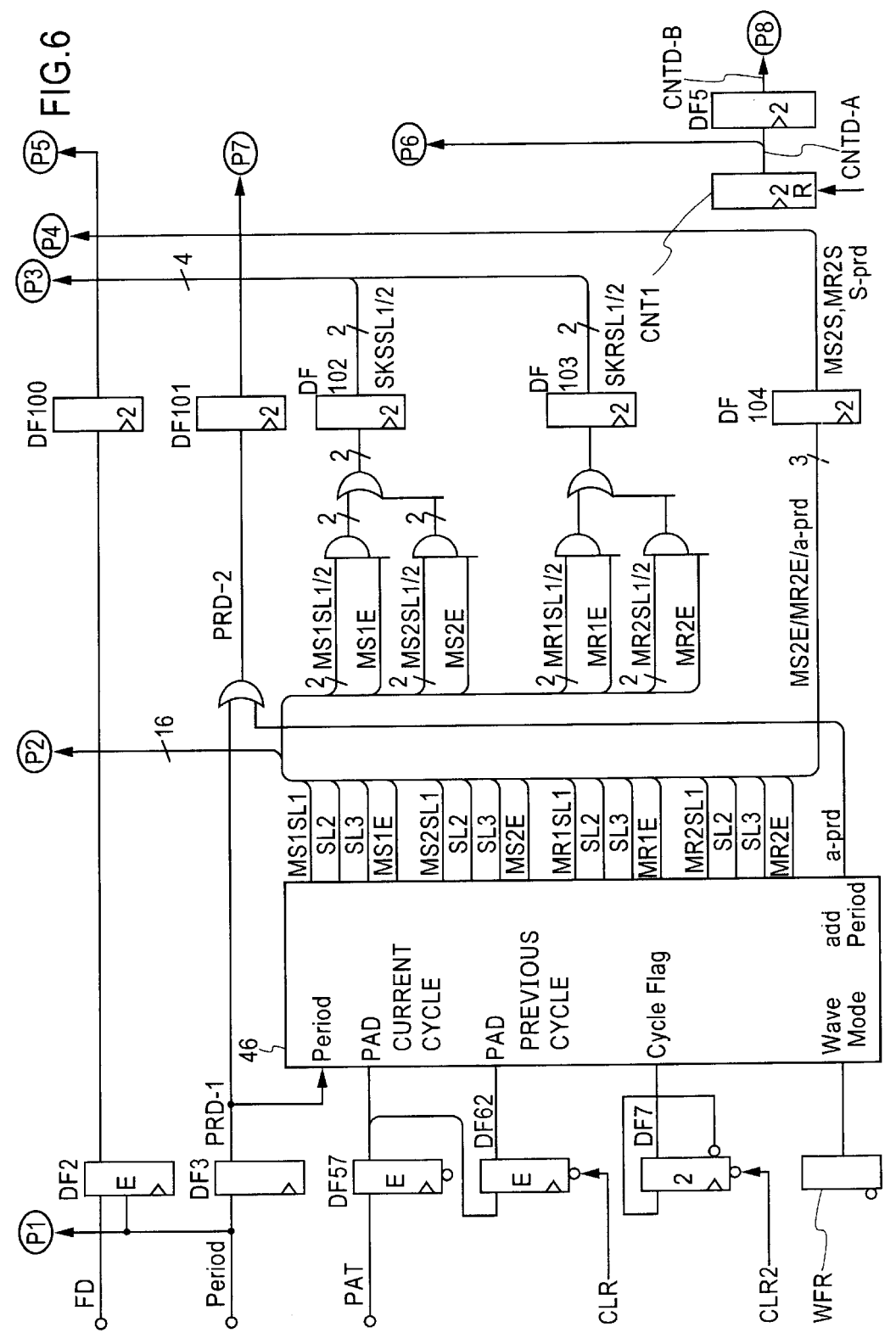
Figure 7:
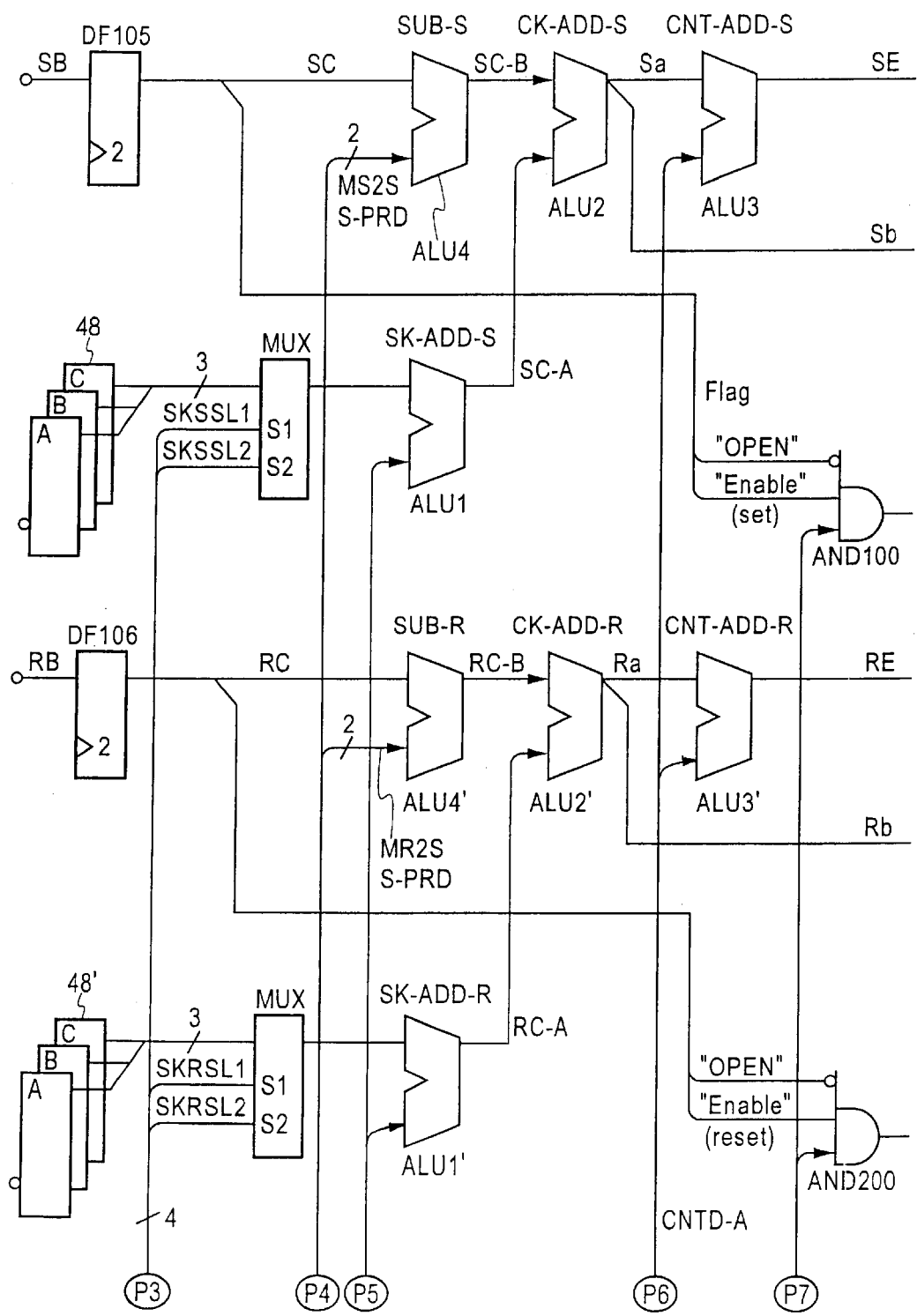
FIG. 7 is a block diagram showing specified circuit configurations of, mainly, the skew register and the operation circuit of the waveform generating apparatus shown in FIG. 1.
Figure 8:
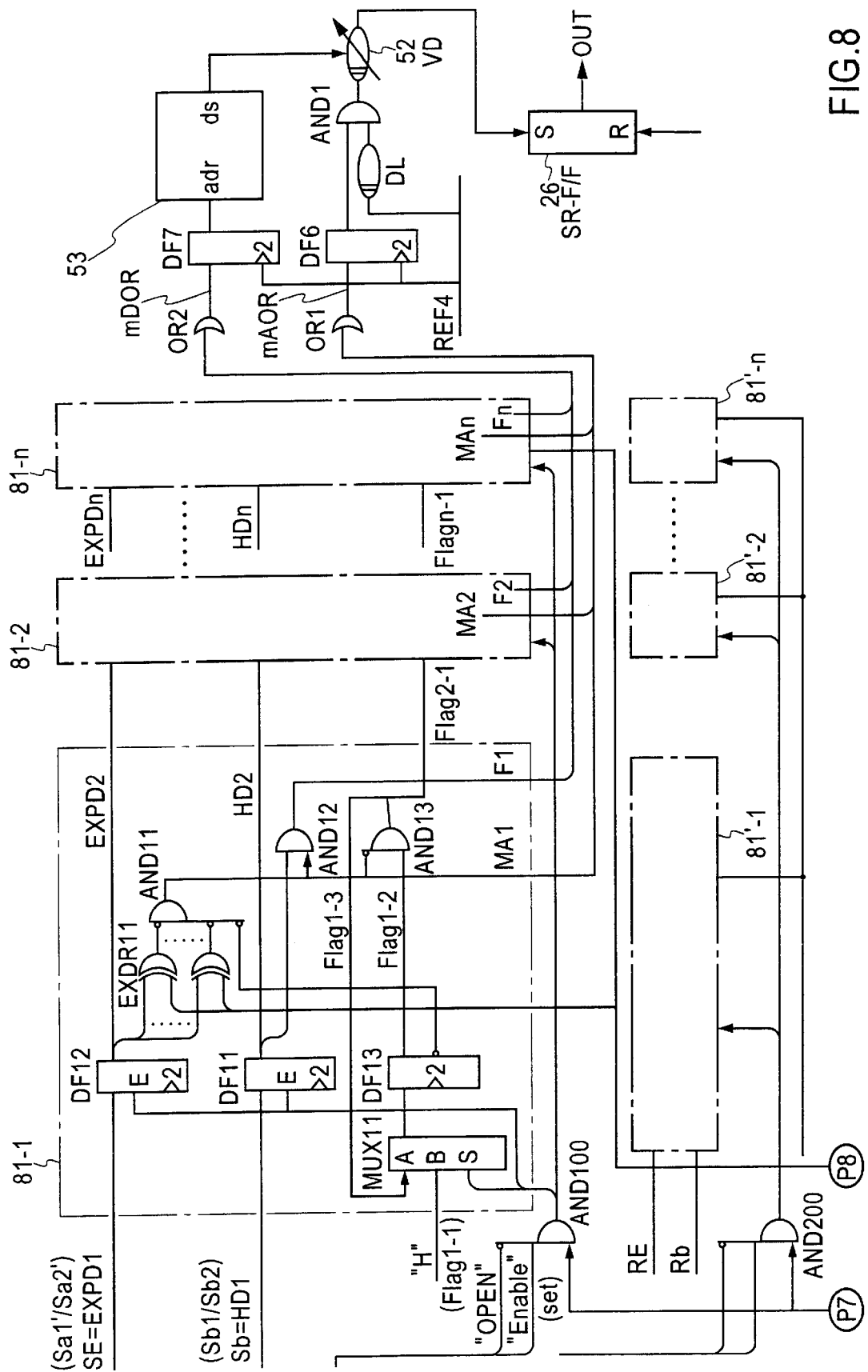
FIG. 8 is a block diagram showing a specified circuit configuration of, mainly, the delay stage in the counter delay circuit of the waveform generating apparatus shown in FIG. 1.

An example of the specified circuit configuration of the waveform generating apparatus shown in FIG. 1 is shown in FIGS. 5 to 8. FIG. 5 shows specified circuit configurations of, mainly, the delay data memories 11 and the multiplexers 47, FIG. 6 shows a specified circuit configuration of, mainly, the select data memory 46, FIG. 7 shows specified circuit configurations of, mainly, the first and the second skew registers 48 and 48' and the first and the second operation circuits 49 and 49', and FIG. 8 shows specified circuit configurations of, mainly, the first and the second counter delay circuits 50 and 50'. Further, in these drawings, DF denotes a D-type flip-flop, OR denotes an OR gate, WFR denotes a waveform information register, MUX denotes a multiplexer, ALU denotes an operation circuit, AND denotes an AND gate, EXOR denotes an exclusive OR gate, and DL denotes a delay circuit.

In addition, FIG. 9 shows an example of the corresponding relationship between select data S1, S2, S3, En (enable signal) respectively supplied to the multiplexers MUX1 to MUX4 shown in FIG. 5 and delay data (output data) selected by these multiplexers MUX1 to MUX4 on the basis of the select data. Moreover, a corresponding relationship between an example of data stored in the select data memory (event conversion table) 46 shown in FIG. 6, and set pulse delay data SA1, SA2 and reset pulse delay data RA1, RA2 outputted by the multiplexer 47 (MUX1 to MUX4) shown in FIG. 5 on the basis of these data is shown in FIG. 10 in case of the normal operation speed mode, and is shown in FIG. 11 in case of the operation speed-doubled mode.

The output signal Sa of a second summing circuit ALU2 of the first operation circuit 49 shown in FIG. 7 is an integer delay coefficient outputted from the first operation circuit 49, and the output signal Sb of the second summing circuit ALU2 is a fraction delay coefficient outputted from the first operation circuit 49. Similarly, the output signal Ra of a second summing circuit ALU2' of the second operation circuit 49' is an integer delay coefficient, and the output signal Rb thereof is a fraction delay coefficient. In addition, a summed output SE of a third operation unit ALU3 is SE=Sa+CNTD-A, and this summed output SE becomes a coincidence expected value which is compared with the counter data CNTD-B in each stage of the delay stages 81-1, 81-2, ... 81-n of the first counter delay circuit 50 shown in FIG. 8. This counter data CNTD-B is supplied from the D-type flip-flop DF5 shown in FIG. 6. As to a summed output RE of a third operation unit ALU3' relating to a reset pulse, the same result as in the summed output SE relating to a set pulse can be obtained.

Output signals SKSSL1 and SKSSL2 of a D-type flip-flop DF102 shown in FIG. 6 are signals for selecting skew data corresponding to the set pulse delay data TMA, TMB and TMC respectively. In addition, output signals SKRSL1 and SKRSL2 of a D-type flip-flop DF103 are signal for selecting skew data corresponding to the reset pulse delay data TMA, TMB and TMC respectively.

In case of generating an SBC waveform in the normal operation speed mode or in case of generating an NRZ/RZ/SBC waveform in the operation speed-doubled mode, a load delay of one cycle occurs in each of the delay stages 81 and 81' correspondingly to each of the delay data SA2 and RA2 outputted from the multiplexer 47. The main reason that operation units ALU4 and ALU4' are added in FIG. 7 is to obtain expected values each being subtracted by the amount of the load delay (that is, expected values each of which is small by one count).

Figure 12:
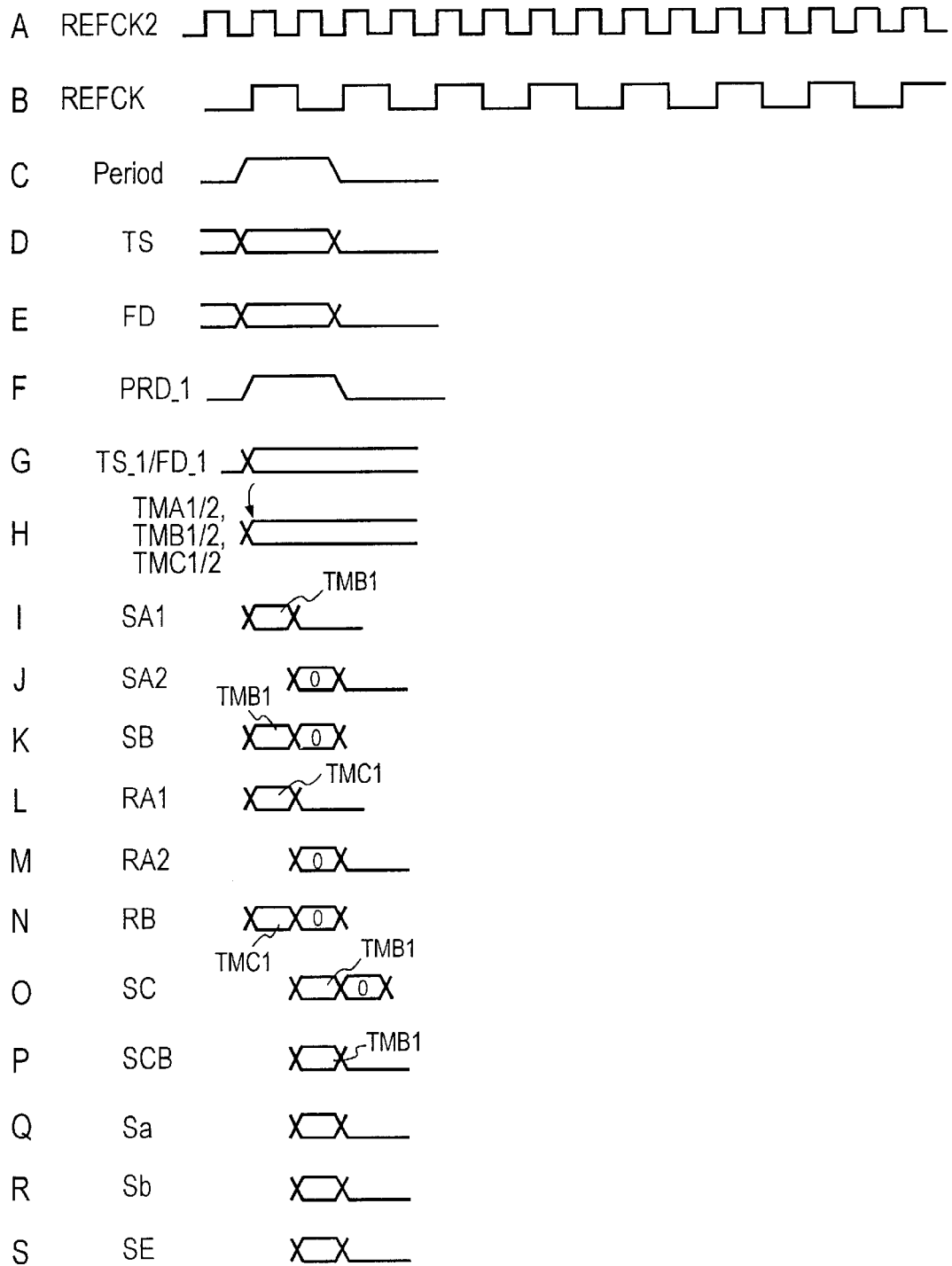
FIG. 12 is a timing chart in case that the waveform generating apparatus shown in FIGS. 5 to 8 generates an NRZ/RZ waveform in the normal operation speed mode.
Figure 13:
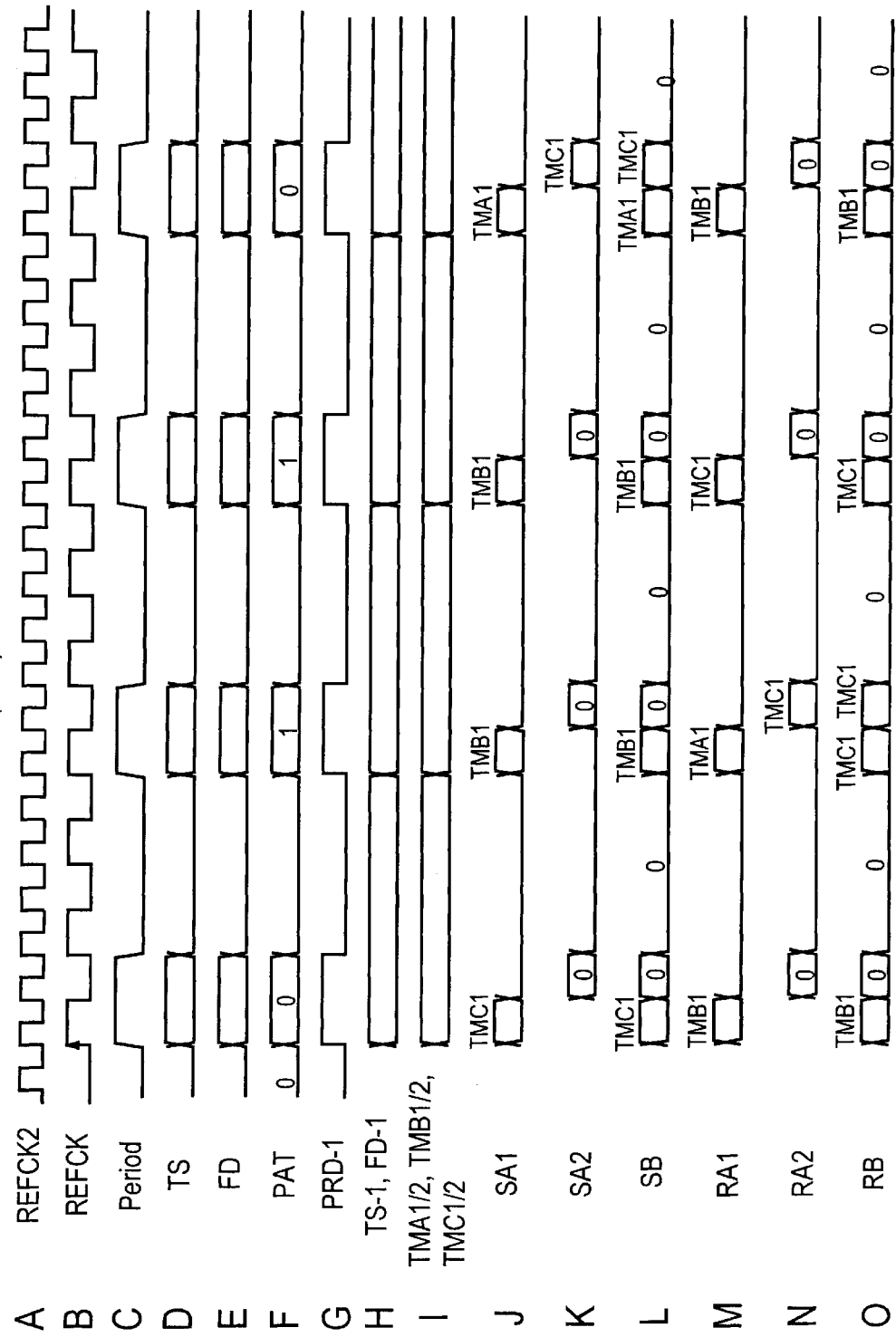
FIG. 13 is a timing chart in case that the waveform generating apparatus shown in FIGS. 5 to 8 generates an SBC waveform in the normal operation speed mode.
Figure 14:
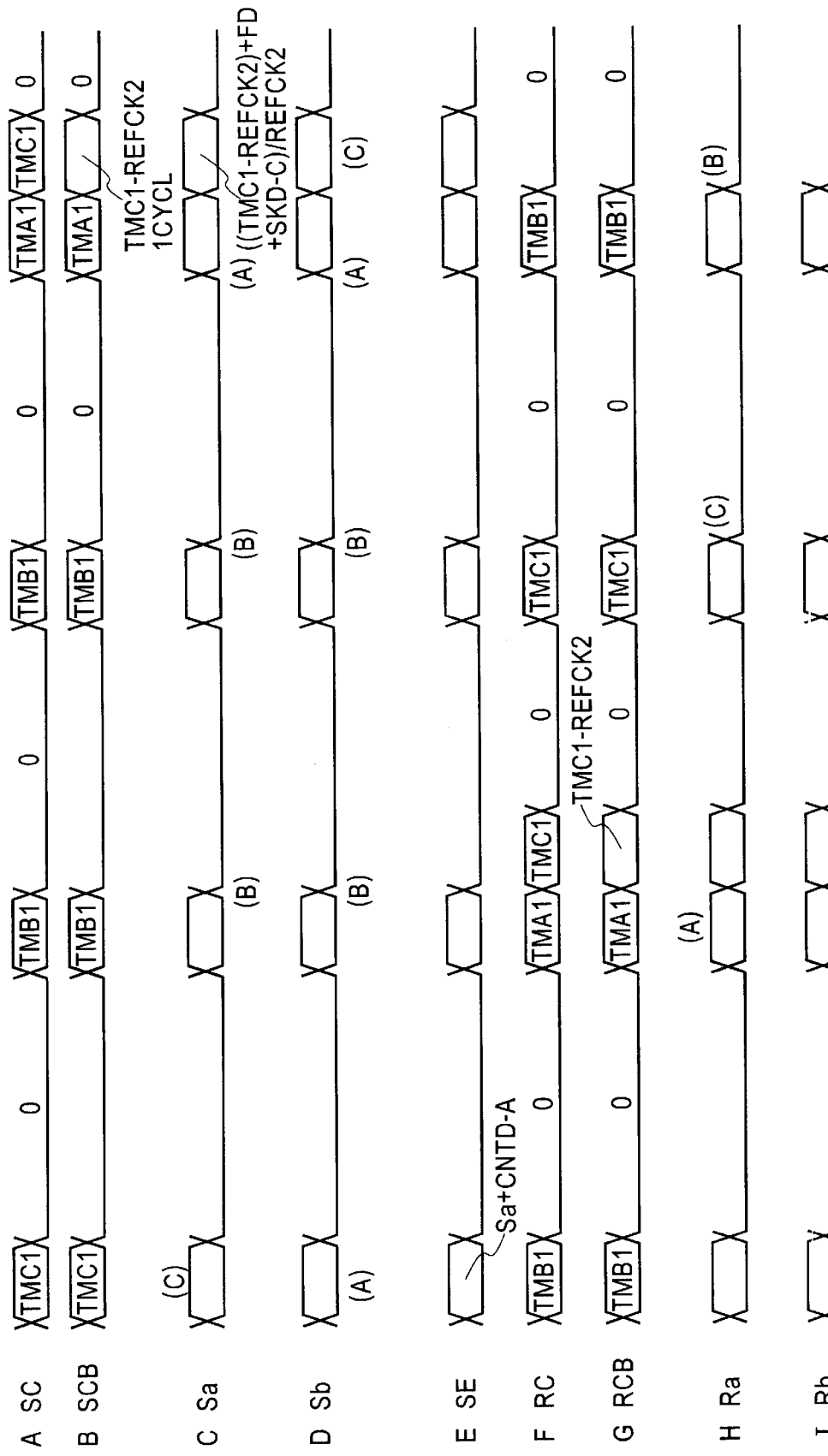
FIG. 14 is a timing chart continued from the timing chart of FIG. 13.

In the waveform generating apparatus having the specified circuit configurations shown in FIGS. 5 to 8, a timing chart up to the inputs of the delay stages 81 and 81' in case that a test pattern signal having an NRZ/RZ waveform is outputted from the S-R flip-flop 26 in the normal operation speed mode is shown in FIG. 12. In addition, a timing chart up to the inputs of the delay stages 81 and 81' in case that a test pattern signal having an SBC waveform is outputted from the S-R flip-flop 26 in the normal operation speed mode is shown in FIGS. 13 and 14.

Figure 15:
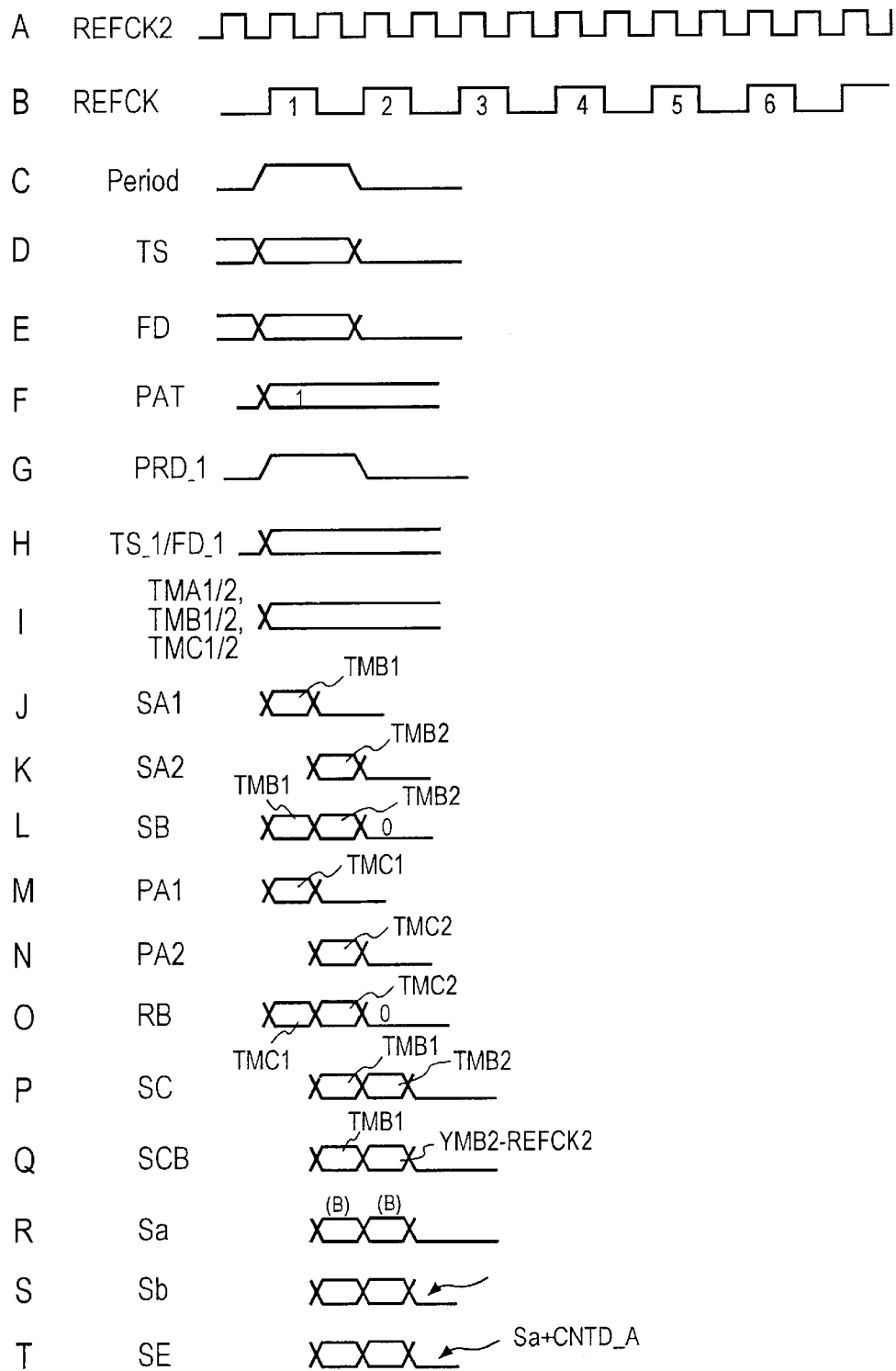
FIG. 15 is a timing chart in case that the waveform generating apparatus shown in FIGS. 5 to 8 generates an NRZ/RZ waveform in the operation speed-doubled mode.
Figure 16:
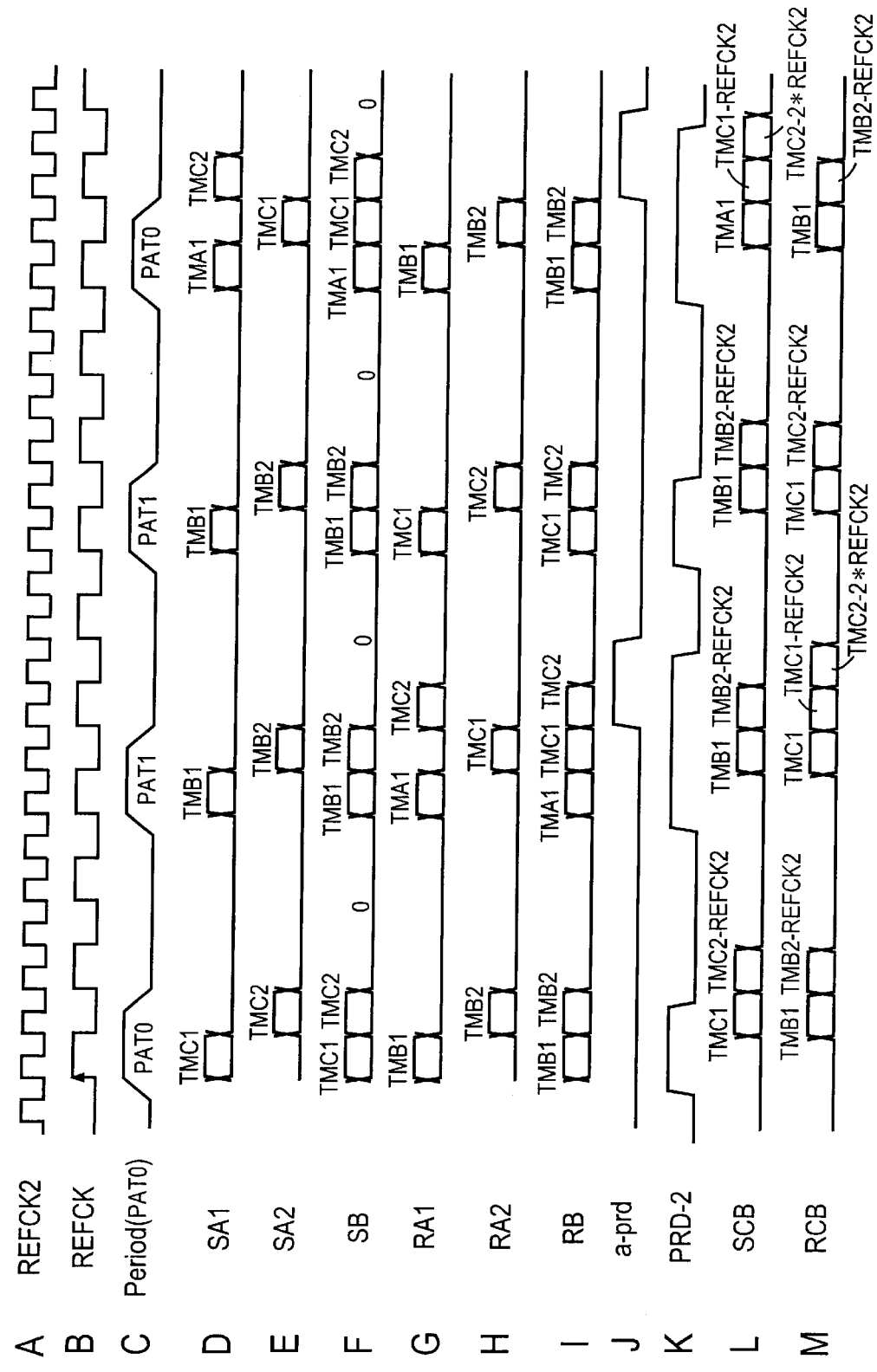
FIG. 16 is a timing chart in case that the waveform generating apparatus shown in FIGS. 5 to 8 generates an SBC waveform in the operation speed-doubled mode.

Moreover, in the waveform generating apparatus having the specified circuit configurations shown in FIGS. 5 to 8, a timing chart up to the inputs of the delay stages 81 and 81' in case that a test pattern signal having an NRZ/RZ waveform is outputted and a timing chart up to the inputs of the delay stages 81 and 81' in case that a test pattern signal having an SBC waveform is outputted, respectively, from the S-R flip-flop 26 in the operation speed-doubled mode are shown in FIGS. 15 and 16 respectively. In case of the timing chart for the SBC waveform shown in FIG. 16, the minimum interval from a rise edge of a test period signal Period to a rise edge of the next test period signal. Period is set to a time duration of 2×(period of REFCK).

Heretofore, in order to producing a timing pulse TPO in the timing generator, there have been many cases that a delay time TD given to a test period signal Period (PS) is shorter than one test period Tt. In recent years, as a test cycle is made short less and less to attain a high speed test cycle, it has become difficult and unpractical to restrict the aforesaid delay time TD given to a test period signal within one test period Tt. In view of such circumstances, in the waveform generating apparatus having the specified circuit configurations shown in FIGS. 5 to 8, the delay stages 81 and 81' have the first stage to the n-th stage provided therein respectively so that each of the delay stages 81 and 81' can delay a test period signal up to n test cycles in case of the normal operation speed mode and up to n/2 test cycles in case of the operation speed-doubled mode.

Figure 17:
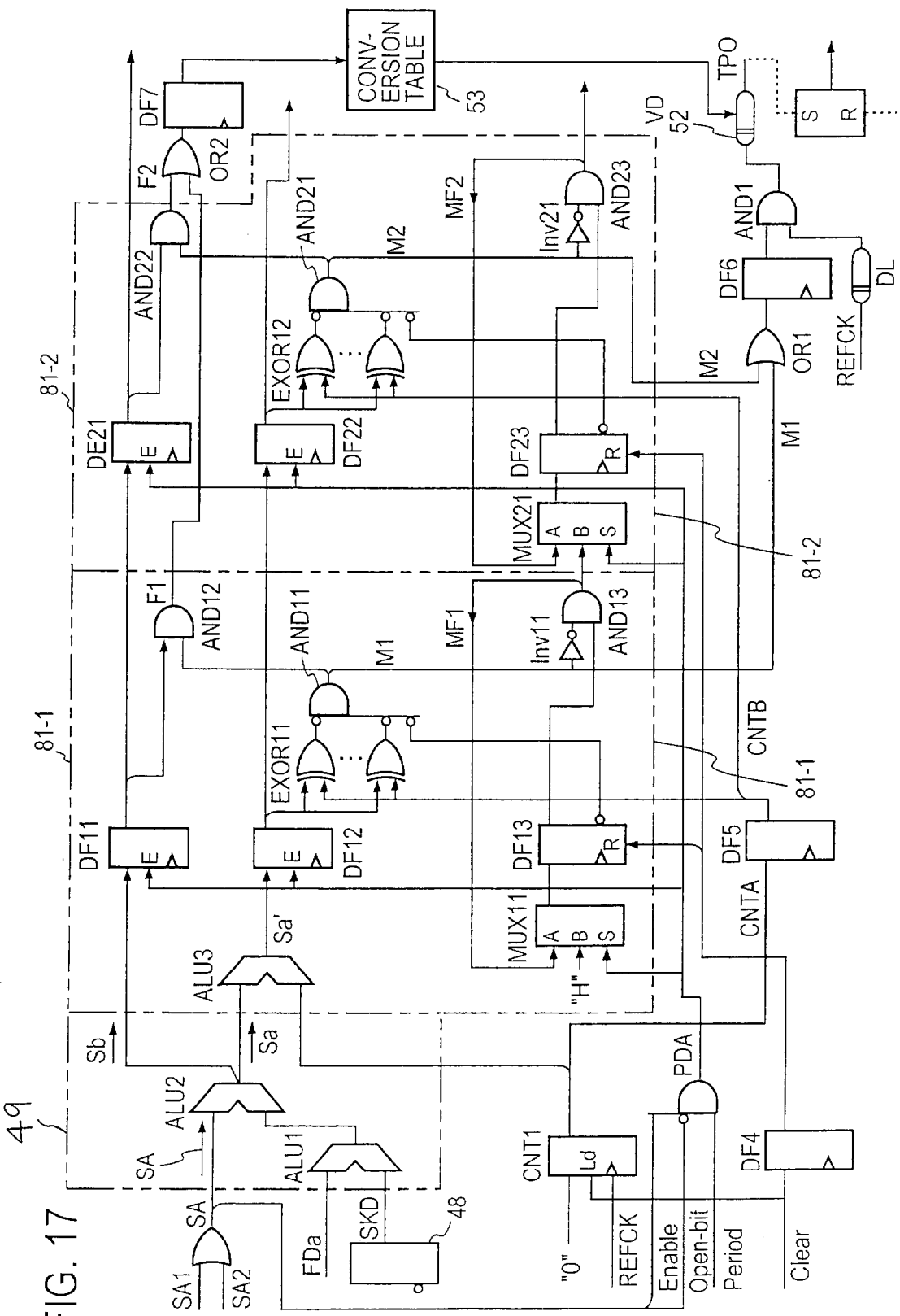
FIG. 17 is a block diagram showing a basic circuit of the waveform generating apparatus shown in FIGS. 5 to 8 in the normal operation speed mode.

FIG. 17 is a block diagram showing a basic circuit of the waveform generating apparatus in which the number of steps of the delay stage 81 is set to two steps (n=2) in the specified circuit configurations shown in FIGS. 5 to 8, and shows a case that it operates at the normal speed. Though only the circuitry relating to the set pulse is shown in FIG. 17, the circuitry relating to the reset pulse has the same configuration as that of the set pulse circuitry. Now, the operation of the set pulse circuitry will be described.

(1) A delay data SA (SA1/SA2) is supplied to one input terminal of the operation unit ALU2 of the operation circuit 49.

(2) "0" is loaded in the counter CNT1 by a clear signal (Clear) outputted at the starting time of a test, and thereafter, the counter CNT1 continues to carry out the usual increment operation.

(3) A D-type flip-flop DF4 performs a retiming of the clear signal outputted at the starting time of the test to clear D-type flip-flops DF13 and DF23 relating to a generation confirmation flag to be described later.

(4) The operation unit ALU2 adds an output SA of an OR gate (delay data selecting circuit) and an operated output SKD+FDa (a summed output of a skew data SKD from the skew register 48 and a fraction data FDa from the operation unit ALU1.

(5) The operation unit ALU3 of the counter delay circuit 50 sums an integer delay data Sa in the operation result SA+SKD+FDa outputted from the operation unit ALU2 and an output data CNTA of the counter CNT1 which continues to count up, the integer delay data Sa corresponding to the reference clock period multiplied by the integer.

(6) A D-type flip-flop DF11 latches, in a cycle that the D-type flip-flop DF11 has been enabled by the test period signal Period, a fraction delay data Sb shorter than the reference clock period in the result of the operation SA+SKD+FDa outputted from the operation unit ALU2, and a D-type flip-flop DF12 latches, in a cycle that the D-type flip-flop DF12 has been enabled by the test period signal Period, the result of the operation Sa'=Sa+CONTA outputted from the operation unit ALU3.

(7) In a multiplexer MUX11, when the test period signal Period is inputted thereto, the multiplexer MUX11 takes therein a fixed "H" signal at B input thereof, and in other cases, it selects A input thereof. The D-type flip-flop DF13 acquires the output signal from the multiplexer MUX11 at every reference clock. In a loop of the multiplexer MUX11→the D-type flip-flop DF13→an AND gate AND13→the multiplexer MUX11, when the counter data CNTB outputted from the D-type flip-flop DF5 coincides with a summed value of the integer delay data Sa and an output data CNTA from the counter CNT1, an output signal M1 from an AND gate AND 11 disables the AND gate 13 in the loop where the "H" signal has been taken therein so that the "H" signal is inhibited from passing through the AND gate 13, and an signal outputted from that loop is made an "L" signal. The loop uses the signal "H" taken therein as a flag indicating that the summed value does not coincide with the counter data CNTB yet, so that the flag can control to prevent the second coincidence pulse from being generated even if the count data of the counter CNT1 goes through the loop once more before a new "H" signal is taken in the loop by the next test period signal Period inputted thereto as well as to prevent the second coincidence pulse from being generated in the next stage including the multiplexer MUX21 and in the subsequent stages thereto.

(8) An output of the D-type flip-flop DF12 is sent to a D-type flip-flop DF22 of the next delay stage 81-2, and in addition, is sent to a circuit for detecting a coincidence between it and the counter data CNTB through exclusive OR gates EXOR11.

(9) When data of the D-type flip-flop DF12 in which the summed result (an operation output Sa' of the operation unit ALU3) of the integer delay data Sa and the counted value CNTA of the counter CNT1 has been latched accords with data of the D-type flip-flop DF5 in which the counted value CNTA of the counter CNT1 has been latched, all of the outputs of the exclusive OR gates EXOR become logical "Ls".

(10) When all of the outputs of the exclusive OR gates EXOR11 become logical "Ls", the AND gate AND11 makes its output M1 logical "H" after it ascertains that a coincidence completion flag from an inverted output $\overline{Q}$ of the D-type flip-flop DF13 is logical "L". That is, the AND gate AND11 ascertains that all of the input signals thereto have not already accorded with logical "L", and when all of the outputs of the exclusive OR gates EXOR11 come to logical "Ls" and the coincidence completion flag is a logical "L", the AND gate AND11 makes its output M1 logical "H".

(11) When the output signal M1 of the AND gate AND11 becomes logical "H", this logical "H" functions as follows:
(a) the logical "H" is latched in a D-type flip-flop DF6 through the OR gate OR1 as a delay pulse start signal;
(b) the logical "H" makes an AND gate AND12 its enable state, and the fraction data Sb which has been inhibited from passing through the AND gate AND12 is outputted therefrom as an output signal F1 which is latched in a D-type flip-flop DF7 through an OR gate OR2 as an additional delay data of the variable delay circuit 52;
(c) the logical "H" makes the AND gate AND13 its disable state through an inverter Inv11, thereby to make the output signal MF1 which is the coincidence completion flag logical "L" so that the loop comes to coincidence-completed state; and
(d) the logical "H" is given to the multiplexer MUX21 as a flag (Flag) indicating whether that loop has been coincidence-completed state ("L") or not in the cycle of the previous test period signal Period when the next test period signal Period is inputted to the multiplexer MUX21. In case that the loop has not been coincidence-completed state ("H"), the coincidence completion flag is awaited in the second cycle by the second delay stage 81-2.

(12) The operation of the second delay stage 81-2 is entirely the same as those described in the above items (6) through (11) except for the operation of the multiplexer MUX21 described in the above item (d).

(13) The delay pulse start signal latched in the D-type flip-flop DF6 is strobed by the reference clock REFCK in the AND gate AND1, and this strobed pulse signal is supplied to the variable delay circuit 52. At this time, since the fraction delay data latched in the D-type flip-flop DF7 is supplied to the variable delay circuit 52, the pulse signal inputted into the variable delay circuit 52 is delayed by a delay time corresponding to the fraction delay data, and is outputted as a timing pulse TPO.

Further, the operation units ALU1 and ALU2 shown in FIG. 17 constitute the first operation circuit 49. The first and the second delay stages 81-1 and 81-2 constitute a coincidence detection circuit for an integer delay data and a fraction delay data acquisition circuit in the first and the second test cycles, respectively.

The first delay stage 81-1 compares the output CNTA of the counter CNT1 with the integer delay data Sa in the output Sa' of the operation unit ALU3 to perform a coincidence detection in the first test cycle, and outputs a detection pulse M1. Similarly to the first delay stage, the second delay stage 81-2 also performs a coincidence detection in the second test cycle, and outputs a detection pulse M2.

In addition, the first delay stage 81-1 and the second delay stage 81-2 acquire data F1 and F2 each corresponding to the fraction delay data Sb in the output of the operation circuit 49 in synchronism with the detection outputs M1 and M2 respectively to supply the detection data to the control terminal of the variable delay circuit 52.

Figure 18:
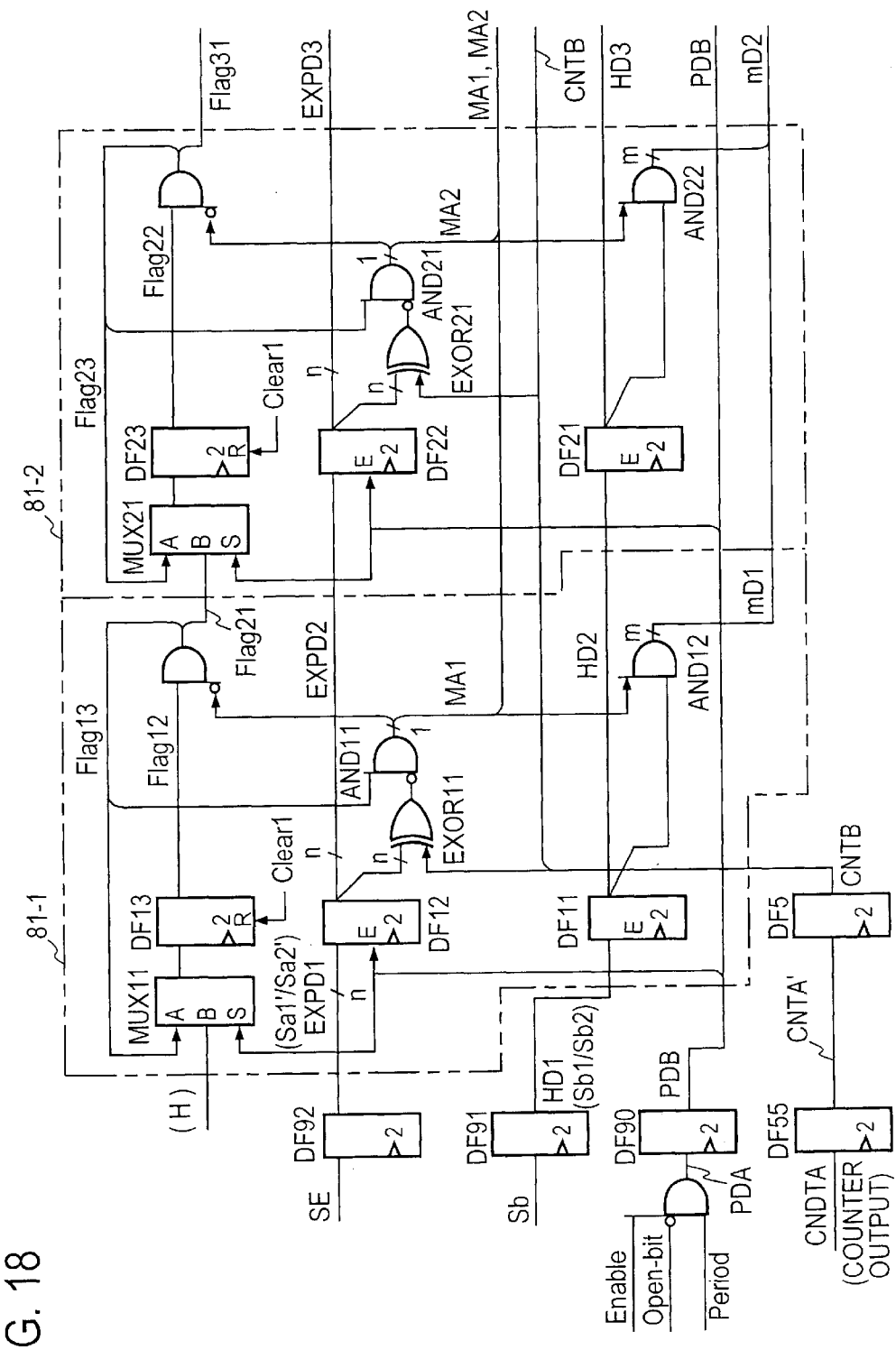
FIG. 18 is a block diagram showing a basic circuit of the first and second delay stages in the basic circuit of the waveform generating apparatus shown in FIGS. 5 to 8 in the operation speed-doubled mode.
Figure 19:
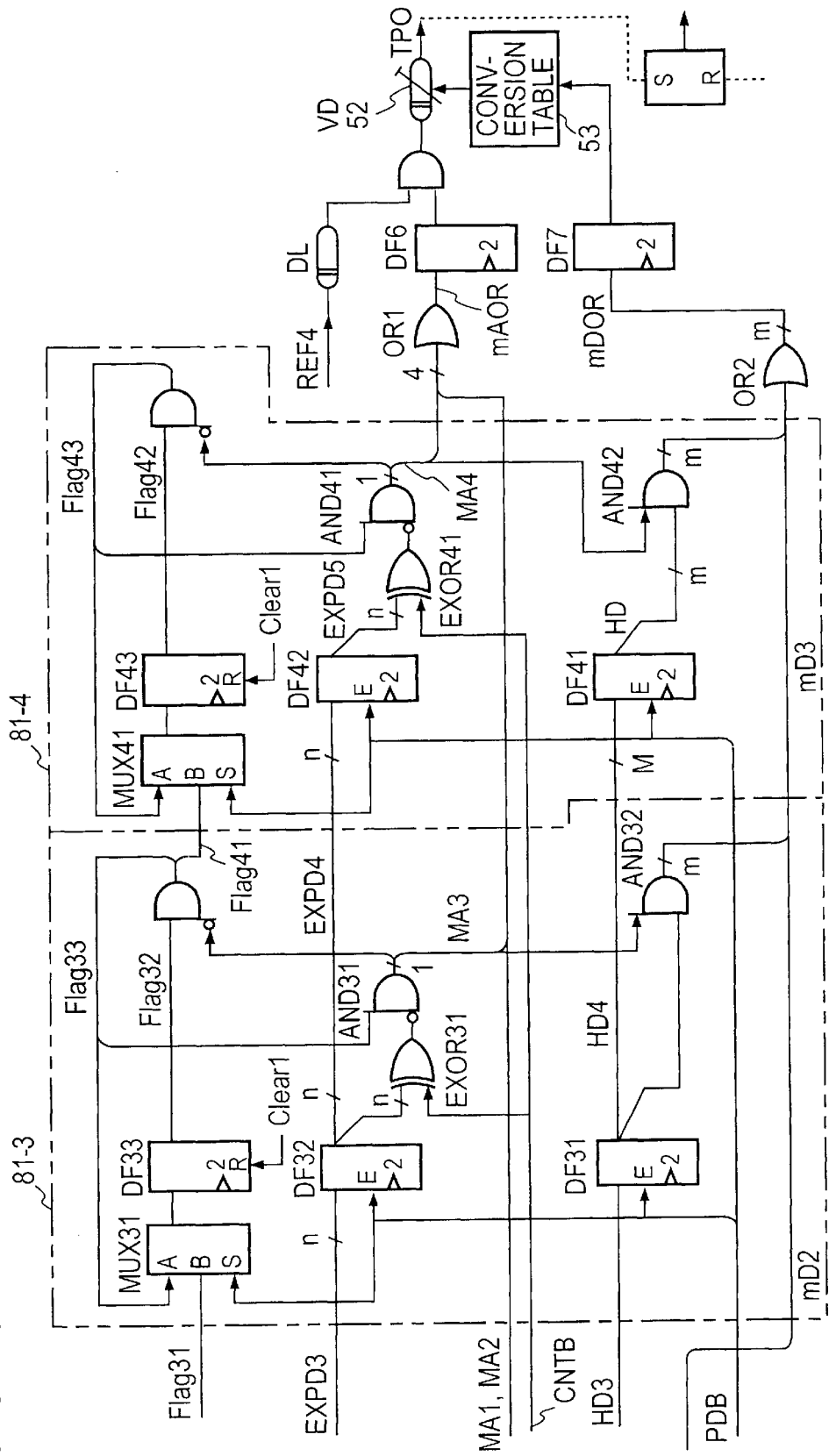
FIG. 19 is a block diagram showing a basic circuit of the third and fourth delay stages in the basic circuit of the waveform generating apparatus shown in FIGS. 5 to 8 in the operation speed-doubled mode.
Figure 20:
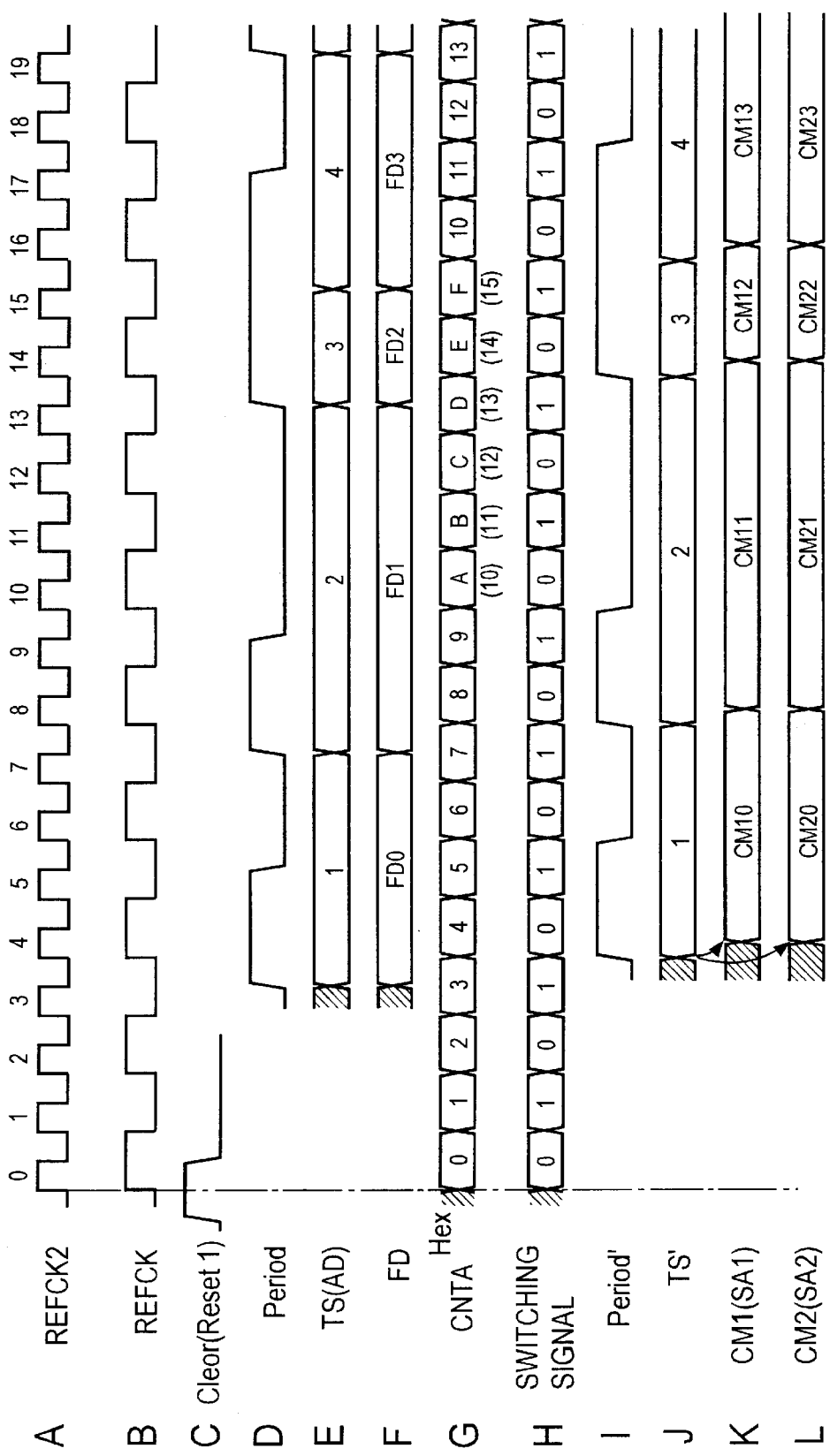
FIG. 20 is a timing chart for explaining the operation of the basic circuit shown in FIG. 18.
Figure 21:
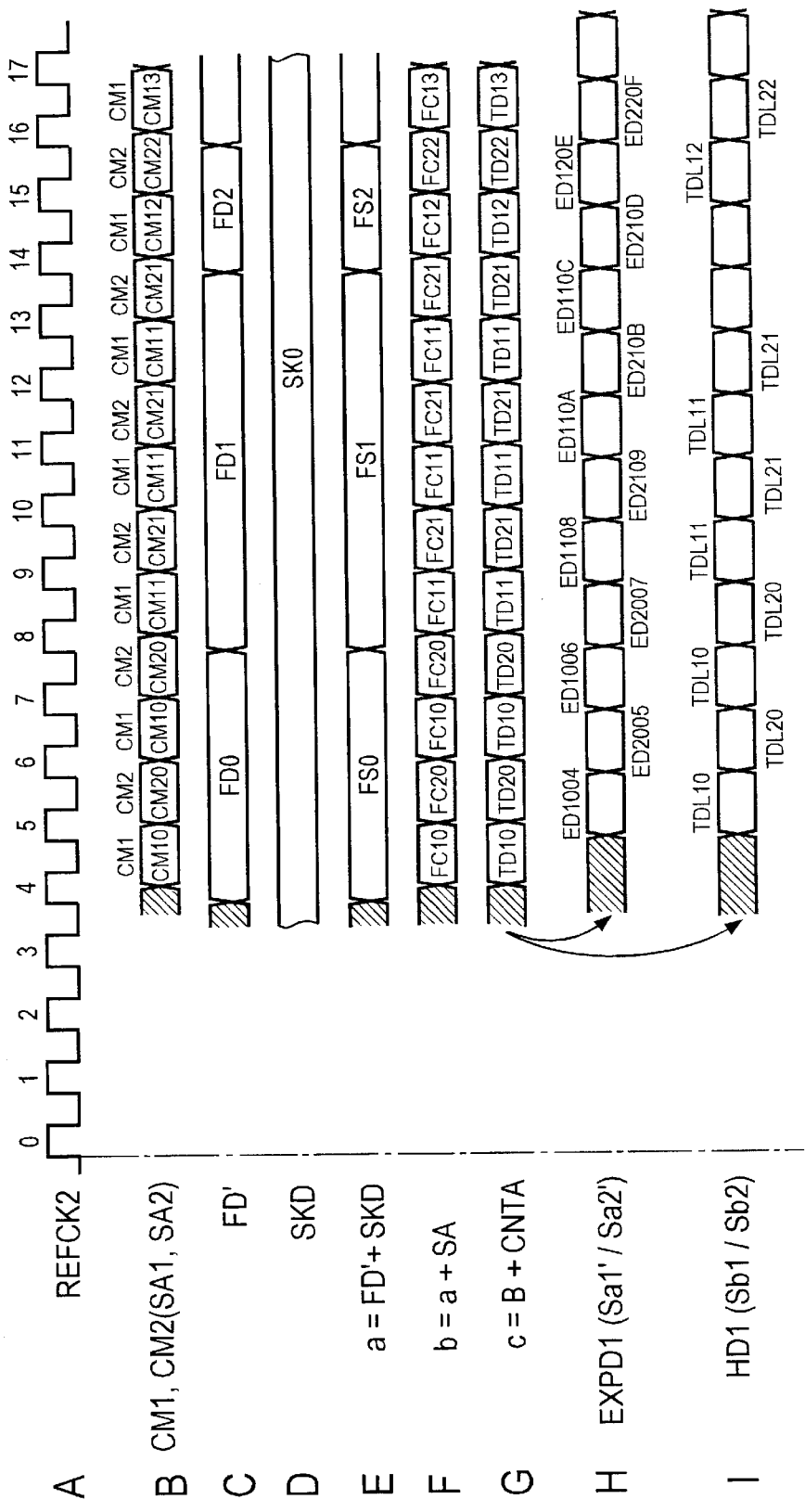
FIG. 21 is a timing chart continued from the timing chart of FIG. 20.
Figure 22:
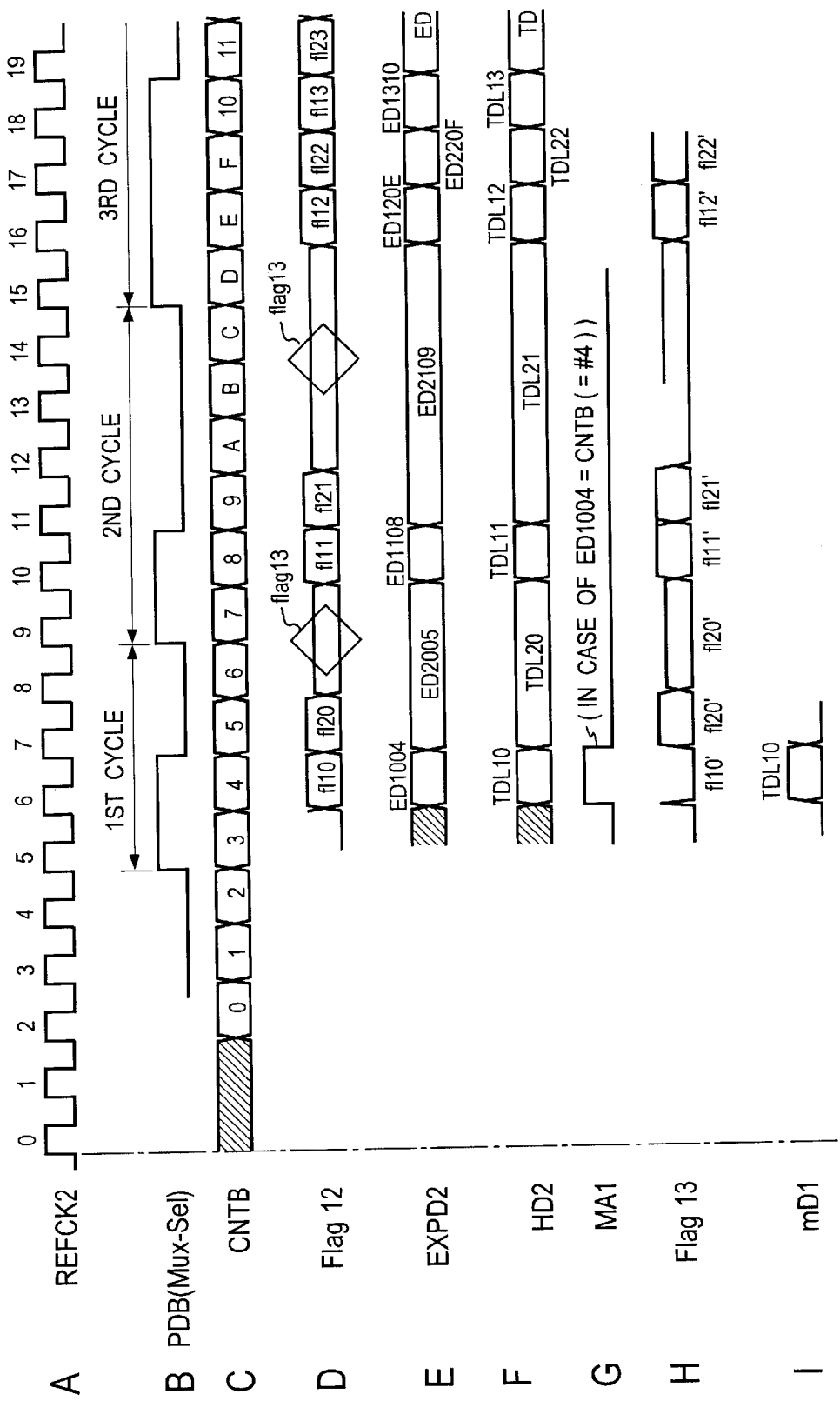
FIG. 22 is a timing chart for explaining the operation of the first delay stage shown in FIG. 18.
Figure 23:
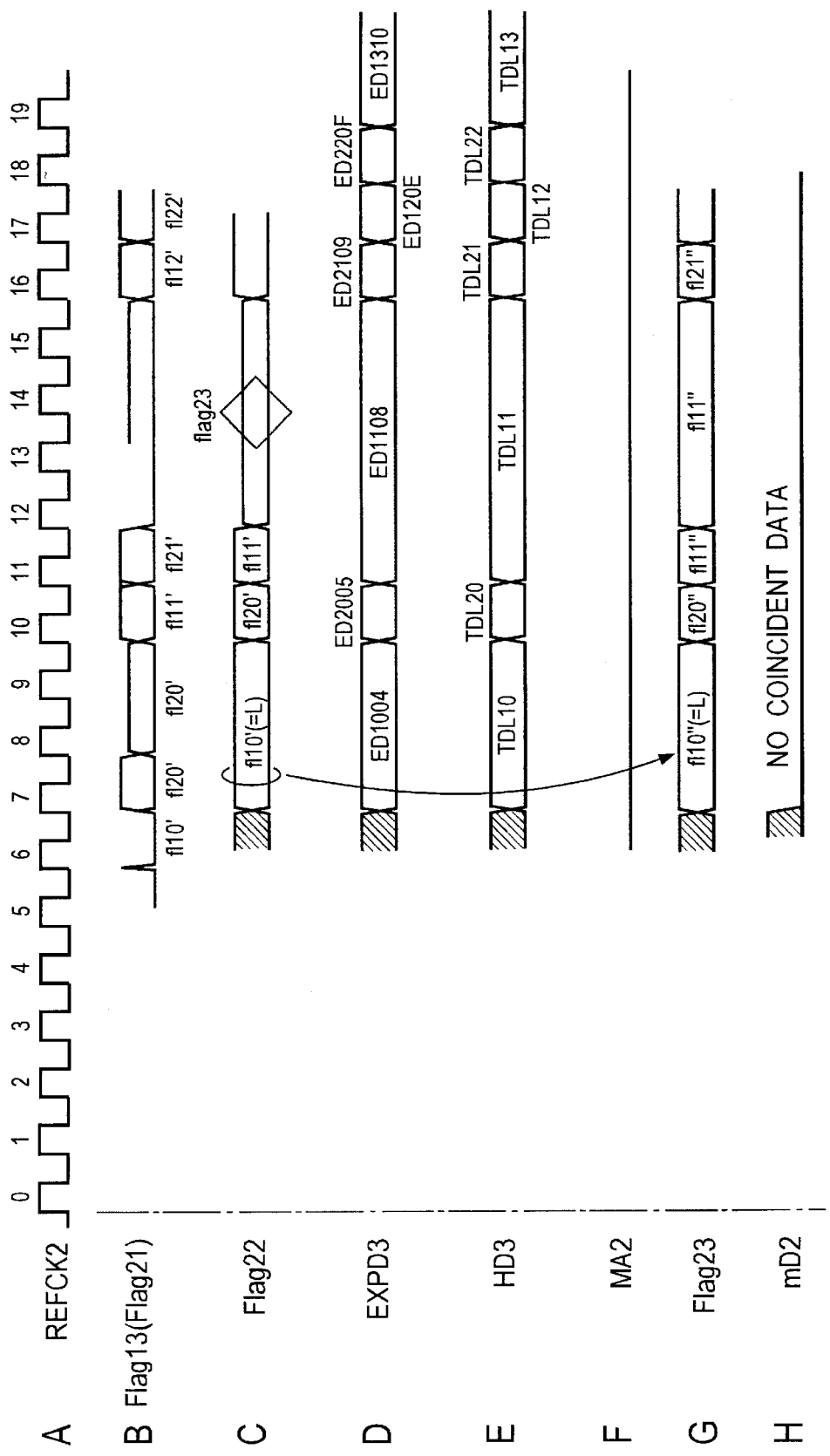
FIG. 23 is a timing chart for explaining the operation of the second delay stage shown in FIG. 18.
Figure 24:
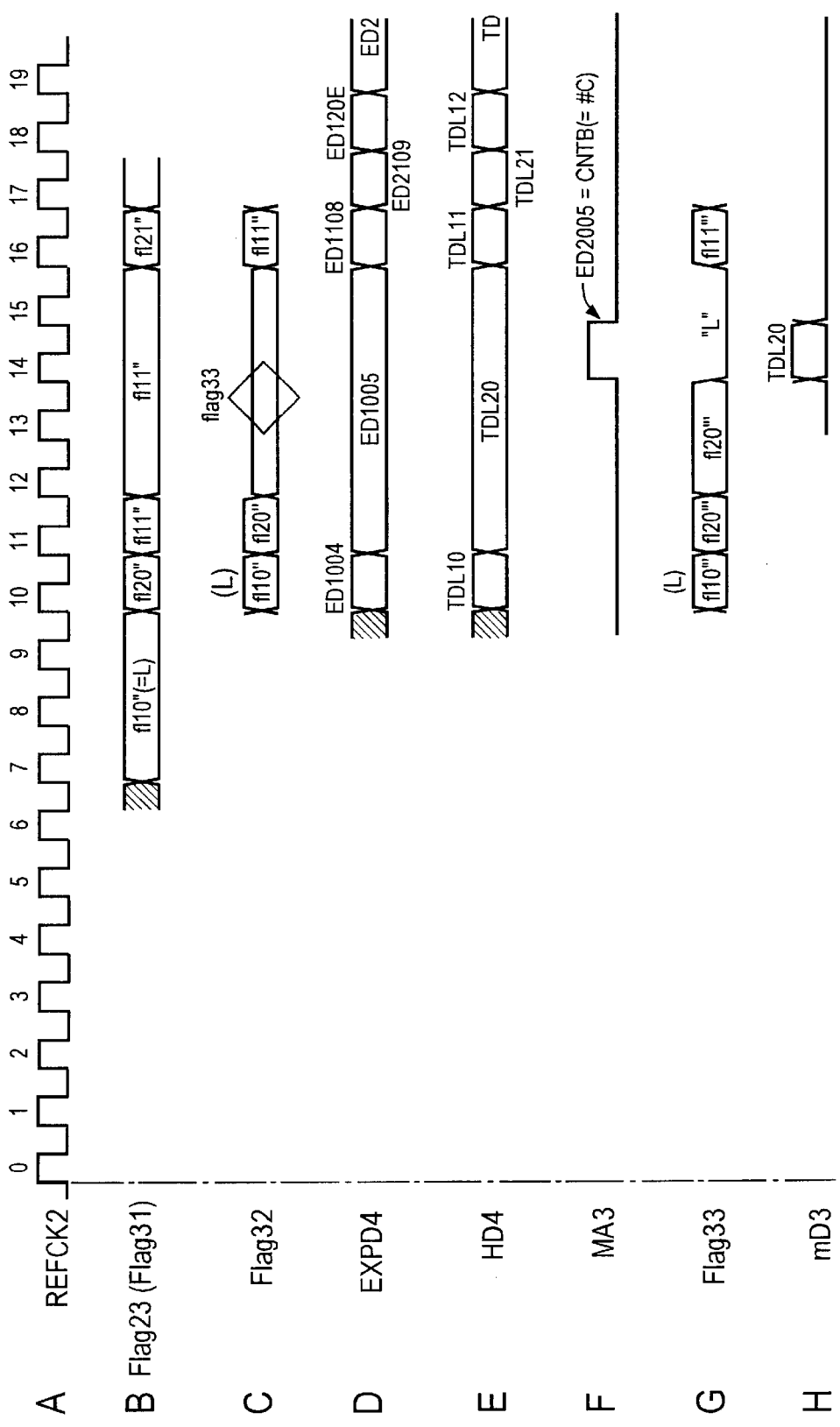
FIG. 24 is a timing chart for explaining the operation of the third delay stage shown in FIG. 19.
Figure 25:
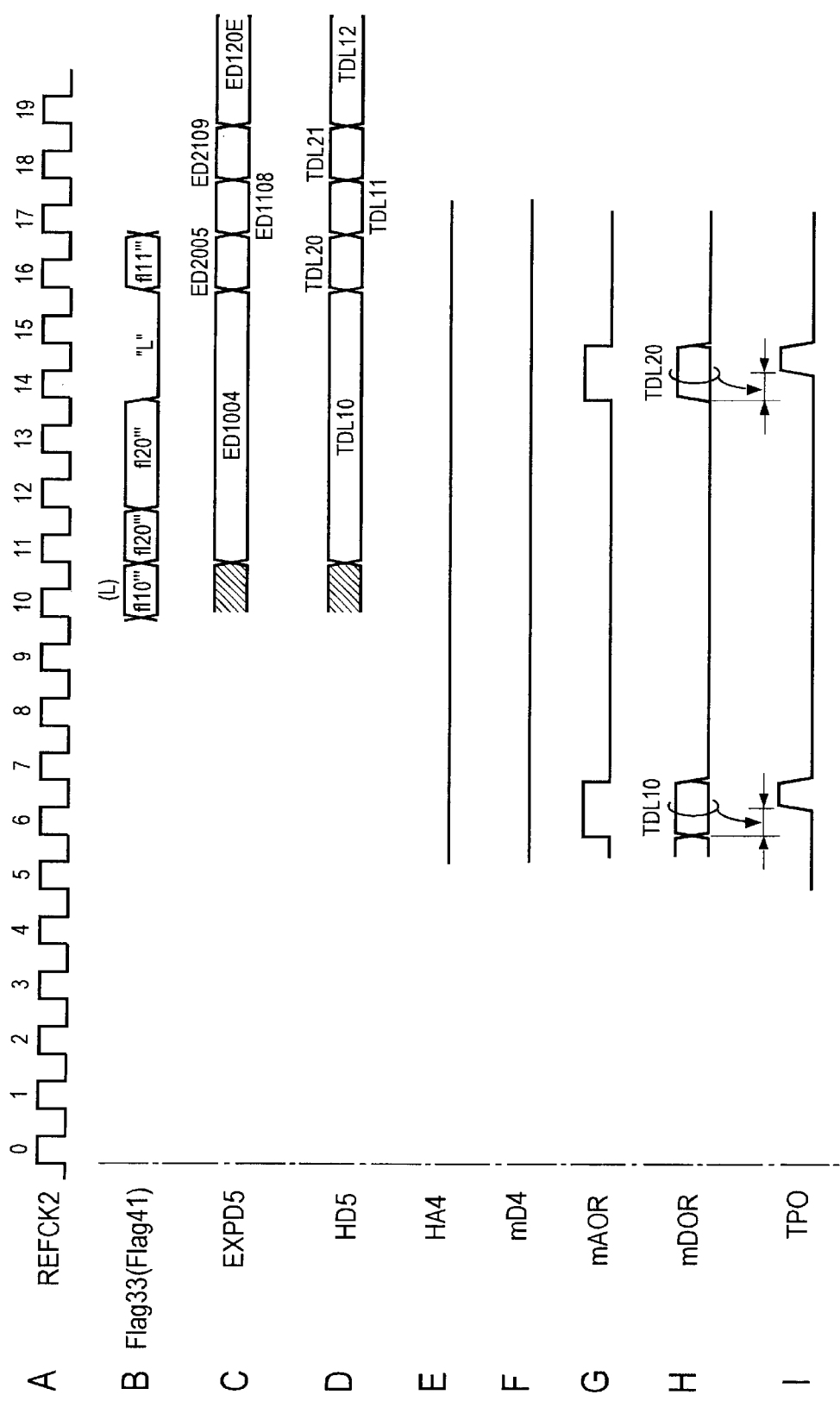
FIG. 25 is a timing chart for explaining the operations of the fourth delay stage and its output side shown in FIG. 19.

FIGS. 18 and 19 are block diagrams showing a basic circuit of the waveform generating apparatus in which the number of steps of the delay stage 81 is set to four steps (n=4) in the specified circuit configurations shown in FIGS. 5 to 8, and shows a case that it operates in the operation speed-doubled mode. In addition, FIGS. 20 to 25 are timing charts respectively for explaining the operation of the basic circuit. Though only the circuitry relating to the set pulse is shown in FIGS. 18 and 19, the circuitry relating to the reset pulse has the same configuration as that of the set pulse circuitry. Now, the operation of the set pulse circuitry will be described.

The delay data SA supplied to one input terminal of the operation unit ALU2 of the first operation circuit 49 is constituted by the delay data SA1 and SA2, the delay data SA1 being selected in the first half of the reference clock period and the delay data SA2 being selected in the second half of the reference clock period. The first and the second delay stages 81-1 and 81-2 are the first and the second coincidence detection circuits respectively in the first test cycle, and the third and the fourth delay stages 81-3 and 81-4 are the first and the second coincidence detection circuits respectively in the second test cycle. In each of the first and the second test cycles, one detection pulse is outputted from a pair of the first and the second coincidence detection circuits.

That is to say, as can be easily understood from the timing charts shown in FIGS. 20 to 25, one detection pulse is outputted from only either one of the first and the second coincidence detection circuits. The first and the second delay stages (the first and the second coincidence detection circuits in the first test cycle) 81-1 and 81-2 compare the data CNTD-B latched in the D-type flip-flop DF5, which is the output CNTD-A of the counter CNT1 (refer to FIG. 1) supplied to the D-type flip-flop DF5 with the coincidence expected value SE=Sa1' and Sa2' (corresponding to the integer delay data Sa1 and Sa2 in the output of the operation unit ALU2 respectively) which is the output of the operation unit ALU3 (refer to FIG. 1) to perform a coincidence detection in the first test cycle, and output a detection pulse. Similarly, the third and the fourth stages (the first and the second coincidence detection circuits in the second test cycle) 81-3 and 81-4 perform a coincidence detection in the second test cycle, and output a detection pulse.

In the timing charts shown in FIGS. 20 to 25, a case is shown as an example that the Sa1' (=ED1004) in the integer delay data (coincidence expected value) EXPD1 (the same as Sa1'/Sa2') which is an output from a D-type flip-flop DF92 shown in FIG. 18 is equal to the data #5 in the counter output data CNTB, and the Sa2' (=ED2005) in the integer delay data EXPD1 is equal to the data #D (a hexadecimal number) in the counter output data CNTB. A detection pulse MA1 is outputted from the first delay stage (the first coincidence detection circuit in the first test cycle) 81-1 at the time that the data #5 in the counter output data CNTB has been generated, and a detection pulse MA3 is outputted from the third delay stage (the first coincidence detection circuit in the second test cycle) 81-3 at the time that the data #D in the counter output data CNTB has been generated. Since other operations of the waveform generating apparatus are the same as those in case of the waveform generating apparatus having the specified circuit configuration shown in FIG. 17, the explanation thereof will be omitted.

In the prior art waveform generating apparatus, the two analogously constructed delay circuits one of which is the variable delay circuit in each of the timing generators relating to the set pulse and the reset pulse respectively and the other of which is the corresponding skew adjusting delay circuit (in either of the delay circuits, the delay time fluctuates by temperature change and voltage change) are connected in cascade. On the contrary, in the waveform generating apparatus of the aforementioned embodiment, it suffices to provide only one variable delay circuit 52 for giving a delay corresponding to a fraction delay data Fj. As a result, in the waveform generating apparatus of the aforementioned embodiment, the amount of fluctuation of the delay time due to the temperature change and the voltage change can be reduced to about ½ of that of the prior art apparatus, and hence the timing accuracy in the waveform generating apparatus can be improved.

In addition, in the prior art technology for high-speed operation, an interleave operation is used, and consequently, two timing generating circuits having the same configuration with each other must be prepared. Accordingly, the scale of the hardware thereof is increased about twice as compared with the scale of the hardware in the normal operation mode operating at the normal speed. However, in the waveform generating apparatus of the aforementioned embodiment, one circuit is used and a timing generating operation is performed in both of the first half and the second half of one test cycle in the operation speed-doubled mode. Therefore, any increase in the hardware does not occur as in case of the interleave operation.

Figure 37:
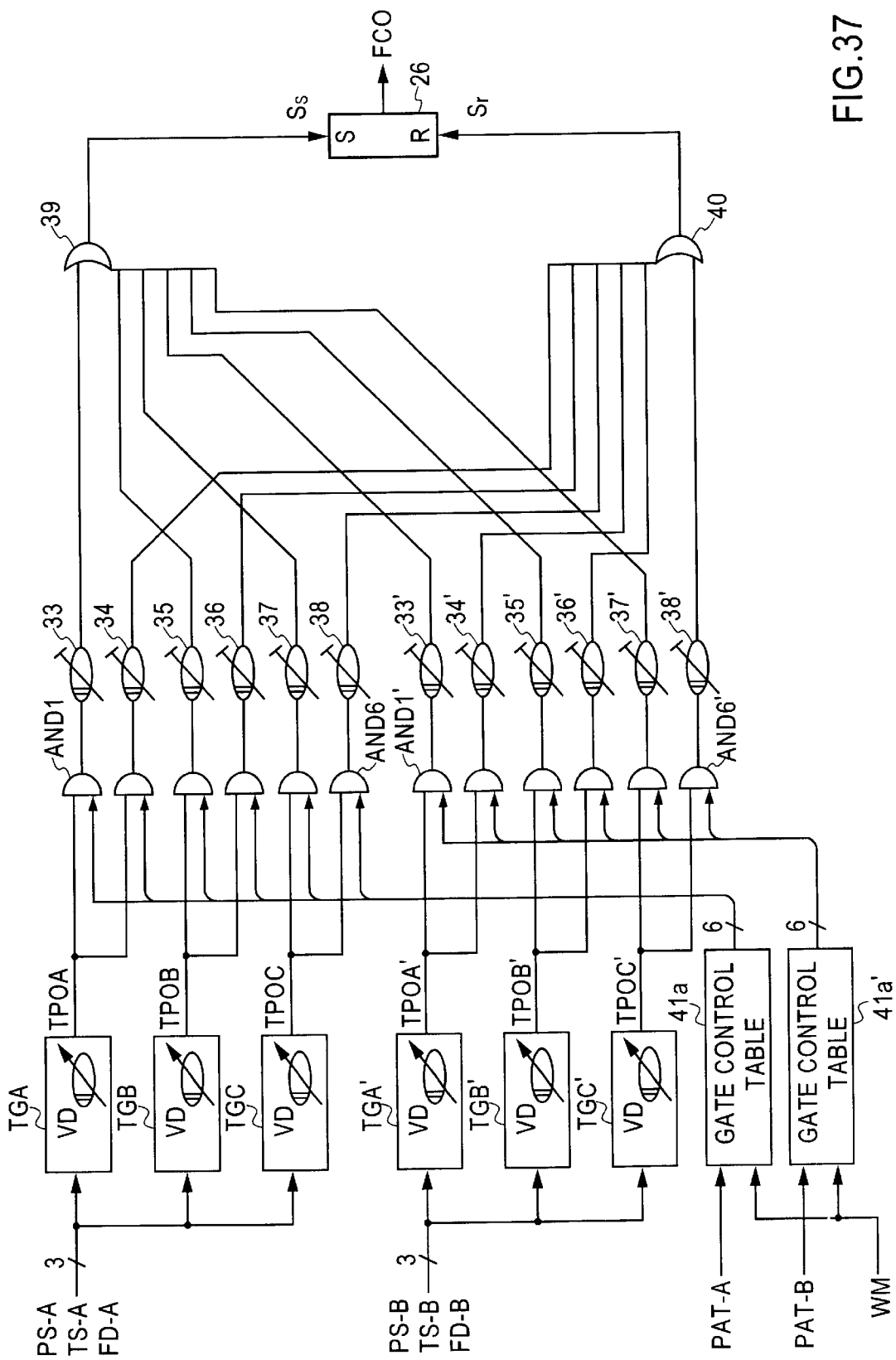
FIG. 37 is a block diagram showing a circuit configuration of the waveform generating apparatus shown in FIG. 34 in case that it performs an interleave operation.

For example, in the prior art waveform generating apparatus effecting an interleave operation shown in FIG. 37, six timing generators in total are needed. However, in the waveform generating apparatus of the aforementioned embodiment, it suffices to prepare only two timing generators one for generation of a set pulse and one for generation of a reset pulse, and hence the scale of the hardware is reduced to approximately ⅓ of that of the prior art apparatus.

Furthermore, in the waveform generating apparatus of the aforementioned embodiment, the number of variable delay circuits each requiring a data conversion table (look-up table) is two in total one for generation of a set pulse and one for generation of a reset pulse. Accordingly, a time and load needed for creating the data conversion tables can be reduced to about ⅙ as compared with twelve (12) data conversion tables required in the prior art waveform generating apparatus operating in an interleave mode shown in FIG. 37.

In addition, in the prior art waveform generating apparatus performing an interleave operation shown in FIG. 37, six timing pulse propagation paths are needed for each of the set pulse generation and the reset pulse generation, and a logical OR operation of the timing pulses propagating through these propagation paths respectively is effected. As a result, there is a problem that a slight unevenness is apt to occur in the corrections of the delay times of these propagation paths, and hence the timing accuracy is further deteriorated. However, in the waveform generating apparatus of the aforementioned embodiment, since it suffices to prepare only one propagation path for each of the set pulse generation and the reset pulse generation, the above problem occurring in the prior art waveform generating apparatus does not occur.

Further, in the above embodiment, an adder for summing two data supplied thereto and/or a subtracter for subtracting one of two data supplied thereto from the other are used as an operation unit ALU. However, there may be also used a multiplier for multiplying two data supplied thereto with each other, or an operation unit for summing two data supplied thereto by using a combination of summing operation, subtracting operation and/or multiplying operation.

In addition, it is needless to say that the waveform generating apparatus of the aforementioned embodiment can be advantageously used not only in semiconductor device testing apparatus for testing various kinds of semiconductor devices but also in various kinds of testing apparatuses for testing devices such as, for example, electric/electronic elements or parts, circuits and the like which effect predetermined functions or actions depending upon a current or voltage applied thereto.

While the present invention has been described with regard to the preferred embodiments shown by way of example, it will be apparent to those skilled in the art that various modifications, alterations, changes, and/or minor improvements of the embodiments described above can be made without departing from the spirit and the scope of the present invention. Accordingly, it should be understood that the present invention is not limited to the illustrated embodiments, and is intended to encompass all such modifications, alterations, changes, and/or minor improvements falling within the scope of the invention defined by the appended claims.

What is claimed is:

1. A waveform generating apparatus comprising:

delay data selecting means selecting, out of a plurality of delay data, at least one delay data for generating at least one set pulse and at least one delay data for generating at least one reset pulse in accordance with test logical data and waveform mode information externally supplied thereto;

skew data storage means for set pulse and for reset pulse, said skew data storage means storing therein skew adjusting delay data for a propagation path of a delay data for set pulse and for a propagation path of a delay data for reset pulse, respectively;

operation means for set pulse and for reset pulse, said operation means performing an operation of the set pulse delay data, the skew adjusting delay data for set pulse and a fraction data in each test cycle externally supplied thereto and an operation of the reset pulse delay data, the skew adjusting delay data for reset pulse and a fraction data in each test cycle externally supplied thereto, respectively, and outputting an integer delay data and a fraction delay data for set pulse from the result of the operation and an integer delay data and a fraction delay data for reset pulse from the result of the operation, respectively;

delay means for set pulse and for reset pulse, said delay means outputting at least one set pulse generating effective flag for causing a timing of a test period to delay by a delay time corresponding to the integer delay data and at least one reset pulse generating effective flag for causing a timing of a test period to delay by a delay time corresponding to the integer delay data, respectively, as well as outputting fraction delay data related to these set pulse generating effective flag and reset pulse generating effective flag, respectively;

variable delay means for set pulse and for reset pulse, to which the set pulse generating effective flag and the reset pulse generating effective flag are inputted respectively, said variable delay means delaying the effective flags on the basis of the related fraction delay data, respectively; and waveform outputting means outputting a waveform which is set by a set pulse supplied from said set pulse variable delay means and reset by a reset pulse supplied from said reset pulse variable delay means, for each test period.

2. The waveform generating apparatus according to claim 1, further including a delay data memory for storing therein said plurality of delay data, and wherein said delay data selecting means comprises: a select data memory for generating data selecting information in accordance with test logical data and waveform mode information externally supplied thereto; and a multiplexer for selecting, out of the plurality of delay data supplied from said delay data memory, said at least one delay data for generating at least one set pulse and said at least one delay data for generating at least one reset pulse, by the data selecting information supplied from said select data memory.

3. The waveform generating apparatus according to claim 2, wherein said select data memory has data selecting information stored therein corresponding to waveform mode information, test logical data of current test cycle and previous test cycle, and the set pulse effective flag and the reset pulse effective flags.

4. The waveform generating apparatus according to claim 1, wherein said delay data selecting means comprises: a select data memory in which data selecting information corresponding to the waveform mode information and test logical data of current test cycle and previous test cycle is stored; and a multiplexer which is capable of selecting, out of the data selecting information inputted thereto from said select data memory and the plurality of delay data inputted thereto from a delay data memory, said at least one set pulse generating delay data and said at least one reset pulse generating delay data, and the set pulse effective flag and the reset pulse effective flag in the first half or the second half of a period signal.

5. The waveform generating apparatus according to any one of claims 1 to 4, wherein said variable delay means comprise: set pulse and reset pulse data conversion means each outputting a delay control signal corresponding to the fraction delay data; and set pulse and reset pulse variable delay circuits for delaying, on the basis of the delay control signals outputted from said data conversion means, the set pulse generating effective flag and the reset pulse generating effective flag inputted thereto, respectively.

6. The waveform generating apparatus according to any one of claims 2 to 4, wherein the data selecting information stored in said select data memory is set such that when the test logical data is a sequence of the same logical values such as "0", "0" or "1", "1" in adjacent test cycles, the set pulse or the reset pulse is inhibited from being consecutively inputted to said waveform outputting means.

7. The waveform generating apparatus according to any one of claims 1 to 4, wherein said set pulse delay means and the reset pulse delay means perform operations of the set pulse integer delay data and an output of a counter for counting a clock and of the reset pulse integer delay data and an output of a counter for counting a clock, thereby to generate set pulse and reset pulse counter data coincidence expected values, respectively, and detect coincidences between said coincidence expected values and the output of said counter and output the set pulse generating effective flag and the reset pulse generating effective flag as well as the set pulse fraction delay data and the reset pulse fraction delay data related to these effective flags, respectively.

8. The waveform generating apparatus according to any one of claims 2 to 4, further including control means provided therein for inhibiting an input data from being loaded in said set pulse delay means and said reset pulse delay means in case that an open flag for inhibiting a pulse from being outputted is given to a delay data supplied to said multiplexer from said delay data memory, and also, in case that a set/reset pulse effective flag is not present in data selecting information supplied to said multiplexer from said select data memory.

9. The waveform generating apparatus according to any one of claims 1 to 4, wherein said waveform outputting means is an S-R flip-flop.

10. The waveform generating apparatus according to claim 5, wherein said set pulse delay means and the reset pulse delay means perform operations of the set pulse integer delay data and an output of a counter for counting a clock and of the reset pulse integer delay data and an output of a counter for counting a clock, thereby to generate set pulse and reset pulse counter data coincidence expected values, respectively, and detect coincidences between said coincidence expected values and the output of said counter and output the set pulse generating effective flag and the reset pulse generating effective flag as well as the set pulse fraction delay data and the reset pulse fraction delay data related to these effective flags, respectively.

11. The waveform generating apparatus according to claim 5, wherein said waveform outputting means is an S-R flip-flop.

12. The waveform generating apparatus according to claim 6, wherein said waveform outputting means is an S-R flip-flop.

13. The waveform generating apparatus according to claim 7, wherein said waveform outputting means is an S-R flip-flop.

14. The waveform generating apparatus according to claim 8, wherein said waveform outputting means is an S-R flip-flop.

15. A semiconductor device testing apparatus for testing a semiconductor device comprising:

delay data selecting means selecting, out of a plurality of delay data, at least one delay data for generating at least one set pulse and at least one delay data for generating at least one reset pulse in accordance with test logical data and waveform mode information externally supplied thereto;

skew data storage means for set pulse and for reset pulse, said skew data storage means storing therein skew adjusting delay data for a propagation path of a delay data for set pulse and for a propagation path of a delay data for reset pulse, respectively;

operation means for set pulse and for reset pulse, said operation means performing an operation of the set pulse delay data, the skew adjusting delay data for set pulse and a fraction data in each test cycle externally supplied thereto and an operation of the reset pulse delay data, the skew adjusting delay data for reset pulse and a fraction data in each test cycle externally supplied thereto, respectively, and outputting an integer delay data and a fraction delay data for set pulse from the result of the operation and an integer delay data and a fraction delay data for reset pulse from the result of the operation, respectively;

delay means for set pulse and for reset pulse, said delay means outputting at least one set pulse generating effective flag for causing a timing of a test period to delay by a delay time corresponding to the integer delay data and at least one reset pulse generating effective flag for causing a timing of a test period to delay by a delay time corresponding to the integer delay data, respectively, as well as outputting fraction delay data related to these set pulse generating effective flag and reset pulse generating effective flag, respectively;

variable delay means for set pulse and for reset pulse, to which the set pulse generating effective flag and the reset pulse generating effective flag are inputted respectively, said variable delay means delaying the effective flags on the basis of the related fraction delay data, respectively;

waveform outputting means outputting a waveform which is set by a set pulse supplied from said set pulse variable delay means and reset by a reset pulse supplied from said reset pulse variable delay means, for each test period; and means applying a test signal having the waveform outputted from said waveform outputting means to a semiconductor device under test.

16. The semiconductor device testing apparatus according to claim 15, further including a delay data memory for storing therein said plurality of delay data, and wherein said delay data selecting means comprises: a select data memory for generating data selecting information in accordance with test logical data and waveform mode information externally supplied thereto; and a multiplexer for selecting, out of the plurality of delay data supplied from said delay data memory, said at least one delay data for generating at least one set pulse and said at least one delay data for generating at least one reset pulse, by the data selecting information supplied from said select data memory.

17. The semiconductor device testing apparatus according to claim 16, wherein said select data memory has data selecting information stored therein corresponding to waveform mode information, test logical data of current test cycle and previous test cycle, and the set pulse effective flag and the reset pulse effective flags.

18. The semiconductor device testing apparatus according to claim 15, wherein said delay data selecting means comprises: a select data memory in which data selecting information corresponding to the waveform mode information and test logical data of current test cycle and previous test cycle is stored; and a multiplexer which is capable of selecting, out of the data selecting information inputted thereto from said select data memory and the plurality of delay data inputted thereto from a delay data memory, said at least one set pulse generating delay data and said at least one reset pulse generating delay data, and the set pulse effective flag and the reset pulse effective flag in the first half or the second half of a period signal.

19. The semiconductor device testing apparatus according to any one of claims 15 to 18, wherein said variable delay means comprise: set pulse and reset pulse data conversion means each outputting a delay control signal corresponding to the fraction delay data; and set pulse and reset pulse variable delay circuits for delaying, on the basis of the delay control signals outputted from said data conversion means, the set pulse generating effective flag and the reset pulse generating effective flag inputted thereto, respectively.

* * * * *